(12) United States Patent
Hatakeyama et al.

(10) Patent No.: US 8,703,408 B2
(45) Date of Patent: Apr. 22, 2014

(54) PATTERNING PROCESS

(75) Inventors: Jun Hatakeyama, Joetsu (JP);
Kazuhiro Katayama, Joetsu (JP); Koji Hasegawa, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 161 days.

(21) Appl. No.: 13/177,297

(22) Filed: Jul. 6, 2011

(65) Prior Publication Data
US 2012/0009527 A1    Jan. 12, 2012

(30) Foreign Application Priority Data

Jul. 6, 2010  (JP) .................... 2010-153514

(51) Int. Cl.
*G03F 7/26* (2006.01)
(52) U.S. Cl.
USPC ........................................ 430/325; 430/322
(58) Field of Classification Search
USPC ........................................ 430/325, 331, 322
See application file for complete search history.

(56) References Cited

U.S. PATENT DOCUMENTS

| | | | |
|---|---|---|---|
| 6,448,420 B1 | 9/2002 | Kinsho et al. | |
| 7,514,197 B2 | 4/2009 | Ochiai et al. | |
| 7,514,204 B2 | 4/2009 | Hatakeyama et al. | |
| 7,537,880 B2 | 5/2009 | Harada et al. | |
| 7,598,016 B2 | 10/2009 | Kobayashi et al. | |
| 7,622,242 B2 | 11/2009 | Hatakeyama et al. | |
| 7,642,034 B2 | 1/2010 | Hatakeyama et al. | |
| 7,670,750 B2 | 3/2010 | Harada et al. | |
| 7,759,047 B2 | 7/2010 | Hatakeyama et al. | |
| 7,771,913 B2 | 8/2010 | Kaneko et al. | |
| 2007/0003867 A1 | 1/2007 | Hatakeyama et al. | |
| 2008/0090172 A1 | 4/2008 | Hatakeyama et al. | |
| 2008/0187860 A1* | 8/2008 | Tsubaki et al. | ............ 430/270.1 |
| 2009/0011365 A1 | 1/2009 | Kobayashi et al. | |
| 2009/0280434 A1 | 11/2009 | Harada et al. | |
| 2010/0040972 A1 | 2/2010 | Tarutani et al. | |
| 2010/0330507 A1 | 12/2010 | Tsubaki et al. | |

FOREIGN PATENT DOCUMENTS

| | | |
|---|---|---|
| JP | 3943741 B2 | 7/2000 |
| JP | 2000-327633 A | 11/2000 |
| JP | 3790649 B2 | 6/2006 |
| JP | 2007-025634 A | 2/2007 |
| JP | 2007-297590 A | 11/2007 |
| JP | 2008-003569 A | 1/2008 |
| JP | 2008-081716 A | 4/2008 |

(Continued)

OTHER PUBLICATIONS

S. Tarutani et al., "Development of materials and processes for double patterning toward 32-nm node 193-nm immersion lithography process", SPIE vol. 6923, 2008, pp. 69230F-1-69230F-8.

*Primary Examiner* — Caleen Sullivan
(74) *Attorney, Agent, or Firm* — Westerman, Hattori, Daniels & Adrian, LLP

(57) ABSTRACT

A pattern is formed by coating a resist composition comprising a polymer comprising recurring units having an acid labile group-substituted hydroxyl group and recurring units having an acid labile group-substituted carboxyl group, an acid generator, and an organic solvent onto a substrate, prebaking to form a resist film, exposing the resist film to high-energy radiation, PEB, and developing the exposed film two times with an organic solvent and an alkaline aqueous solution. Due to the two developments, one line is divided into two lines, achieving a resolution doubling the mask pattern.

10 Claims, 6 Drawing Sheets

(56) References Cited

FOREIGN PATENT DOCUMENTS

| | | |
|---|---|---|
| JP | 2008-107443 A | 5/2008 |
| JP | 2008-111089 A | 5/2008 |
| JP | 2008-111103 A | 5/2008 |
| JP | 2008-122932 A | 5/2008 |
| JP | 2008-239918 A | 10/2008 |
| JP | 2008-281974 A | 11/2008 |
| JP | 2008-281975 A | 11/2008 |
| JP | 2008-281980 A | 11/2008 |
| JP | 2009-025707 A | 2/2009 |
| JP | 2009-025723 A | 2/2009 |
| JP | 2009-031767 A | 2/2009 |
| JP | 2009-053657 A | 3/2009 |
| JP | 2009-098638 A | 5/2009 |
| JP | 2009-276363 A | 11/2009 |
| JP | 4445860 B2 | 4/2010 |

* cited by examiner

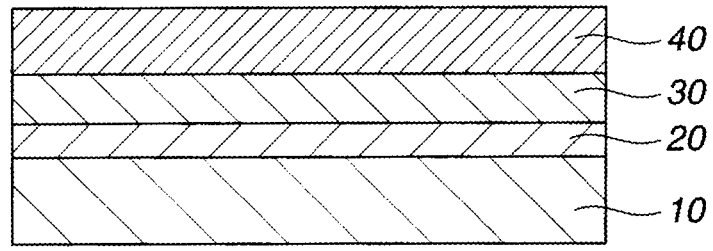
FIG.1A  PHOTORESIST COATING
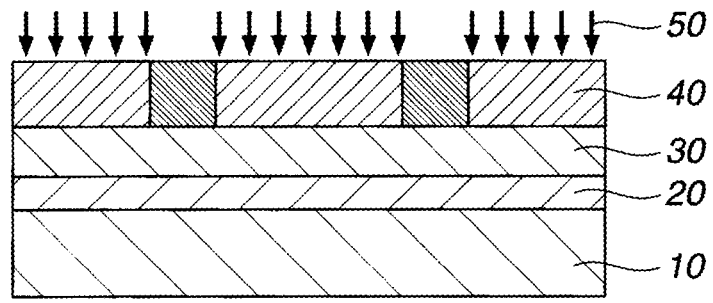
FIG.1B  PHOTORESIST EXPOSURE
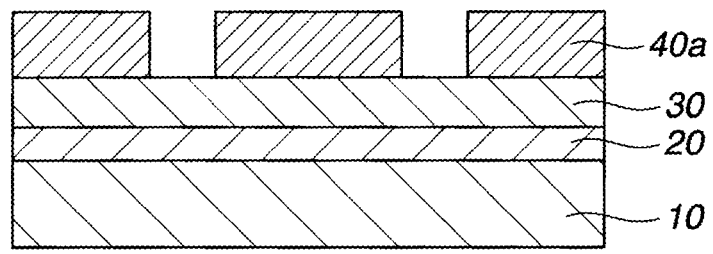
FIG.1C  ORGANIC SOLVENT DEVELOPMENT
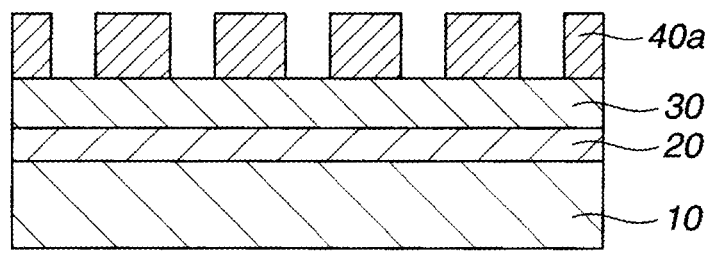
FIG.1D  ALKALINE WATER DEVELOPMENT

EXAMPLE 1-1

COMPARATIVE EXAMPLE 1-1

PATTERNING PROCESS

CROSS-REFERENCE TO RELATED APPLICATION

This non-provisional application claims priority under 35 U.S.C. §119(a) on Patent Application No. 2010-153514 filed in Japan on Jul. 6, 2010, the entire contents of which are hereby incorporated by reference.

TECHNICAL FIELD

This invention relates to a pattern forming process involving exposure of resist film, deprotection reaction with the aid of acid and heat, and two developments with an organic solvent and an alkaline aqueous solution wherein over-exposed regions and unexposed regions are dissolved while moderate-exposed regions are not dissolved, achieving a double resolution.

BACKGROUND ART

In the recent drive for higher integration and operating speeds in LSI devices, the pattern rule is made drastically finer. The photolithography which is currently on widespread use in the art is approaching the essential limit of resolution determined by the wavelength of a light source. As the light source used in the lithography for resist pattern formation, g-line (436 nm) or i-line (365 nm) from a mercury lamp was widely used in 1980's. Reducing the wavelength of exposure light was believed effective as the means for further reducing the feature size. For the mass production process of 64 MB dynamic random access memories (DRAM, processing feature size 0.25 μm or less) in 1990's and later ones, the exposure light source of i-line (365 nm) was replaced by a KrF excimer laser having a shorter wavelength of 248 nm. However, for the fabrication of DRAM with a degree of integration of 256 MB and 1 GB or more requiring a finer patterning technology (processing feature size 0.2 μm or less), a shorter wavelength light source was required. Over a decade, photolithography using ArF excimer laser light (193 nm) has been under active investigation. It was expected at the initial that the ArF lithography would be applied to the fabrication of 180-nm node devices. However, the KrF excimer lithography survived to the mass-scale fabrication of 130-nm node devices. So, the full application of ArF lithography started from the 90-nm node. The ArF lithography combined with a lens having an increased numerical aperture (NA) of 0.9 is considered to comply with 65-nm node devices. For the next 45-nm node devices which required an advancement to reduce the wavelength of exposure light, the $F_2$ lithography of 157 nm wavelength became a candidate. However, for the reasons that the projection lens uses a large amount of expensive $CaF_2$ single crystal, the scanner thus becomes expensive, hard pellicles are introduced due to the extremely low durability of soft pellicles, the optical system must be accordingly altered, and the etch resistance of resist is low; the development of $F_2$ lithography was stopped and instead, the ArF immersion lithography was introduced.

In the ArF immersion lithography, the space between the projection lens and the wafer is filled with water having a refractive index of 1.44. The partial fill system is compliant with high-speed scanning and when combined with a lens having a NA of 1.3, enables mass production of 45-nm node devices.

One candidate for the 32-nm node lithography is lithography using extreme ultraviolet (EUV) radiation with wavelength 13.5 nm. The EUV lithography has many accumulative problems to be overcome, including increased laser output, increased sensitivity, increased resolution and minimized line-edge roughness (LER or LWR) of resist film, defect-free MoSi laminate mask, reduced aberration of reflection mirror, and the like.

Another candidate for the 32-nm node lithography is high refractive index liquid immersion lithography. The development of this technology was stopped because LUAG, a high refractive index lens candidate had a low transmittance and the refractive index of liquid did not reach the goal of 1.8.

The process that now draws attention under the above-discussed circumstances is a double patterning process involving a first set of exposure and development to form a first pattern and a second set of exposure and development to form a pattern between the first pattern features. A number of double patterning processes are proposed. One exemplary process involves a first set of exposure and development to form a photoresist pattern having lines and spaces at intervals of 1:3, processing the underlying layer of hard mask by dry etching, applying another layer of hard mask thereon, a second set of exposure and development of a photoresist film to form a line pattern in the spaces of the first exposure, and processing the hard mask by dry etching, thereby forming a line-and-space pattern at a half pitch of the first pattern. An alternative process involves a first set of exposure and development to form a photoresist pattern having spaces and lines at intervals of 1:3, processing the underlying layer of hard mask by dry etching, applying a photoresist layer thereon, a second set of exposure and development to form a second space pattern on the remaining hard mask portion, and processing the hard mask by dry etching. In either process, the hard mask is processed by two dry etchings.

The double patterning process suffers from problems including a failure to insure an overlay accuracy between two exposures, a reduction of throughput by two exposures, the complexity of pattern division and an increase of mask cost due to use of two masks.

In a sidewall spacer process, a resist pattern as developed is transferred to a hard mask, a silicon oxide film is deposited on sidewalls of the hard mask, and two lines are formed on sidewalls of each line. This can double resolution despite a single exposure. The sidewall spacer process overcomes the aforementioned problems of double patterning since only one exposure is necessary. However, the desired pattern is formed by repeating CVD and etching for deposition of silicon oxide film by CVD and removal of unnecessary silicon oxide film on lines and in spaces, resulting in a complex long process. The increased cost of extra steps other than the lithography is a problem.

Most cost effective is a technology capable of doubling the resolution of a resist pattern through a single exposure and development.

JP 3943741 discloses a pattern forming method capable of achieving a double resolution by using a hydroxystyrene based KrF resist composition and effecting two developments, organic solvent development and alkaline water development, thereby dividing one line into two lines. As the ArF resist composition for a combination of negative tone development with organic solvent and positive tone development with alkaline water, ArF resist compositions of the prior art design may be used as described in JP-A 2008-281974, 2008-281975, 2008-281980, 2009-053657, 2009-025707, and 2009-025723. An example of using an ArF resist composition and dividing one line into two by the above method is described in Non-Patent Document 1 (Proc. SPIE Vol. 6923 p69230F-1).

These patent documents disclose resist compositions for organic solvent development comprising a copolymer of hydroxyadamantane methacrylate, a copolymer of norbornane lactone methacrylate, a copolymer of methacrylate having acidic groups including carboxyl, sulfo, phenol, thiol and other groups substituted with two or more acid labile groups, and a copolymer of methacrylate having a cyclic acid-stable group ester, and pattern forming processes using the same.

The formation of negative pattern through organic solvent development is a traditional technique. A resist material comprising cyclized rubber is developed using an alkene such as xylene as the developer. An early chemically amplified resist composition comprising poly(t-butoxycarbonyl-oxystyrene) is developed with anisole as the developer to form a negative pattern.

In JP 4445860, a negative tone pattern is formed by EB image writing on calix-arene and developing with n-butyl acetate or ethyl lactate.

When a prior art photoresist composition is subject to alkaline water development and organic solvent development, the resolution can be doubled as described in Non-Patent Document 1. However, it is difficult to gain a resolution surpassing the maximum resolution that is available with a single exposure in an ordinary process.

In the case of an ArF resist composition of the prior art design based on a polymer comprising recurring units in which an acidic group such as carboxyl group is substituted with an acid labile group, deprotection of the protective group leads to improved dissolution in alkaline developer and reduced dissolution in an organic solvent developer. If the exposure dose at which alkaline dissolution is improved is coincident with the exposure dose at which the resist becomes insoluble in organic solvent, then a fine size pattern cannot be formed because there is no margin or, if any, a quite narrow margin for the exposure dose at which the resist is insoluble in both alkali and organic solvent. It would be desirable to have a resist composition wherein the exposure dose at which alkaline dissolution is improved is different from the exposure dose at which the resist becomes insoluble in organic solvent.

CITATION LIST

Patent Document 1: JP 3943741
Patent Document 2: JP-A 2008-281974
Patent Document 3: JP-A 2008-281975
Patent Document 4: JP-A 2008-281980
Patent Document 5: JP-A 2009-053657
Patent Document 6: JP-A 2009-025707
Patent Document 7: JP-A 2009-025723
Patent Document 8: JP 4445860
Non-Patent Document 1: Proc. SPIE Vol. 6923 p69230F-1

DISCLOSURE OF INVENTION

When a positive resist composition of the prior art design in which a carboxyl or acidic group is regenerated by deprotection reaction is subject to alkaline aqueous solution development and organic solvent development, it is difficult to form a fine size pattern because the positive toning exposure dose for alkaline dissolution is substantially equal to or approximate to the negative toning exposure dose for organic solvent insolubility. In order to form a fine size pattern, the positive toning exposure dose for alkaline dissolution must differ from the negative toning exposure dose for organic solvent insolubility.

An object of the invention is to provide a pattern forming process capable of resolving a pattern having a half pitch of the mask pattern through two developments, alkaline aqueous solution development and organic solvent development, using an appropriate resist composition.

The inventors have found that a polymer comprising both recurring units having an acid labile group-substituted hydroxyl group and recurring units having an acid labile group-substituted carboxyl group enables to resolve a pattern having a half pitch of the mask pattern through two developments, alkaline aqueous solution development and organic solvent development.

Elimination of a protective group from a carboxyl group brings about an improvement in the solubility in alkaline aqueous solution developer and a reduction of the solubility in organic solvent developer. On the other hand, elimination of a protective group from a hydroxyl group brings about a reduction of the solubility in organic solvent developer, but no improvement in the solubility in alkaline aqueous solution developer. It is noteworthy that the exposure dose at which the solubility in organic solvent developer is reduced as a result of elimination of a protective group from a carboxyl group largely differs from the exposure dose at which the solubility in organic solvent developer is reduced as a result of elimination of a protective group from a hydroxyl group. The resist exhibits a higher sensitivity for the exposure dose at which the solubility in organic solvent developer is reduced as a result of elimination of a protective group from a hydroxyl group.

The invention provides a pattern forming process comprising the steps of coating a resist composition comprising a polymer comprising both recurring units having an acid labile group-substituted hydroxyl group and recurring units having an acid labile group-substituted carboxyl group, an acid generator, and an organic solvent or a resist composition comprising a polymer comprising recurring units having an acid labile group-substituted hydroxyl group, a polymer comprising recurring units having an acid labile group-substituted carboxyl group, an acid generator, and an organic solvent onto a substrate, heat treating the composition to form a resist film, exposing the resist film to high-energy radiation, heat treating, and developing the exposed film two times with an organic solvent and an alkaline aqueous solution.

In a preferred embodiment, the polymer comprising recurring units having acid labile group-substituted hydroxyl and carboxyl groups comprises recurring units (a1) or (a2) and (b) represented by the general formula (1).

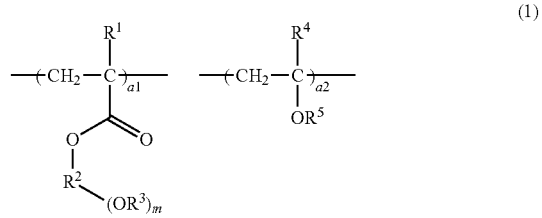

-continued

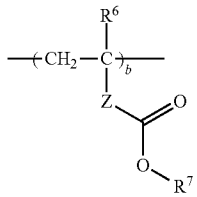

Herein $R^1$, $R^4$, and $R^6$ are each independently hydrogen or methyl, $R^2$ is a (m+1)-valent, straight, branched or cyclic, $C_1$-$C_{16}$ hydrocarbon group which may contain an ether group, ester group or lactone ring, $R^3$, $R^5$, and $R^7$ are each independently an acid labile group, m is an integer of 1 to 3, Z is a single bond or —C(=O)—O—$R^8$—, $R^8$ is a straight, branched or cyclic $C_1$-$C_{10}$ alkylene group which may contain an ether group, ester group, lactone ring or hydroxyl group, or a naphthylene group, a1, a2, and b are numbers in the range: $0 \leq a1 < 1.0$, $0 \leq a2 < 1.0$, $0 < b < 1.0$, $0 < a1+a2 < 1.0$, and $0 < a1+a2+b \leq 1.0$.

In a preferred embodiment, the organic solvent as the developer comprises at least one solvent selected from among 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, butenyl acetate, isoamyl acetate, phenyl acetate, propyl formate, butyl formate, isobutyl formate, amyl formate, isoamyl formate, methyl valerate, methyl pentenoate, methyl crotonate, ethyl crotonate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate.

In a preferred embodiment, the alkaline aqueous solution as the developer is an aqueous solution containing an amine selected from the group consisting of tetramethylammonium hydroxide, tetraethylammonium hydroxide, tetrapropylammonium hydroxide, tetrabutylammonium hydroxide, choline hydroxide, morpholine, and piperidine.

In a preferred embodiment, the step of exposing the resist film to high-energy radiation is carried out by ArF immersion lithography of 193 nm wavelength or EUV lithography of 13.5 nm wavelength.

In a preferred embodiment, the exposure step uses a mask pattern having a pitch, and a pattern having a half pitch of the mask pattern is resolved through the two developments.

Advantageous Effects of Invention

A photoresist film comprising a polymer comprising recurring units having both acid labile group-substituted hydroxyl and carboxyl groups and an acid generator is exposed to light through a mask pattern and subjected to two developments with organic solvent and alkaline water for thereby dividing one line into two lines. Then a resolution doubling the mask pattern is achievable.

BRIEF DESCRIPTION OF DRAWINGS

FIG. 1 schematically illustrates in cross-sectional views the pattern forming process of the invention, FIG. 1A shows a photoresist film formed on a substrate, FIG. 1B shows the photoresist film being exposed, FIG. 1C shows the photoresist film being developed with organic solvent, and FIG. 1D shows the photoresist film being developed with alkaline aqueous solution.

DESCRIPTION OF EMBODIMENTS

Figure 2:
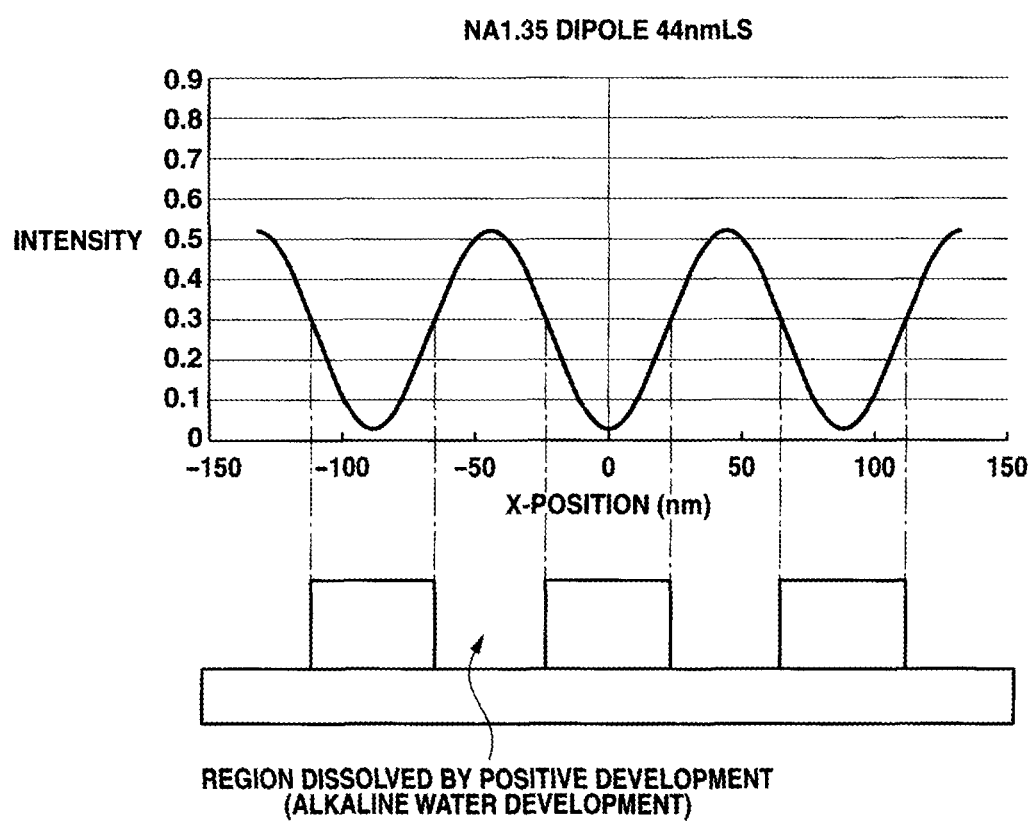
FIG. 2 illustrates an optical image of a 44-nm line-and-space pattern produced under conditions: NA 1.35 lens, dipole illumination, and 6% halftone phase shift mask and a cross-sectional profile of a pattern of a prior art positive resist after development.

The terms "a" and "an" herein do not denote a limitation of quantity, but rather denote the presence of at least one of the referenced item. "Optional" or "optionally" means that the subsequently described event or circumstance may or may not occur, and that the description includes instances where the event occurs and instances where it does not. As used herein, the notation ($C_n$-$C_m$) means a group containing from n to m carbon atoms per group.

The abbreviations and acronyms have the following meaning.
Mw: weight average molecular weight
Mn: number average molecular weight
Mw/Mn: molecular weight distribution or dispersity
GPC: gel permeation chromatography
PEB: post-exposure baking
PGMEA: propylene glycol monomethyl ether acetate
TMAH: tetramethylammonium hydroxide The invention is directed to a pattern forming process comprising the steps of coating a photoresist composition based on a polymer comprising recurring units having both acid labile group-substituted hydroxyl and carboxyl groups onto a substrate, prebaking the composition to remove the unnecessary solvent and form a resist film, exposing the resist film to high-energy radiation, PEB, and developing the exposed film two times with an organic solvent and an alkaline aqueous solution, for thereby achieving a resolution doubling the mask pattern.

The resist film according to the invention is characterized in that the exposure dose at which the solubility in organic solvent developer is reduced as a result of elimination of a protective group from a carboxyl group largely differs from the exposure dose at which the solubility in organic solvent developer is reduced as a result of elimination of a protective group from a hydroxyl group. The resist exhibits a higher sensitivity for the exposure dose at which the solubility in organic solvent developer is reduced as a result of elimination of a protective group from a hydroxyl group.

The polymer comprising recurring units having acid labile group-substituted hydroxyl and carboxyl groups preferably recurring units (a1) or (a2) and (b) represented by the general formula (1):

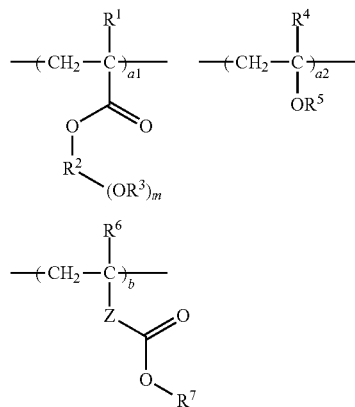

wherein $R^1$, $R^4$, and $R^6$ are each independently hydrogen or methyl, $R^2$ is a (m+1)-valent, straight, branched or cyclic, $C_1$-$C_{16}$ hydrocarbon group which may contain an ether group, ester group or lactone ring, $R^3$, $R^5$, and $R^7$ are each independently an acid labile group, m is an integer of 1 to 3, Z is a single bond or —C(=O)—O—$R^8$—, $R^8$ is a straight, branched or cyclic $C_1$-$C_{10}$ alkylene group which may contain an ether group, ester group, lactone ring or hydroxyl group, or a naphthylene group, a1, a2, and b are numbers in the range: $0 \leq a1 < 1.0$, $0 \leq a2 < 1.0$, $0 < b < 1.0$, $0 < a1+a2 < 1.0$, and $0 < a1+a2+b \leq 1.0$.

The acid labile group-substituted hydroxyl groups are the recurring units (a1) and (a2) in the above formula (1).

Suitable monomers from which the recurring units (a1) and (a2) are derived are shown below.

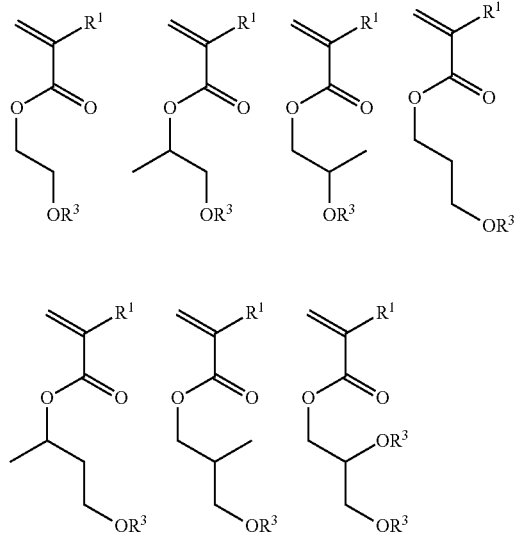

-continued

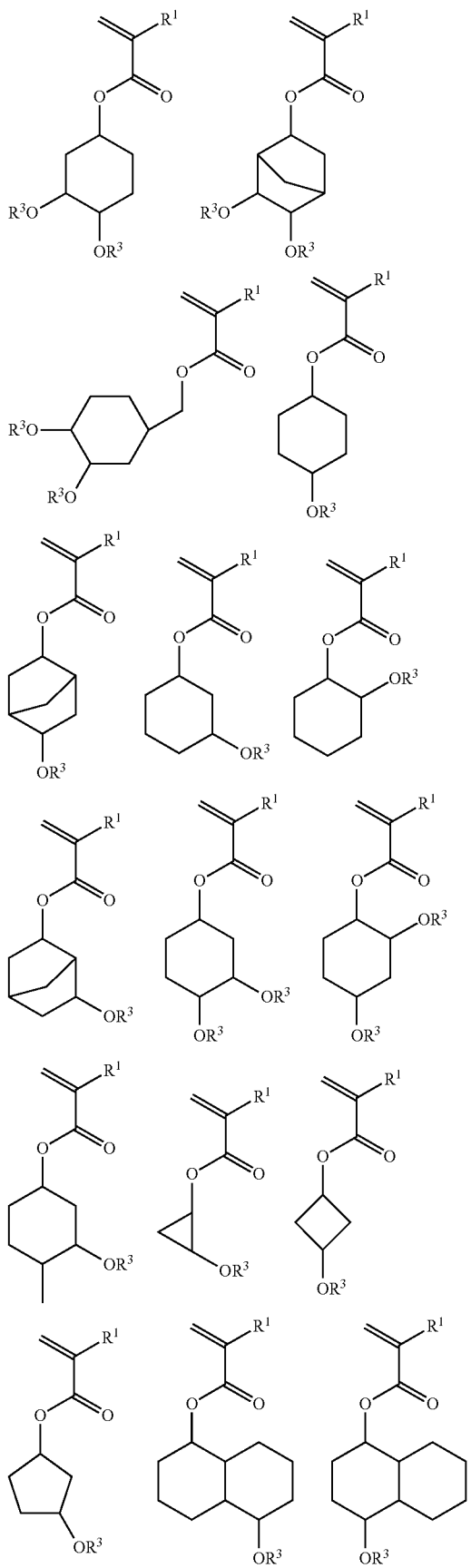

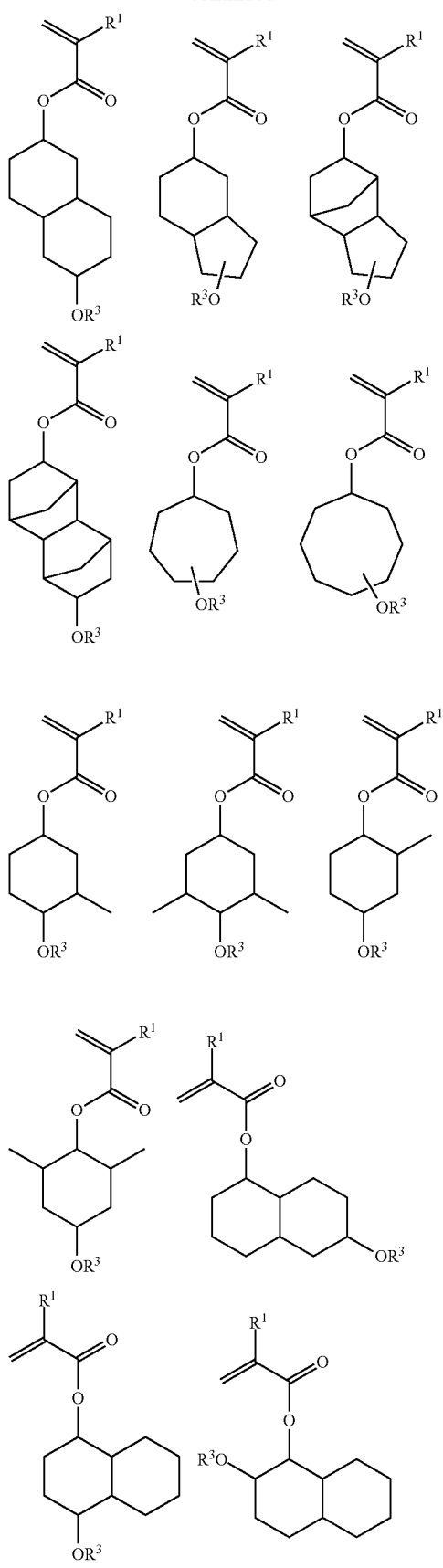
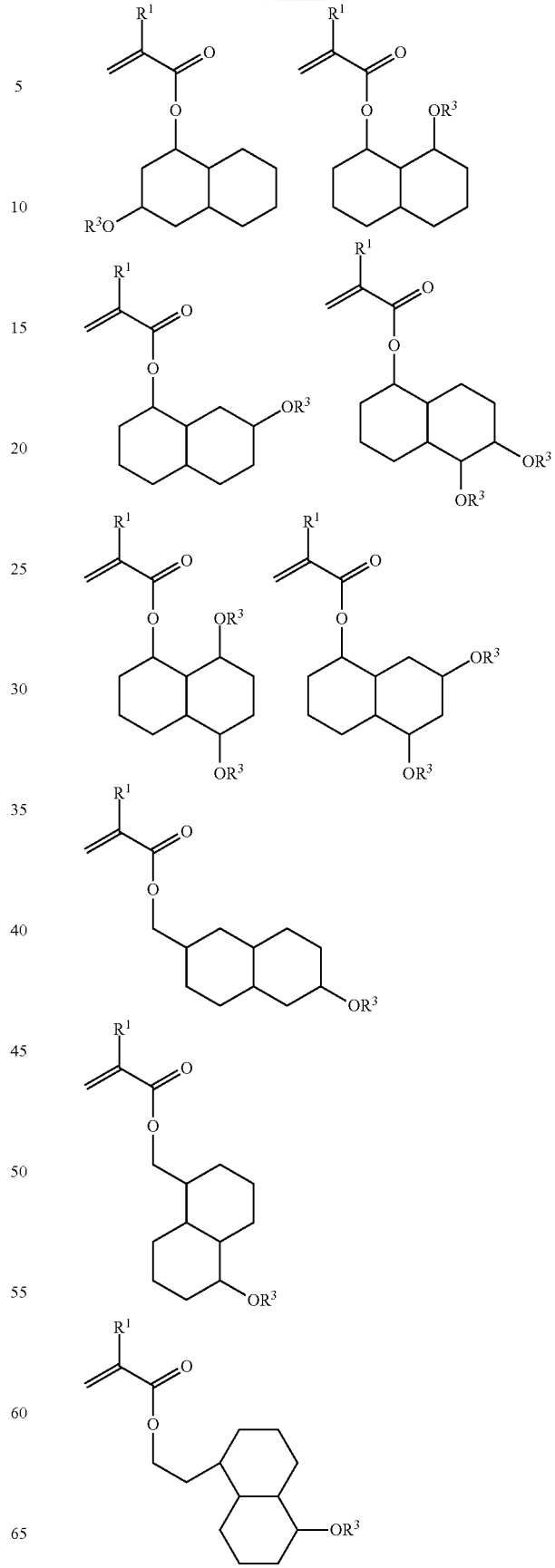

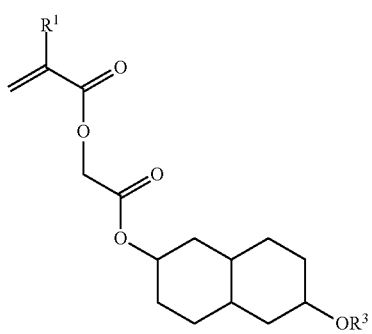
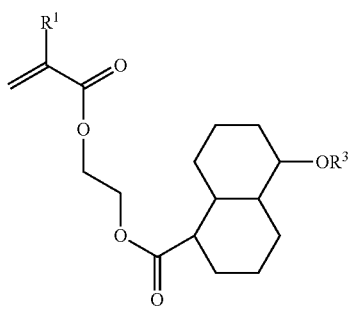
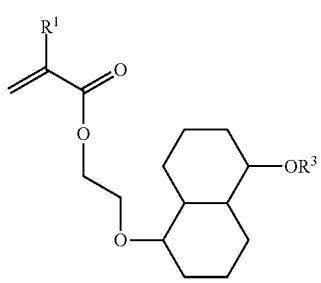
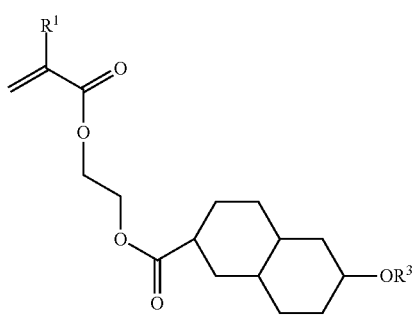
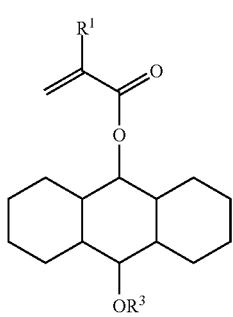
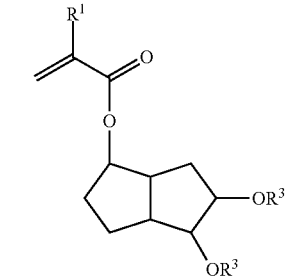
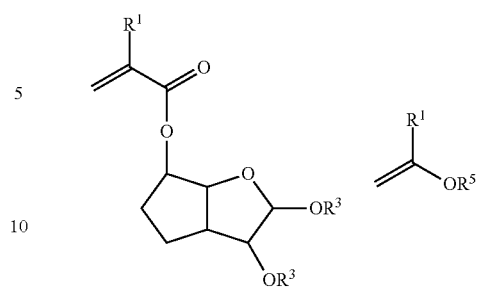
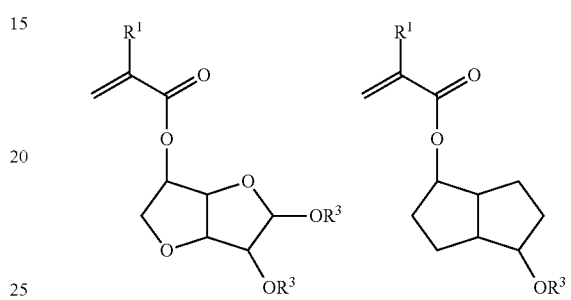
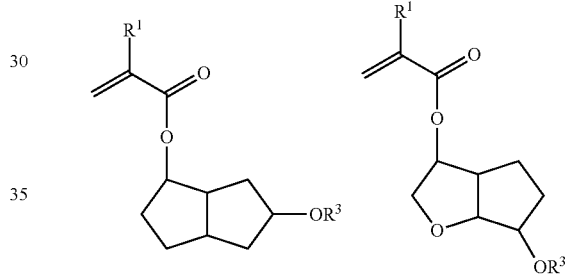
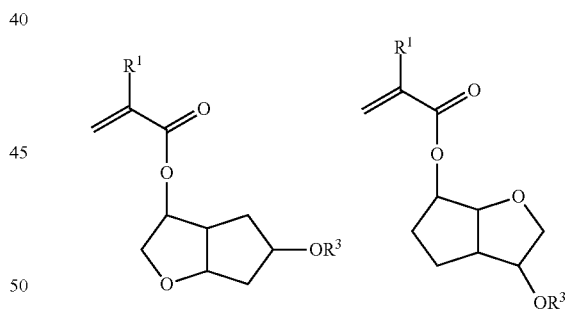
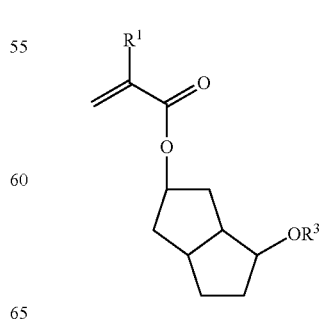
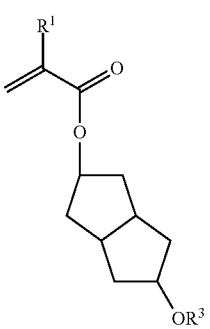

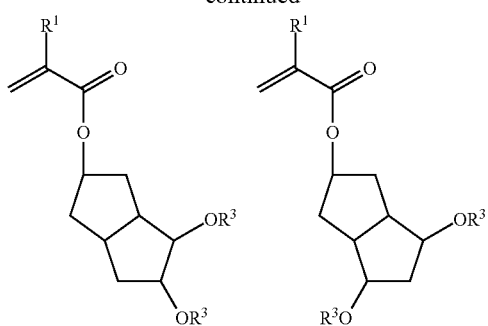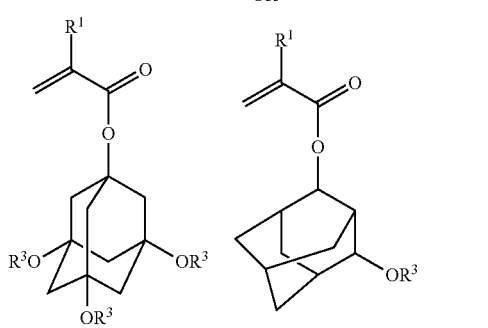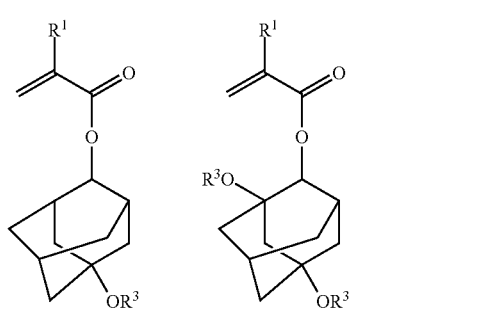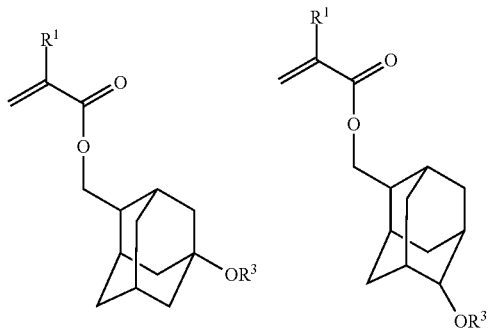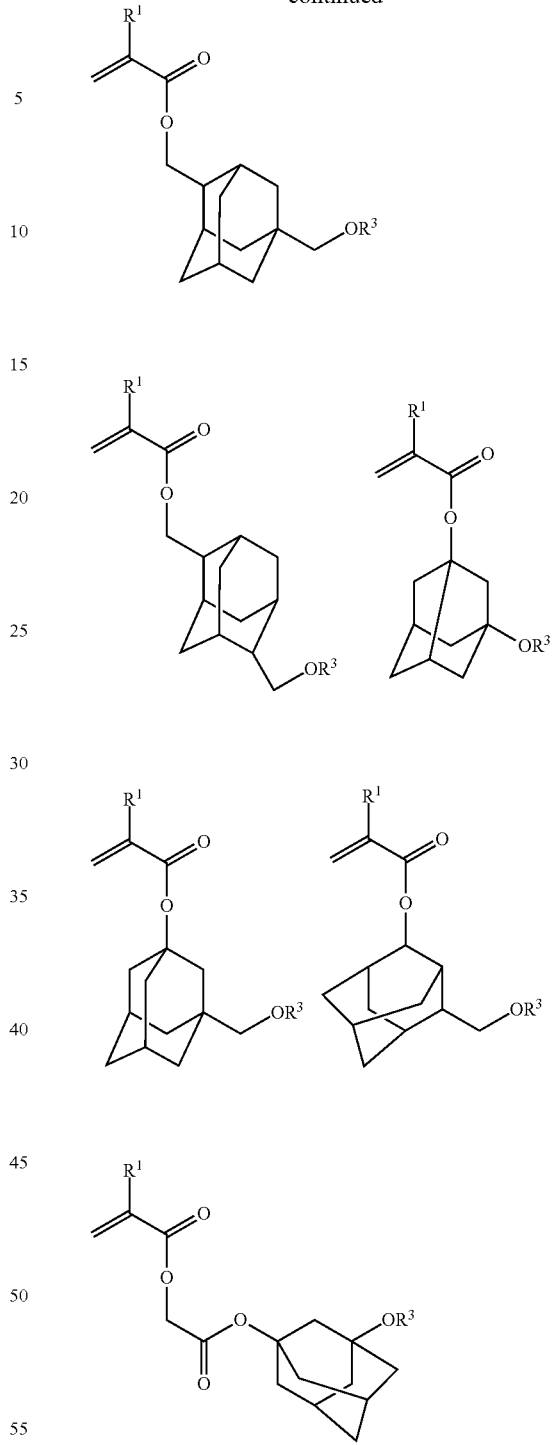

Herein $R^1$, $R^3$, $R^4$, and $R^5$ are as defined above.

The polymer used as the base resin in the resist composition adapted for organic solvent development for effecting positive/negative reversal in the pattern forming process of the invention has copolymerized therein recurring units having the acid labile group-substituted carboxyl group (b) in the above formula (1) in addition to recurring units (a1) and (a2).

Monomers Mb from which the recurring units (b) are derived have the following formula.

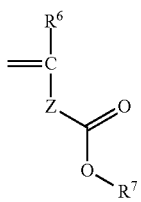 Mb
Herein, $R^6$ is hydrogen or methyl, $R^7$ is an acid labile group, and Z is a single bond or $-C(=O)-O-R^8-$ wherein $R^8$ is a straight, branched or cyclic $C_1$-$C_{10}$ alkylene group which may contain an ether group, ester group, lactone ring or hydroxyl group, or a naphthylene group.
Examples of the monomer Mb wherein Z is a different group are given below.
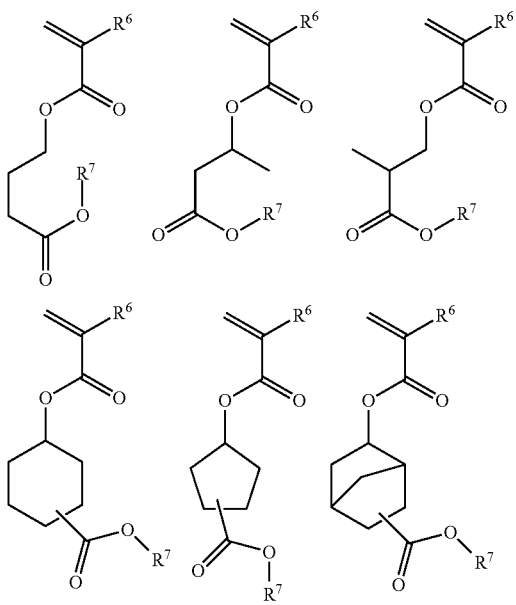
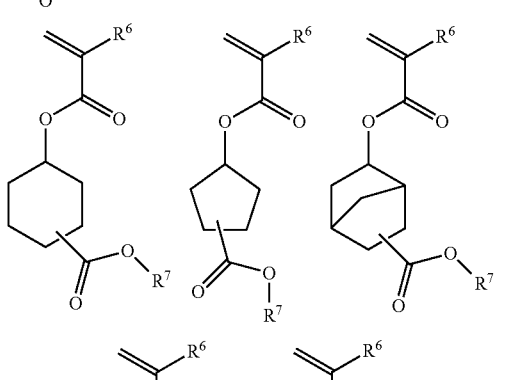
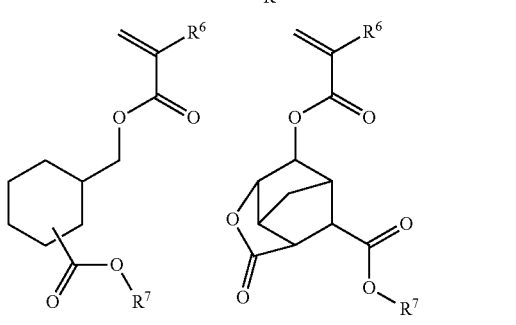
-continued
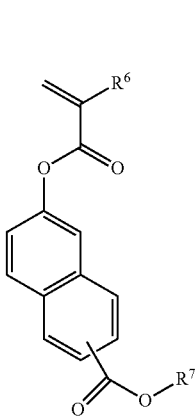
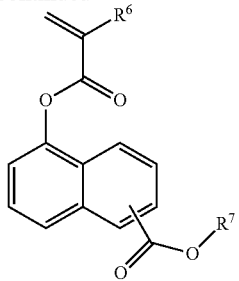
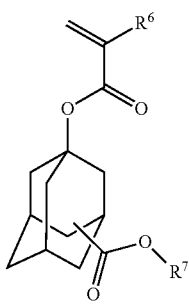
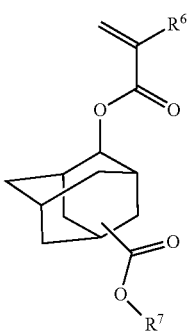
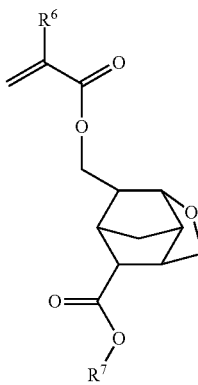
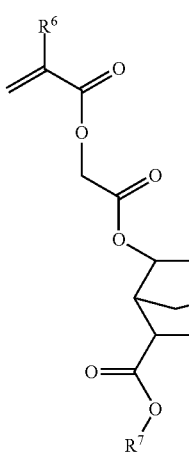

-continued

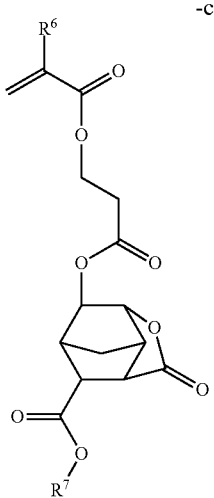

Herein R⁶ and R⁷ are as defined above.

The acid labile groups represented by $R^3$, $R^5$ and $R^7$ in formula (1) may be identical or different and selected from a variety of such groups, specifically groups of the following formulae (AL-10) and (AL-11), tertiary alkyl groups of the following formula (AL-12), and oxoalkyl groups of 4 to 20 carbon atoms.

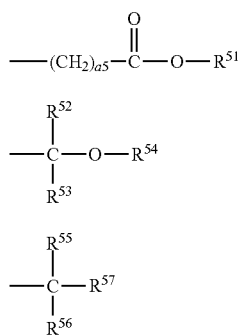

In formulae (AL-10) and (AL-11), $R^{51}$ and $R^{54}$ each are a monovalent hydrocarbon group, typically straight, branched or cyclic alkyl group, of 1 to 40 carbon atoms, more specifically 1 to 20 carbon atoms, which may contain a heteroatom such as oxygen, sulfur, nitrogen or fluorine. The subscript "a5" is an integer of 0 to 10, and especially 1 to 5. $R^{52}$ and $R^{53}$ each are hydrogen or a monovalent hydrocarbon group, typically straight, branched or cyclic alkyl group, of 1 to 20 carbon atoms which may contain a heteroatom such as oxygen, sulfur, nitrogen or fluorine. Alternatively, a pair of $R^{52}$ and $R^{53}$, $R^{52}$ and $R^{54}$, or $R^{53}$ and $R^{54}$ may bond together to form a ring, specifically aliphatic ring, with the carbon atom or the carbon and oxygen atoms to which they are attached, the ring having 3 to 20 carbon atoms, especially 4 to 16 carbon atoms.

In formula (AL-12), $R^{55}$, $R^{56}$ and $R^{57}$ each are a monovalent hydrocarbon group, typically straight, branched or cyclic alkyl group, of 1 to 20 carbon atoms which may contain a heteroatom such as oxygen, sulfur, nitrogen or fluorine. Alternatively, a pair of $R^{55}$ and $R^{56}$, $R^{55}$ and $R^{57}$, or $R^{56}$ and $R^{57}$ may bond together to form a ring, specifically aliphatic ring, with the carbon atom to which they are attached, the ring having 3 to 20 carbon atoms, especially 4 to 16 carbon atoms.

Illustrative examples of the groups of formula (AL-10) include tert-butoxycarbonyl, tert-butoxycarbonylmethyl, tert-amyloxycarbonyl, tert-amyloxycarbonylmethyl, 1-ethoxyethoxycarbonylmethyl, 2-tetrahydropyranyloxycarbonylmethyl and 2-tetrahydrofuranyloxycarbonylmethyl as well as substituent groups of the following formulae (AL-10)-1 to (AL-10)-10.

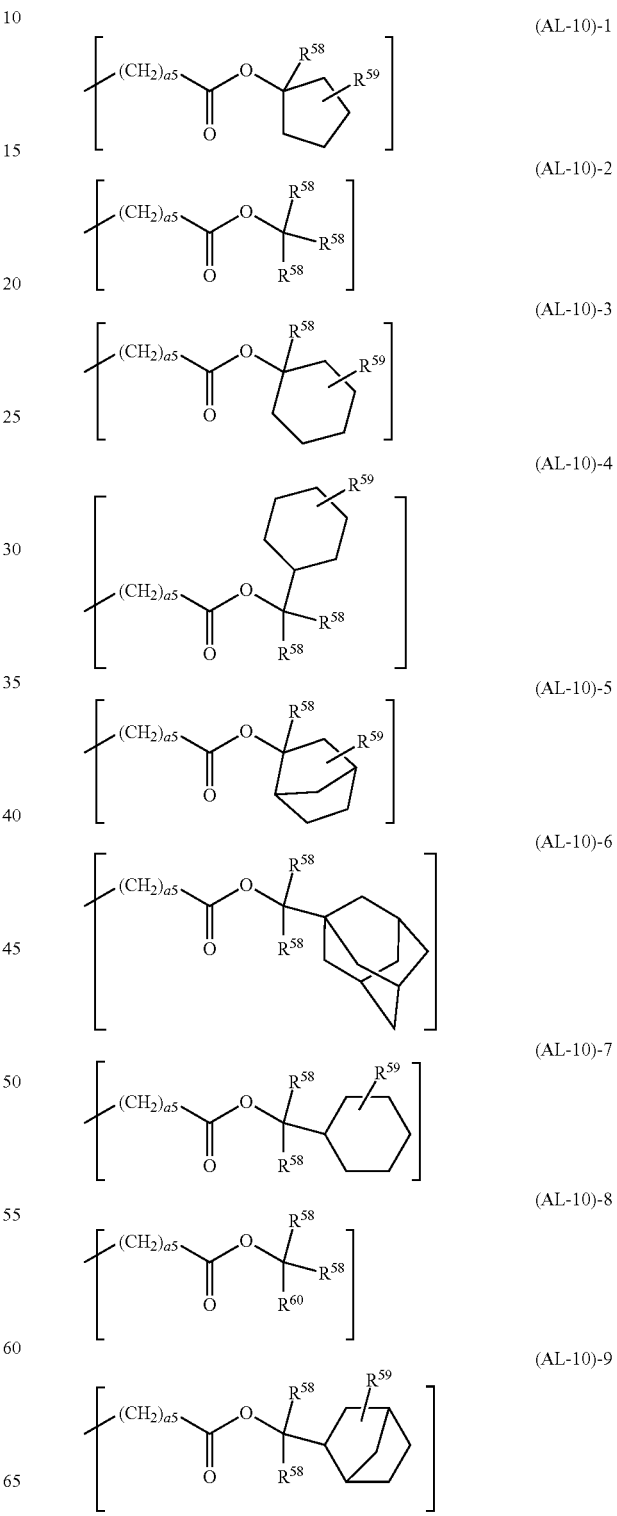

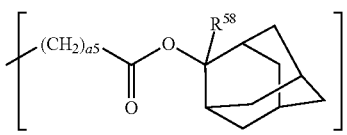
(AL-10)-10

In formulae (AL-10)-1 to (AL-10)-10, $R^{58}$ is each independently a straight, branched or cyclic $C_1$-$C_8$ alkyl group, $C_6$-$C_{20}$ aryl group or $C_7$-$C_{20}$ aralkyl group; $R^{59}$ is hydrogen or a straight, branched or cyclic $C_1$-$C_{20}$ alkyl group; $R^{60}$ is a $C_6$-$C_{20}$ aryl group or $C_7$-$C_{20}$ aralkyl group; and "a5" is an integer of 0 to 10.

Illustrative examples of the acetal group of formula (AL-11) include those of the following formulae (AL-11)-1 to (AL-11)-44.

—CH$_2$—O—CH$_3$ (AL-11)-1

—CH$_2$—O—CH$_2$—CH$_3$ (AL-11)-2

—CH$_2$—O—(CH$_2$)$_2$—CH$_3$ (AL-11)-3

—CH$_2$—O—(CH$_2$)$_3$—CH$_3$ (AL-11)-4

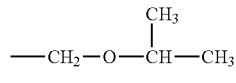
(AL-11)-5

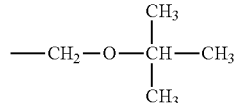
(AL-11)-6

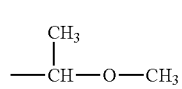
(AL-11)-7

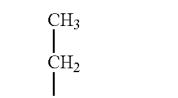
(AL-11)-8

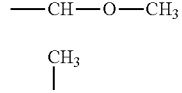
(AL-11)-9

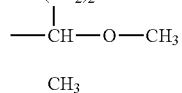
(AL-11)-10

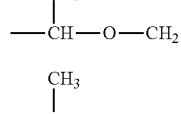
(AL-11)-11

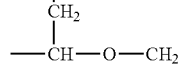
(AL-11)-12

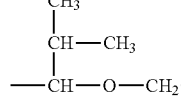
(AL-11)-13

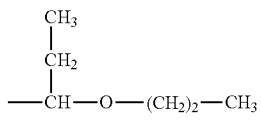
(AL-11)-14

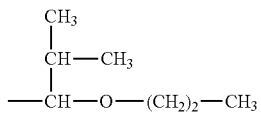
(AL-11)-15

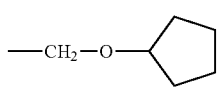
(AL-11)-16

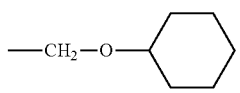
(AL-11)-17

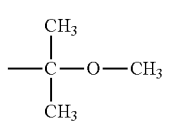
(AL-11)-18

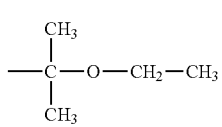
(AL-11)-19

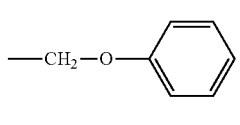
(AL-11)-20

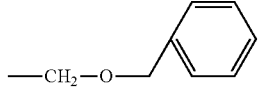
(AL-11)-21

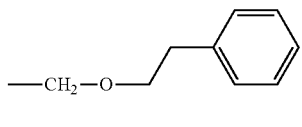
(AL-11)-22

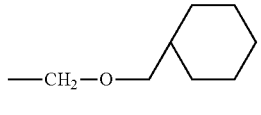
(AL-11)-23

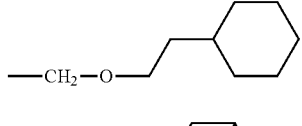
(AL-11)-24

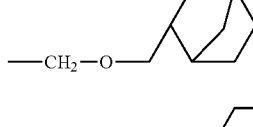
(AL-11)-25

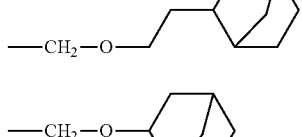
(AL-11)-26

(AL-11)-27

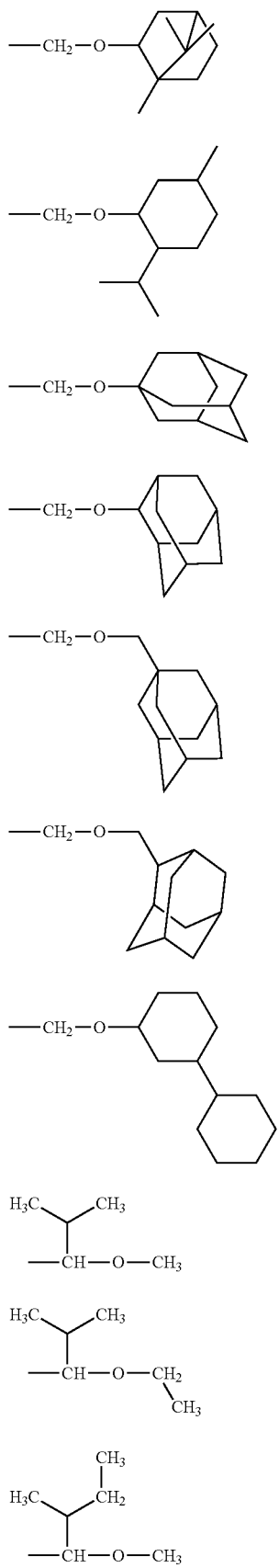

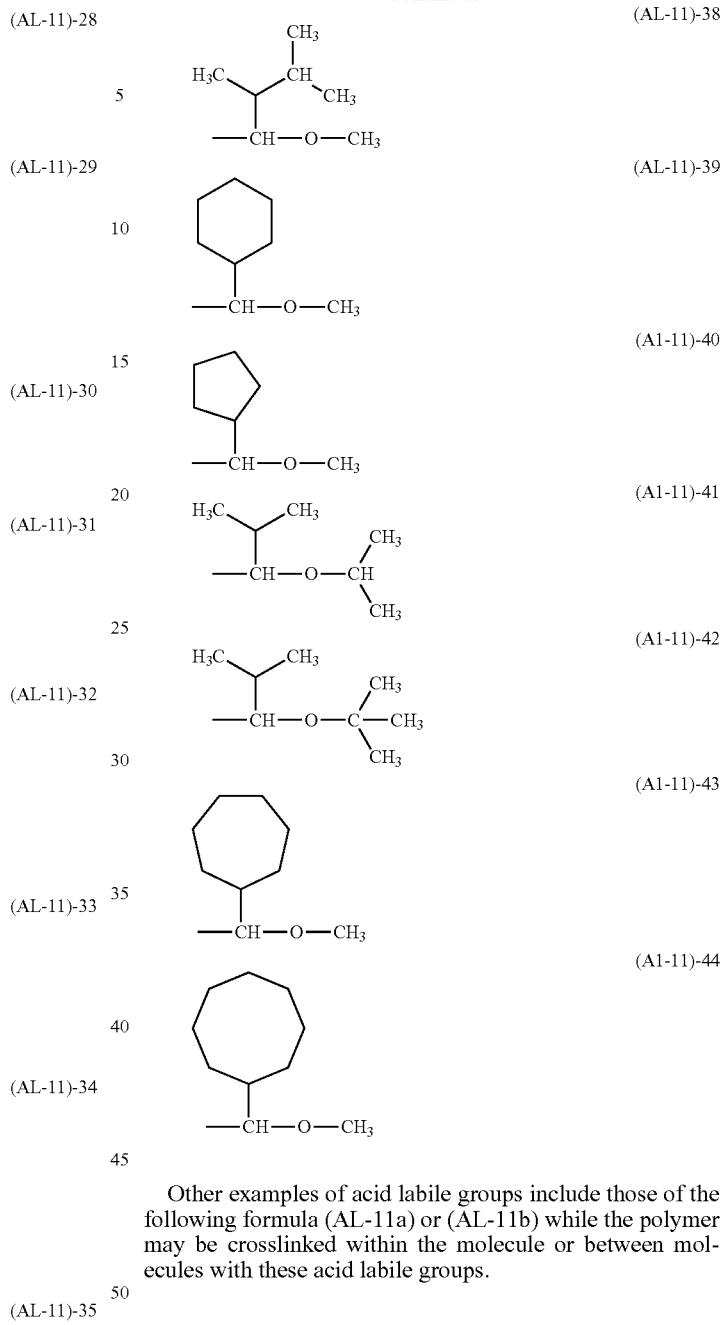

Other examples of acid labile groups include those of the following formula (AL-11a) or (AL-11b) while the polymer may be crosslinked within the molecule or between molecules with these acid labile groups.

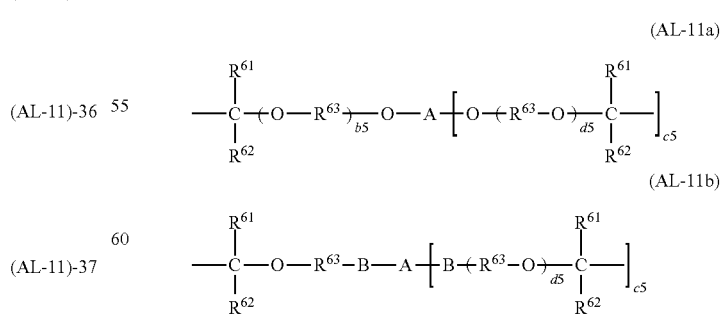

Herein $R^{61}$ and $R^{62}$ each are hydrogen or a straight, branched or cyclic $C_1$-$C_8$ alkyl group, or $R^{61}$ and $R^{62}$ may bond together to form a ring with the carbon atom to which they are attached, and $R^{61}$ and $R^{62}$ are straight or branched $C_1$-$C_8$ alkylene groups when they form a ring. $R^{63}$ is a straight, branched or cyclic $C_1$-$C_{10}$ alkylene group. Each of b5 and d5 is 0 or an integer of 1 to 10, preferably 0 or an integer of 1 to 5, and c5 is an integer of 1 to 7. "A" is a (c5+1)-valent aliphatic or alicyclic saturated hydrocarbon group, aromatic hydrocarbon group or heterocyclic group having 1 to 50 carbon atoms, which may be separated by a heteroatom such as oxygen, sulfur or nitrogen or in which some of the hydrogen atoms attached to carbon atoms may be substituted by hydroxyl, carboxyl, carbonyl radicals or fluorine atoms. "B" is —CO—O—, —NHCO—O— or —NH-CONH—.

Preferably, "A" is selected from divalent to tetravalent, straight, branched or cyclic $C_1$-$C_{20}$ alkylene, alkanetriyl and alkanetetrayl groups, and $C_6$-$C_{30}$ arylene groups, which may be separated by a heteroatom such as oxygen, sulfur or nitrogen or in which some of the hydrogen atoms attached to carbon atoms may be substituted by hydroxyl, carboxyl, acyl radicals or halogen atoms. The subscript c5 is preferably an integer of 1 to 3.

The crosslinking acetal groups of formulae (AL-11a) and (AL-11b) are exemplified by the following formulae (AL-11)-45 through (AL-11)-52.

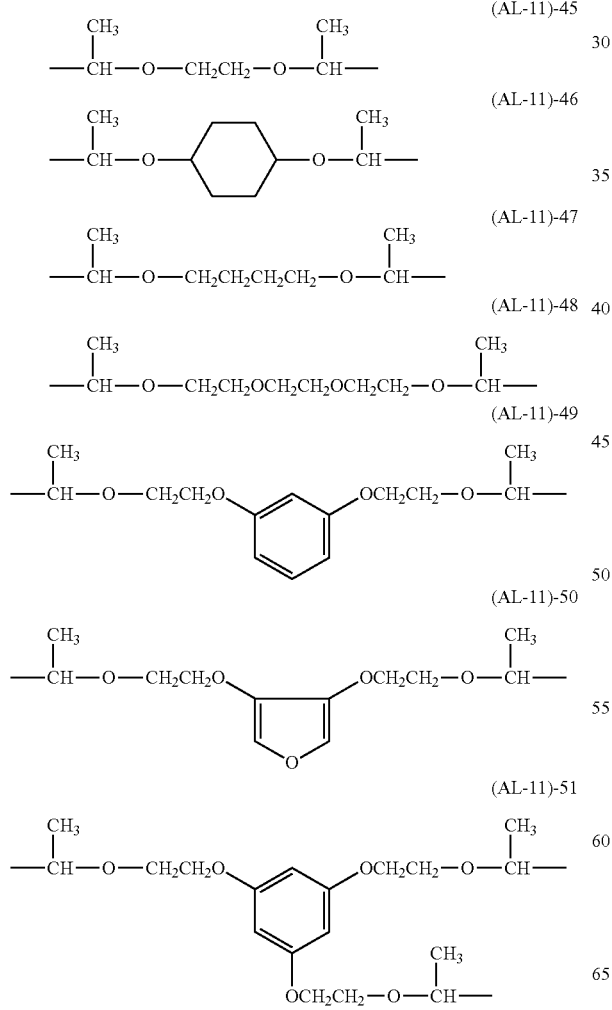

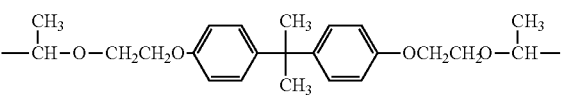

Illustrative examples of the tertiary alkyl of formula (AL-12) include tert-butyl, triethylcarbyl, 1-ethylnorbornyl, 1-methylcyclohexyl, 1-ethylcyclopentyl, and tert-amyl groups as well as those of (AL-12)-1 to (AL-12)-16.

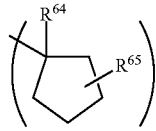

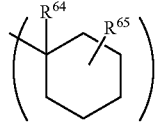

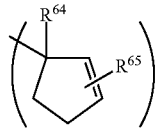

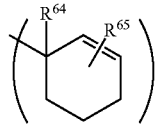

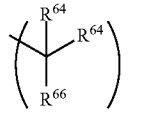

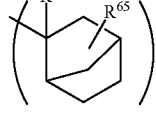

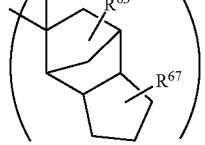

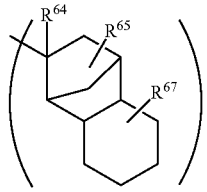

(AL-12)-9

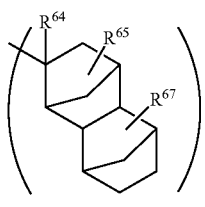

(AL-12)-10

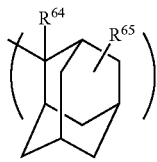

(AL-12)-11

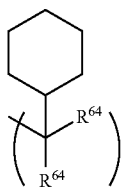

(AL-12)-12

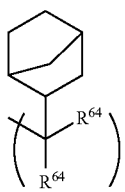

(AL-12)-13

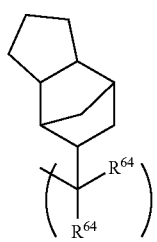

(AL-12)-14

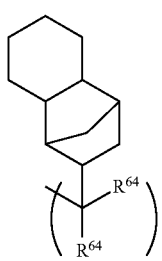

(AL-12)-15

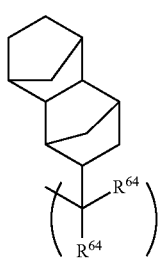

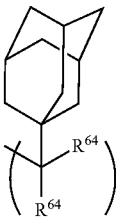

(AL-12)-16

Herein $R^{64}$ is each independently a straight, branched or cyclic $C_1$-$C_8$ alkyl group, $C_6$-$C_{20}$ aryl group or $C_7$-$C_{20}$ aralkyl group, or two $R^{64}$ groups may bond together to form a ring with the carbon atom to which they are attached, the ring being of 3 to 20 carbon atoms, specifically 4 to 16 carbon atoms, typically aliphatic ring; $R^{65}$ and $R^{67}$ each are hydrogen or a straight, branched or cyclic $C_1$-$C_{20}$ alkyl group; and $R^{66}$ is a $C_6$-$C_{20}$ aryl group or $C_7$-$C_{20}$ aralkyl group.

With acid labile groups containing $R^{68}$ representative of a di- or poly-valent alkylene or arylene group as shown by formulae (AL-12)-17 and (AL-12)-18, the polymer may be crosslinked within the molecule or between molecules. In formulae (AL-12)-17 and (AL-12)-18, $R^{64}$ is as defined above, $R^{68}$ is a straight, branched or cyclic $C_1$-$C_{20}$ alkylene group or arylene group, which may contain a heteroatom such as oxygen, sulfur or nitrogen, and b6 is an integer of 1 to 3. Notably, formula (AL-12)-17 is applicable to all the acid labile groups $R^3$, $R^5$, and $R^7$ whereas formula (AL-12)-18 is applicable to only $R^7$.

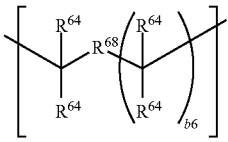

(AL-12)-17

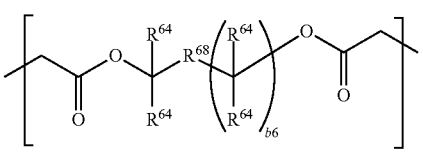

(AL-12)-18

The groups represented by $R^{64}$, $R^{65}$, $R^{66}$ and $R^{67}$ may contain a heteroatom such as oxygen, nitrogen or sulfur. Such groups are exemplified by those of the following formulae (AL-13)-1 to (AL-13)-7.

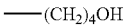 —(CH$_2$)$_4$OH (AL-13)-1

—(CH$_2$)$_2$O(CH$_2$)$_3$CH$_3$ (AL-13)-2

 (AL-13)-3

—(CH$_2$)$_2$O(CH$_2$)$_2$OH (AL-13)-4

—(CH$_2$)$_6$OH (AL-13)-5

-continued

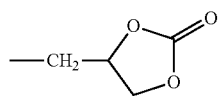
(AL-13)-6

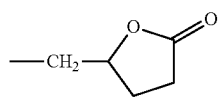
(AL-13)-7

Inter alia, groups having an exo-form structure represented by the formula (AL-12)-19 are preferred as the acid labile group represented by $R^7$.

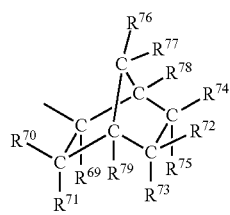
(AL-12)-19

Herein, $R^{69}$ is a straight, branched or cyclic $C_1$-$C_8$ alkyl group or an optionally substituted $C_6$-$C_{20}$ aryl group; $R^{70}$ to $R^{75}$, $R^{78}$ and $R^{79}$ are each independently hydrogen or a monovalent hydrocarbon group, typically alkyl, of 1 to 15 carbon atoms which may contain a heteroatom; and $R^{76}$ and $R^{77}$ are hydrogen. Alternatively, a pair of $R^{70}$ and $R^{71}$, $R^{72}$ and $R^{74}$, $R^{72}$ and $R^{75}$, $R^{73}$ and $R^{75}$, $R^{73}$ and $R^{79}$, $R^{74}$ and $R^{78}$, $R^{76}$ and $R^{77}$, or $R^{77}$ and $R^{78}$ may bond together to form a ring, specifically aliphatic ring, with the carbon atom(s) to which they are attached, and in this case, each R is a divalent hydrocarbon group, typically alkylene, of 1 to 15 carbon atoms which may contain a heteroatom. Also, a pair of $R^{70}$ and $R^{79}$, $R^{76}$ and $R^{79}$, or $R^{72}$ and $R^{74}$ which are attached to vicinal carbon atoms may bond together directly to form a double bond. The formula also represents an enantiomer.

The ester form monomers from which recurring units having an exo-form structure represented by the formula (AL-12)-19 are derived are described in U.S. Pat. No. 6,448,420 (JP-A 2000-327633), with such recurring units being illustrated below.

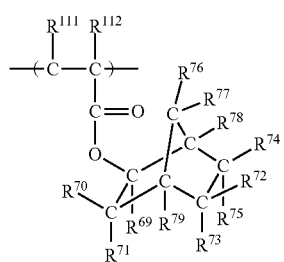

Herein $R^{111}$ and $R^{112}$ are each independently hydrogen, methyl, —$COOCH_3$, or —$CH_2COOCH_3$, and $R^{69}$ to $R^{78}$ are as defined above. Illustrative non-limiting examples of suitable monomers are given below.

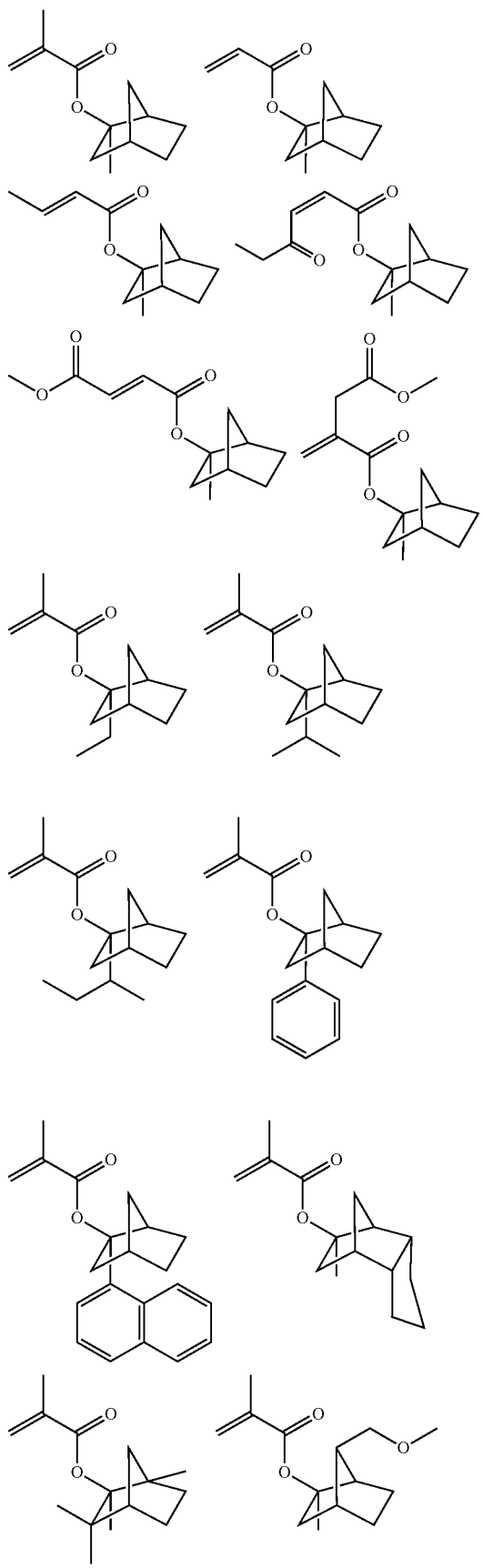

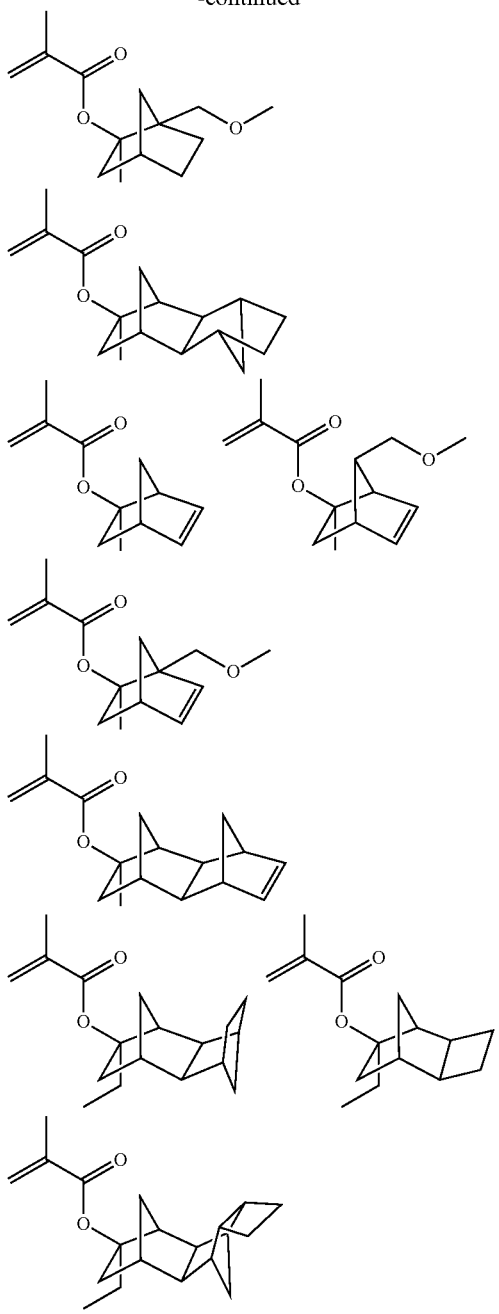

Also included in the acid labile groups of formula (AL-12) used as $R^7$ are acid labile groups having furandiyl, tetrahydrofurandiyl or oxanorbornanediyl as represented by the following formula (AL-12)-20.

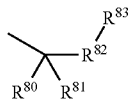
(AL-12)-20

Herein, $R^{80}$ and $R^{81}$ are each independently a monovalent hydrocarbon group, typically a straight, branched or cyclic $C_1$-$C_{10}$ alkyl. $R^{80}$ and $R^{81}$ may bond together to form an aliphatic hydrocarbon ring of 3 to 20 carbon atoms with the carbon atom to which they are attached. $R^{82}$ is a divalent group selected from furandiyl, tetrahydrofurandiyl and oxanorbornanediyl. $R^{83}$ is hydrogen or a monovalent hydrocarbon group, typically a straight, branched or cyclic $C_1$-$C_{10}$ alkyl, which may contain a heteroatom.

Examples of the monomers from which the recurring units substituted with acid labile groups having furandiyl, tetrahydrofurandiyl and oxanorbornanediyl as represented by the formula:

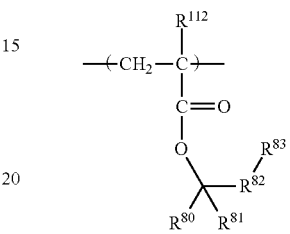

(wherein $R^{112}$ and $R^{80}$ to $R^{83}$ are as defined above) are derived are shown below. Note that Me is methyl, and Ac is acetyl.

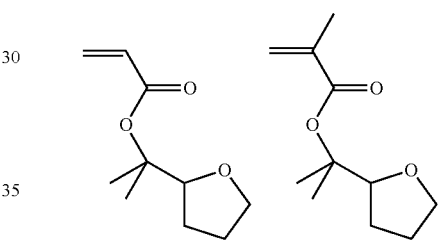

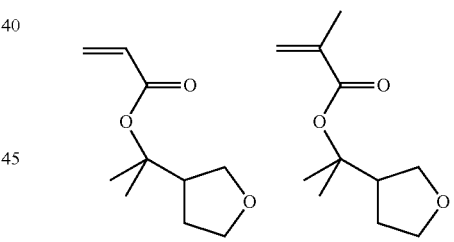

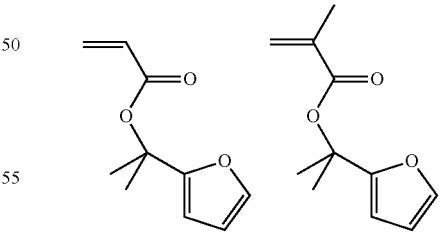

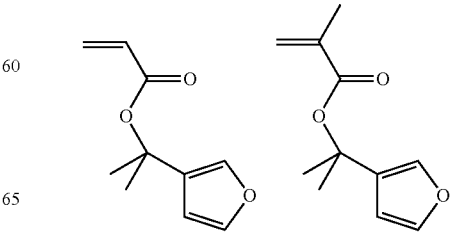

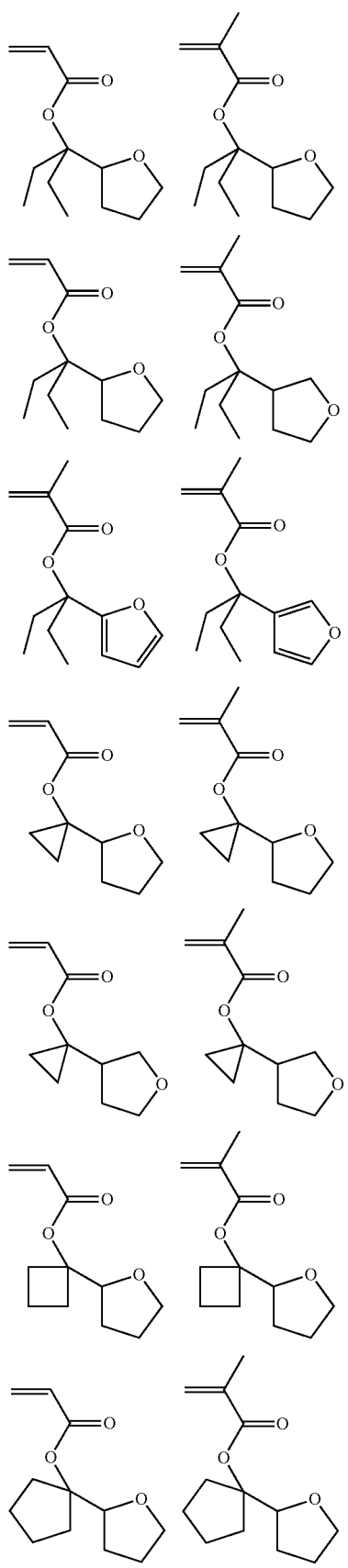
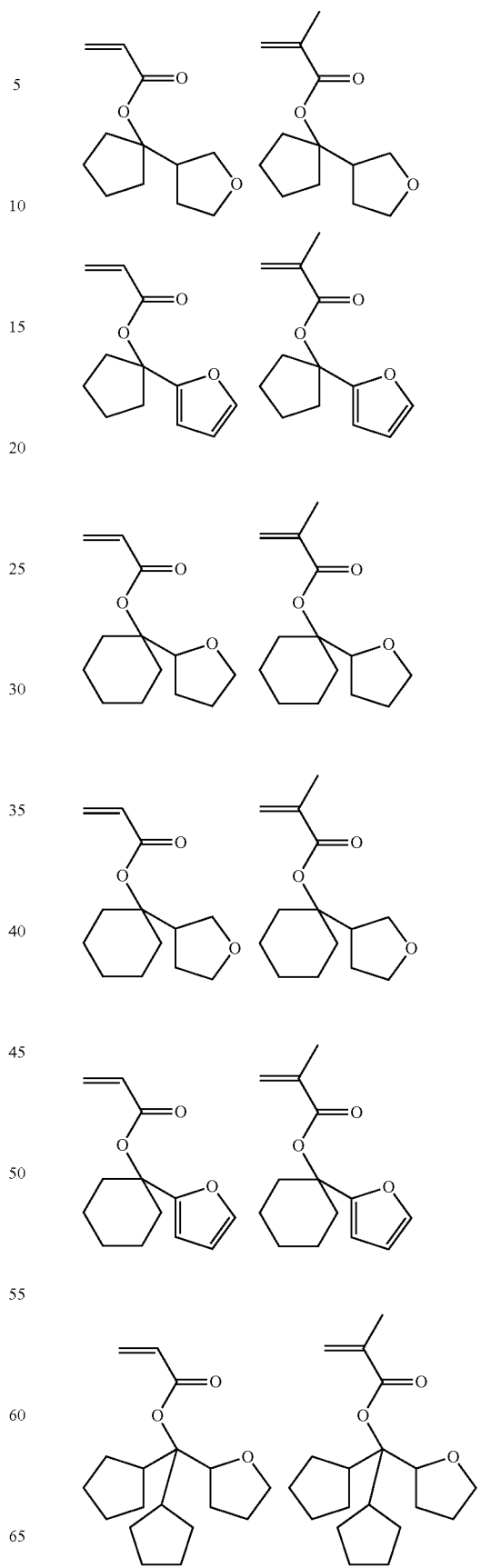

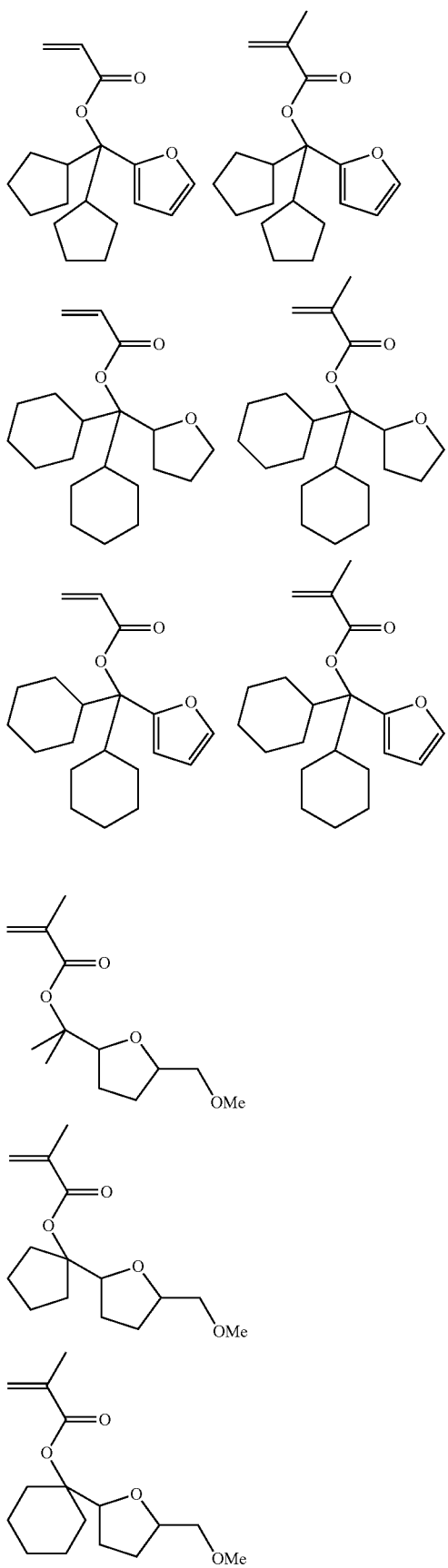
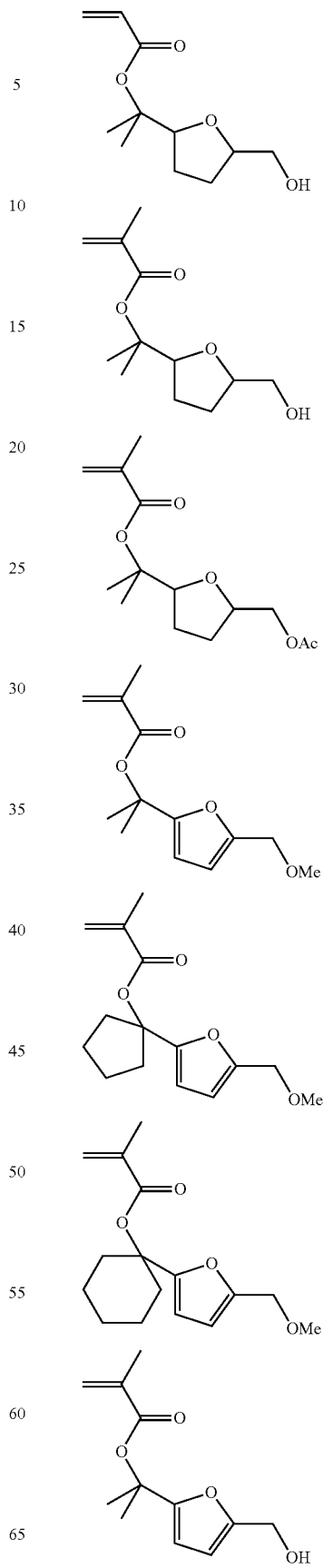

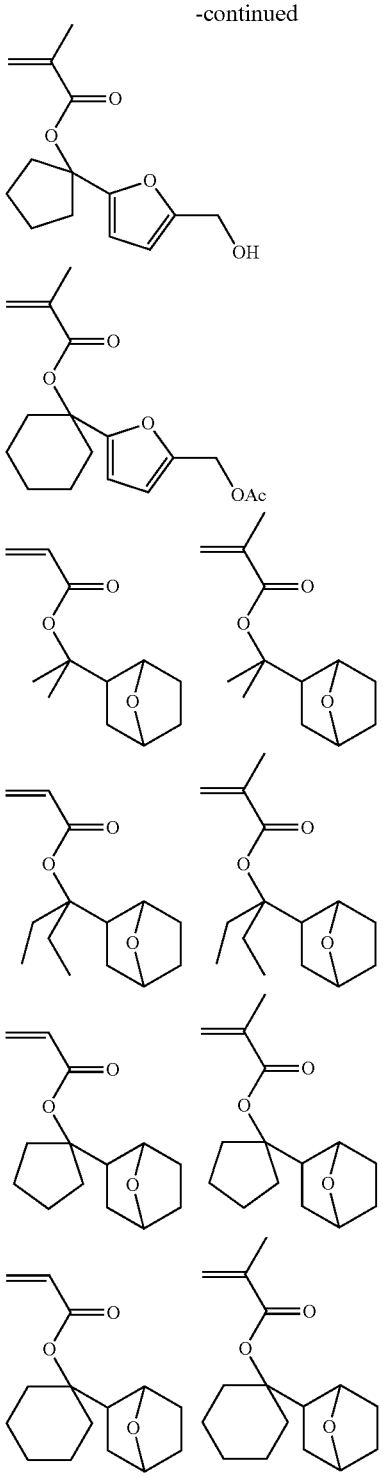

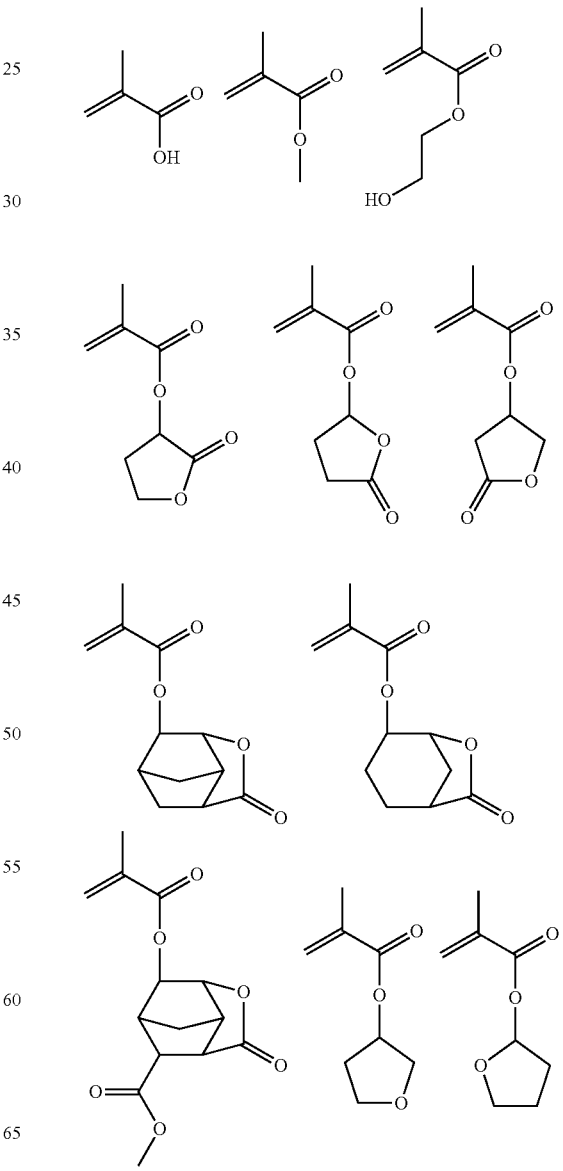

Of the foregoing acid labile groups $R^3$ and $R^5$ substituting on hydroxyl groups in recurring units (a1) and (a2), acetal groups of formula (AL-11) and carbonate groups of formula (AL-10) are preferably used. Of the foregoing acid labile groups $R^7$ substituting on carboxyl groups in recurring units (b), the tertiary ester groups of formula (AL-12), especially tertiary ester groups of cyclic structure are most preferred. Most preferred tertiary ester groups are those of formulae (AL-12)-1 to (AL-12)-16 and (AL-12)-19. In a low exposure dose region, the acid labile group substituting on hydroxyl group is deprotected, whereby a negative pattern is formed by organic solvent development. In a high exposure dose region, the acid labile group substituting on carboxyl group is deprotected, whereby a positive pattern is formed by alkaline aqueous solution development. By utilizing the phenomenon that the rate of deprotection of the acid labile group substituting on hydroxyl group differs from the rate of deprotection of the acid labile group substituting on carboxyl group, a difference can be provided between the positive-toning exposure dose and the negative-toning exposure dose.

While the polymer used as the base in the resist composition essentially comprises recurring units (a1) and (a2) and optionally recurring units (b) in formula (1), it may have further copolymerized therein recurring units (c) derived from monomers having adhesive groups such as hydroxy, cyano, carbonyl, ester, ether groups, lactone rings, carboxyl groups or carboxylic anhydride groups. Examples of monomers from which recurring units (c) are derived are given below.

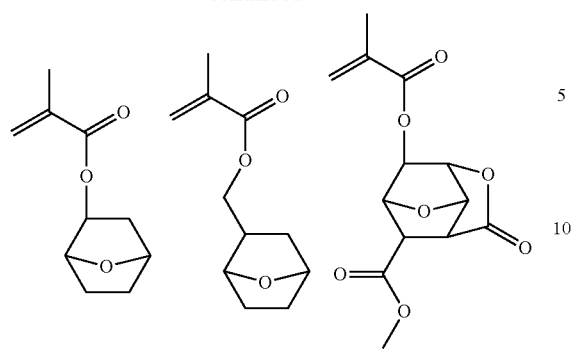
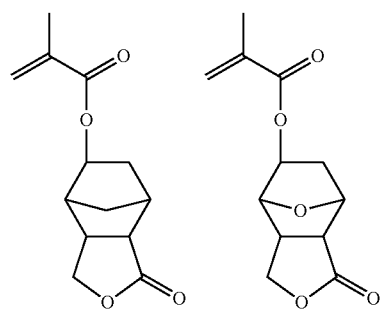
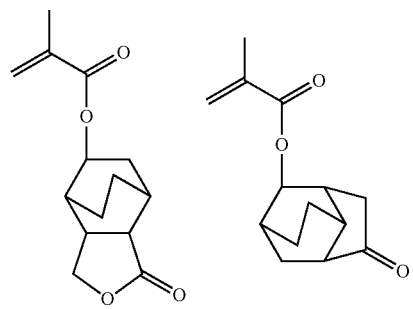
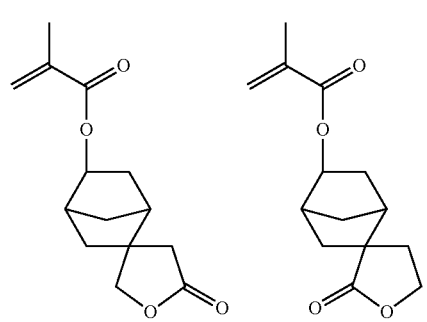
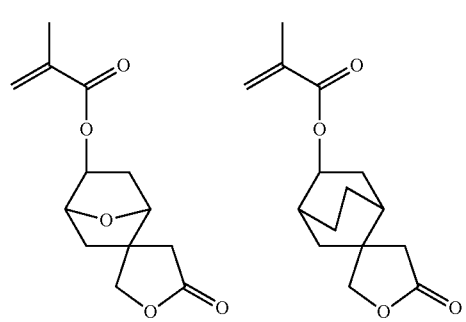
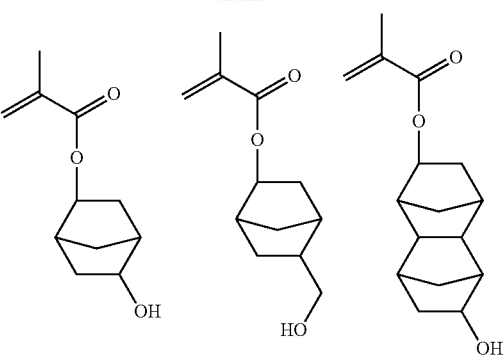
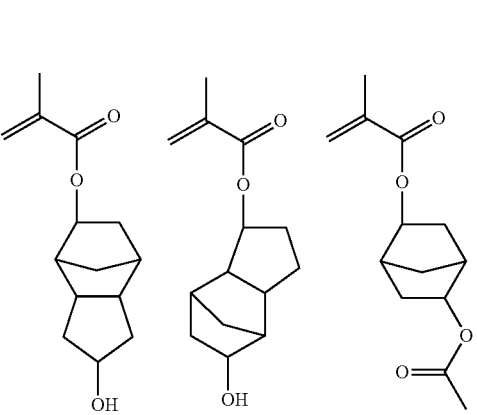
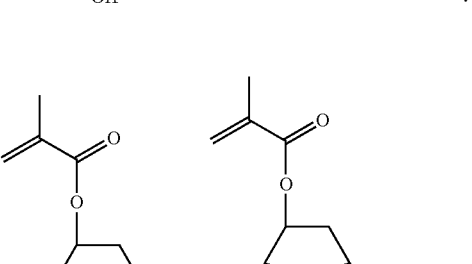
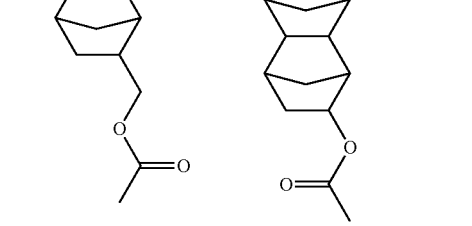
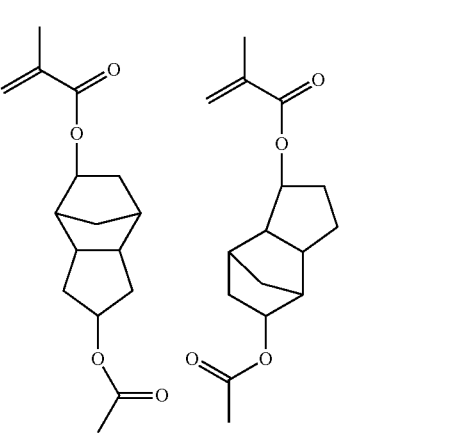

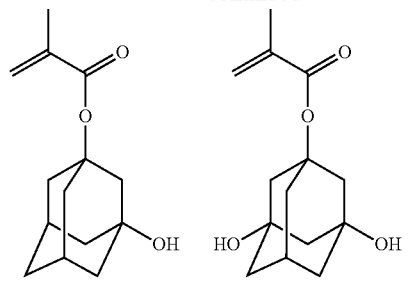
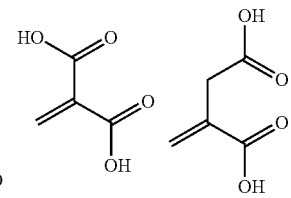
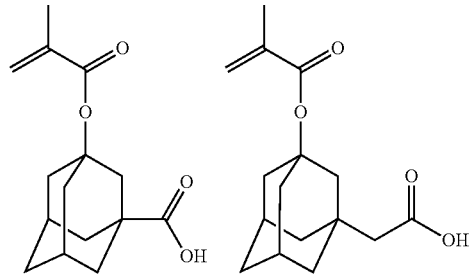
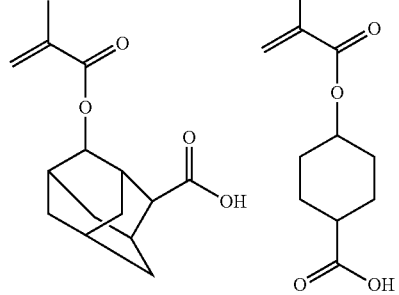
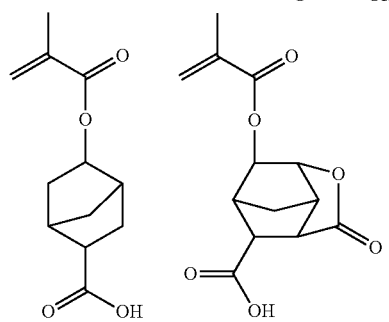
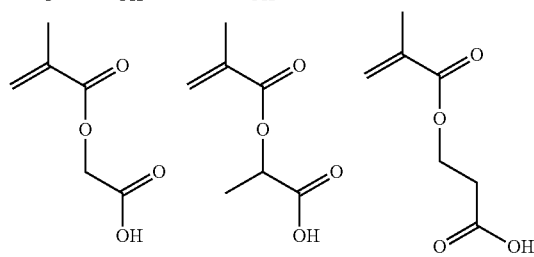
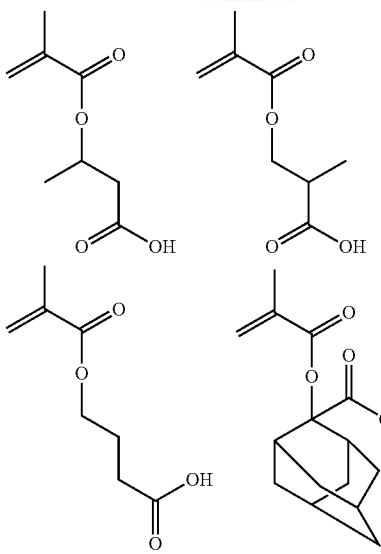
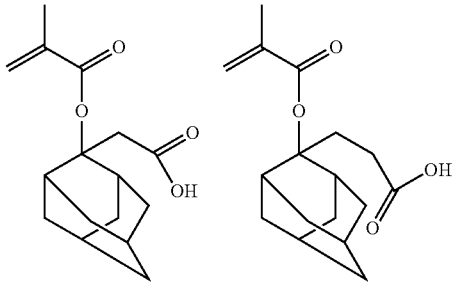
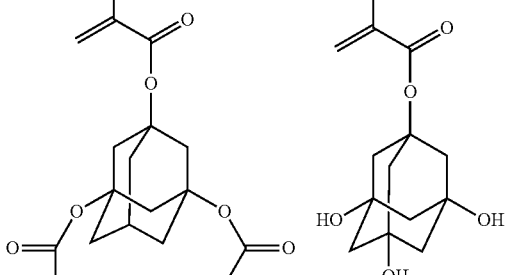
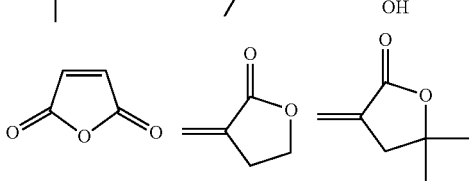
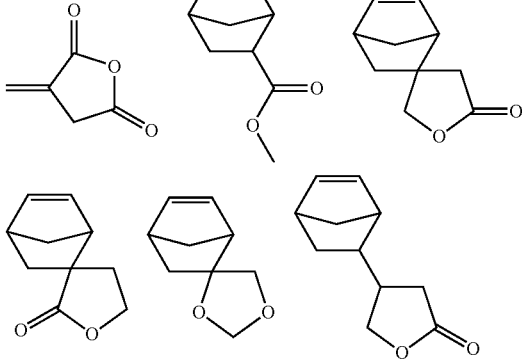

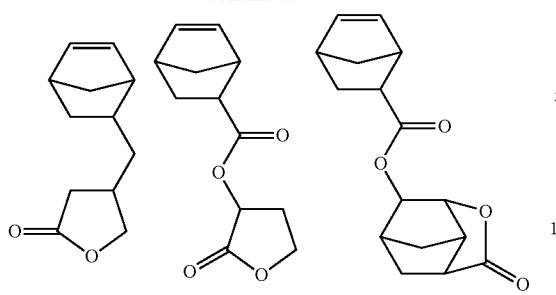
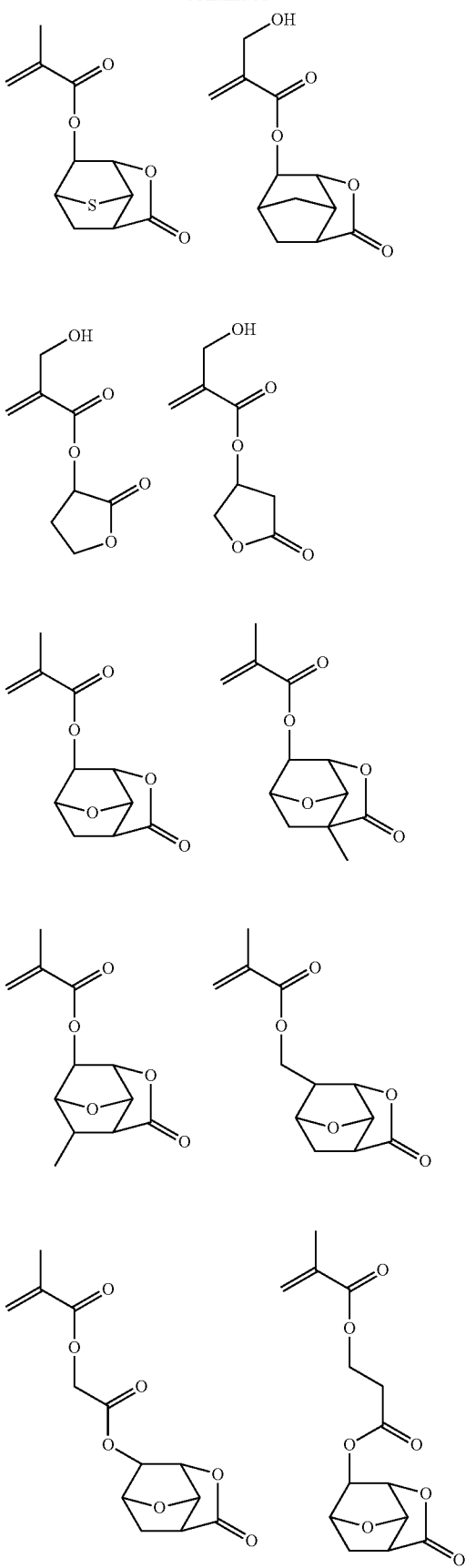

43
-continued
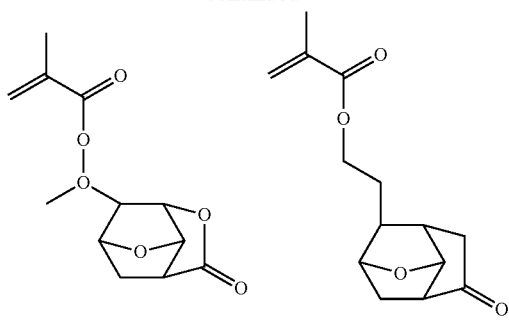
44
-continued
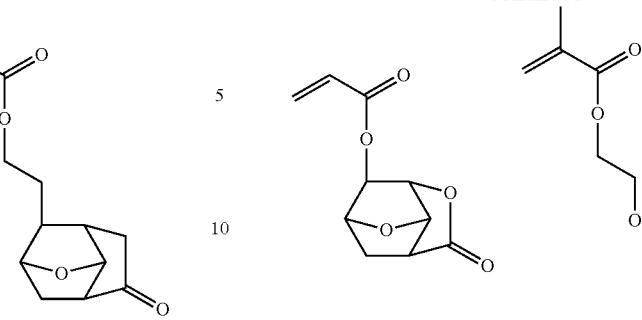

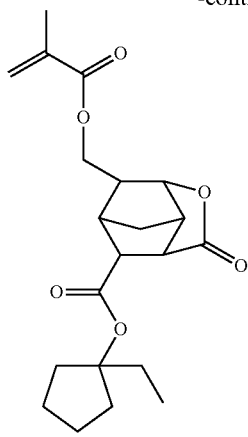
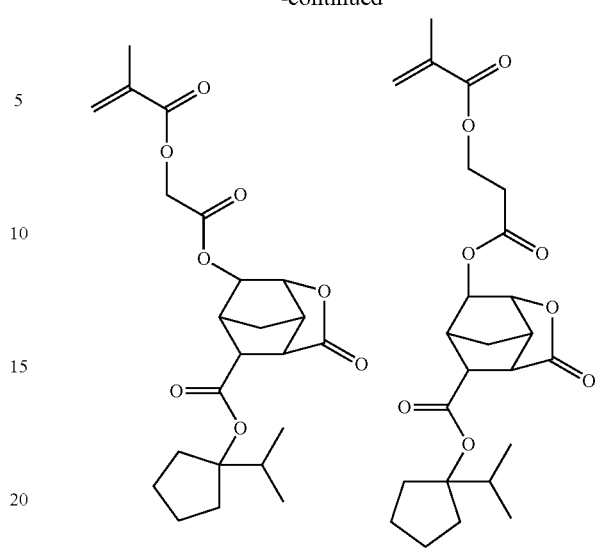
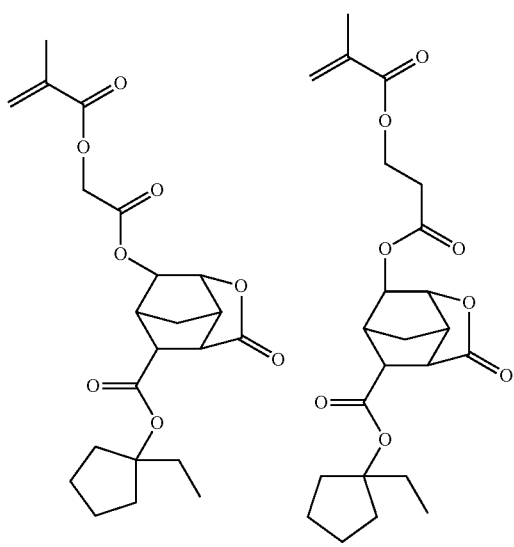
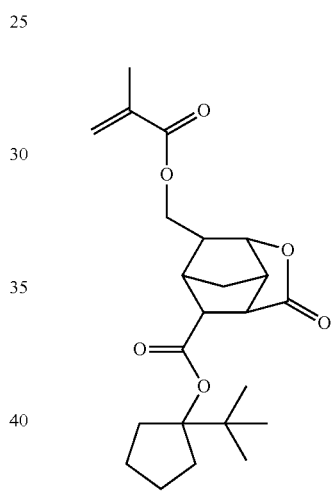
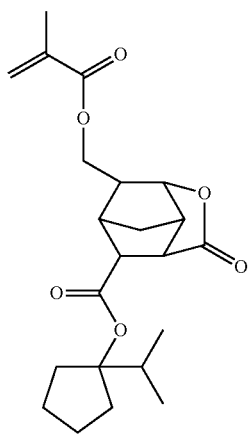
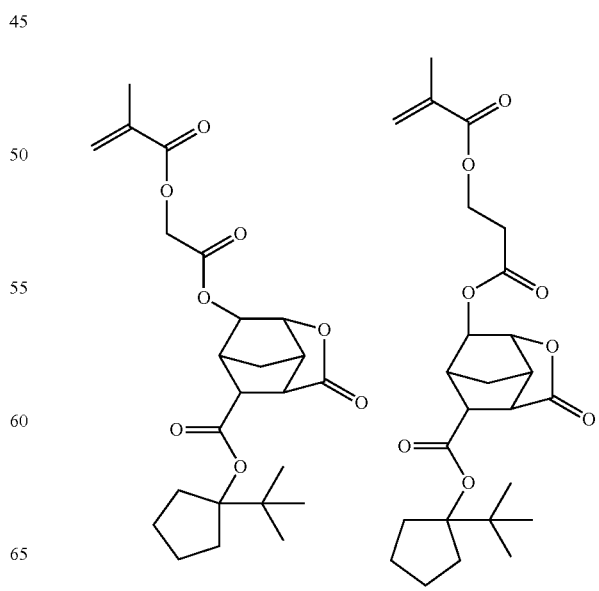

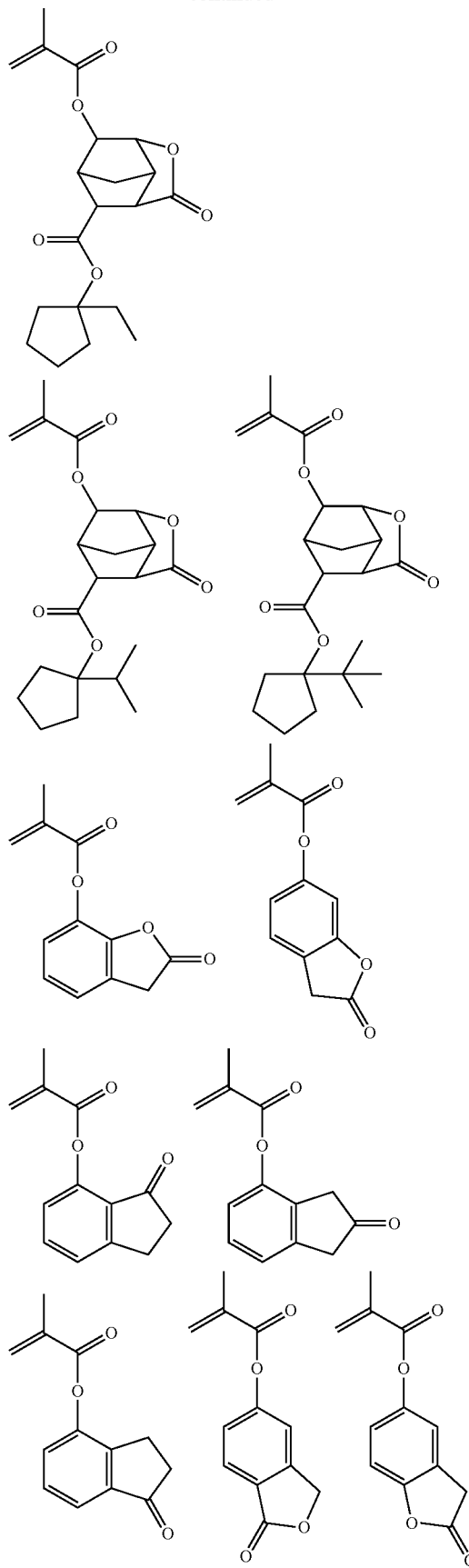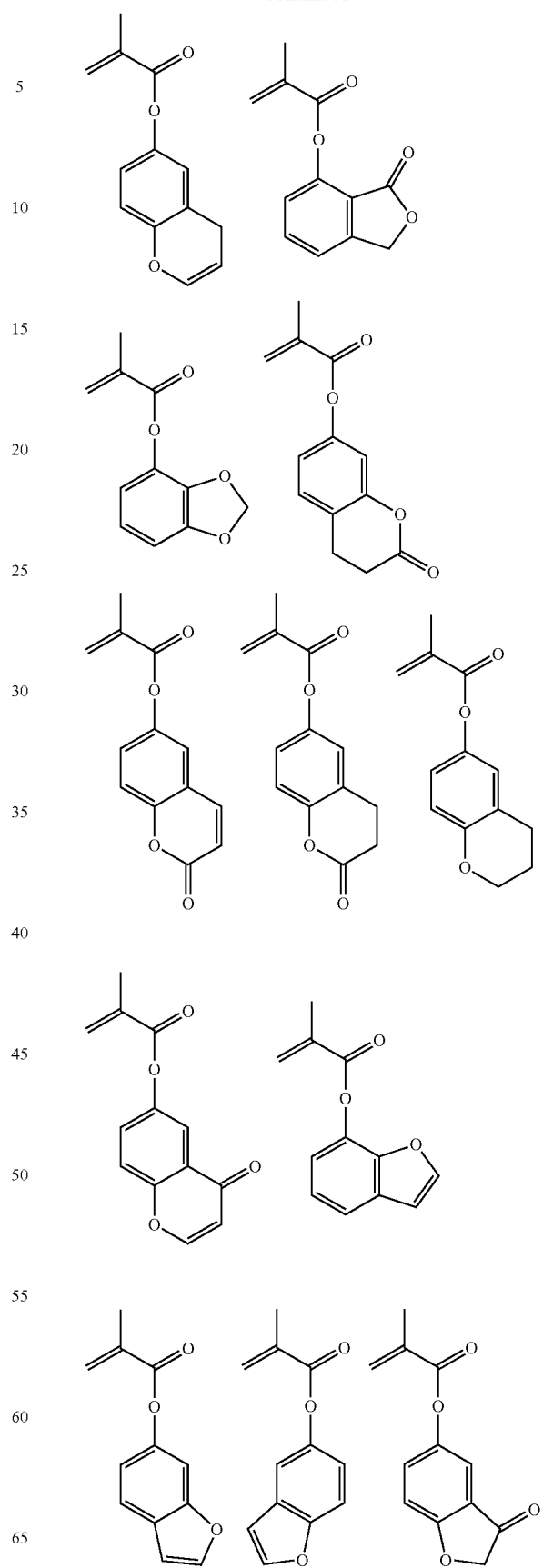

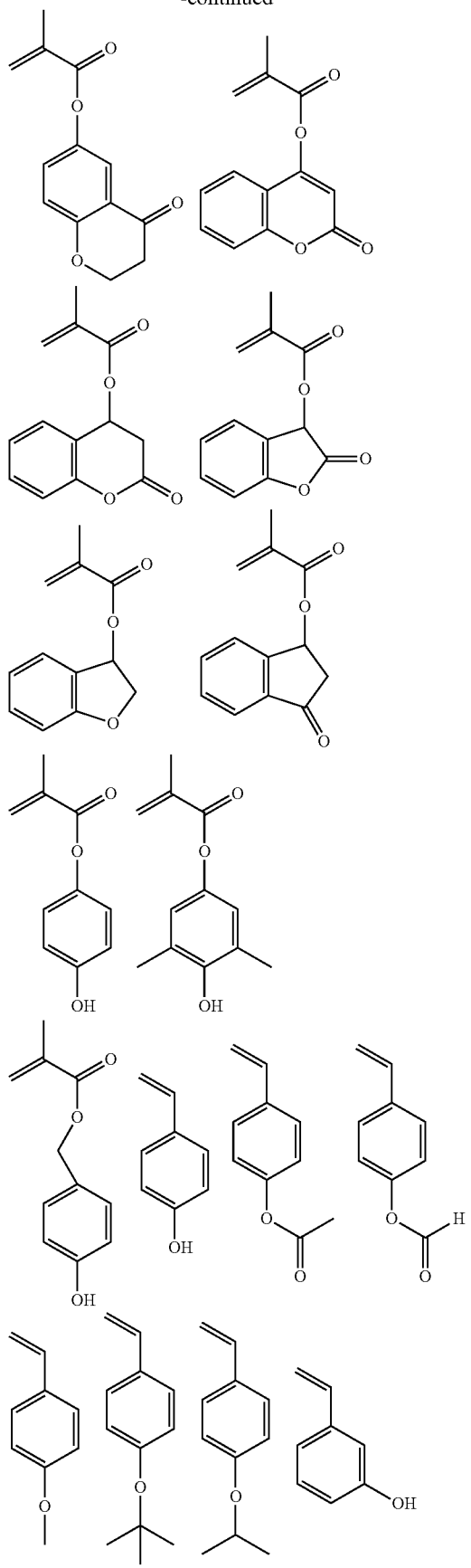
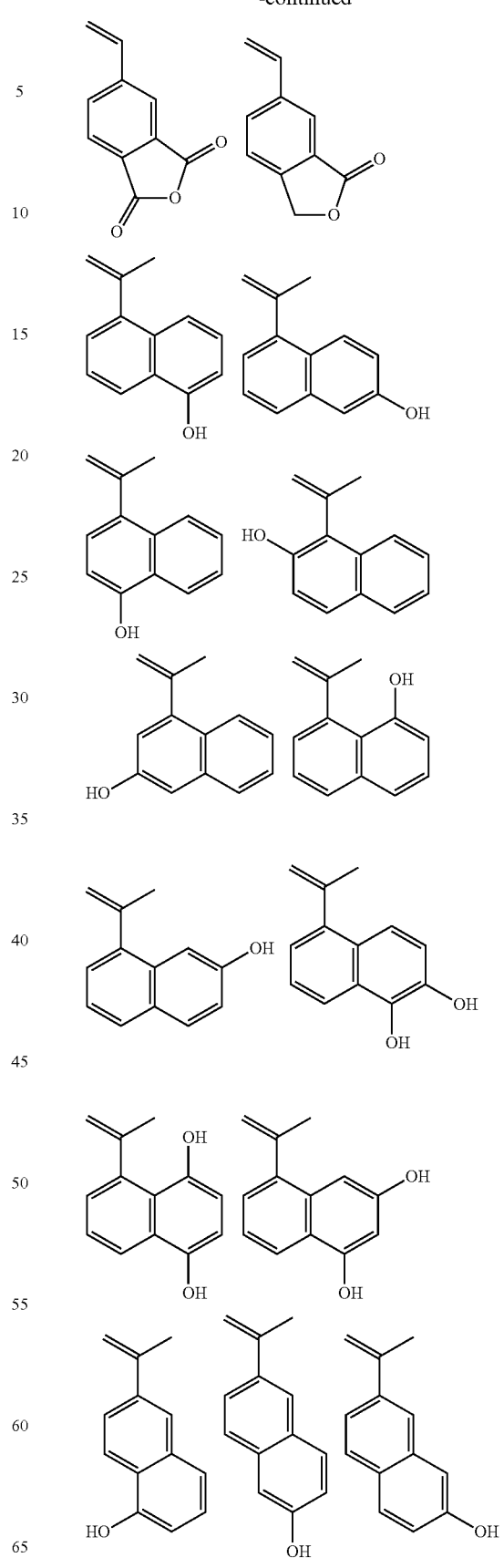

51
-continued
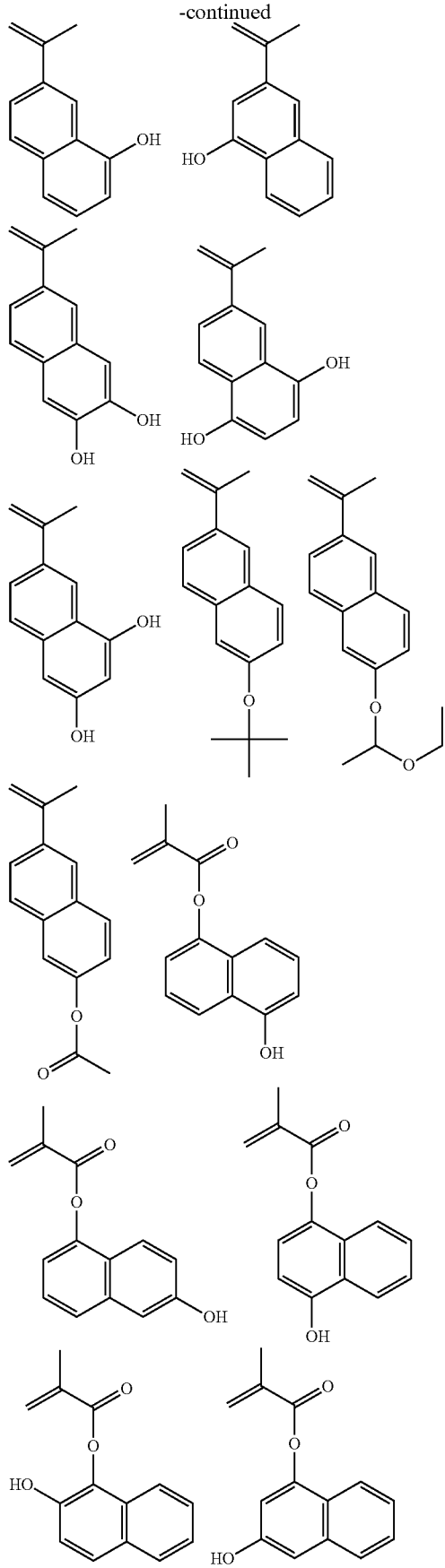
52
-continued
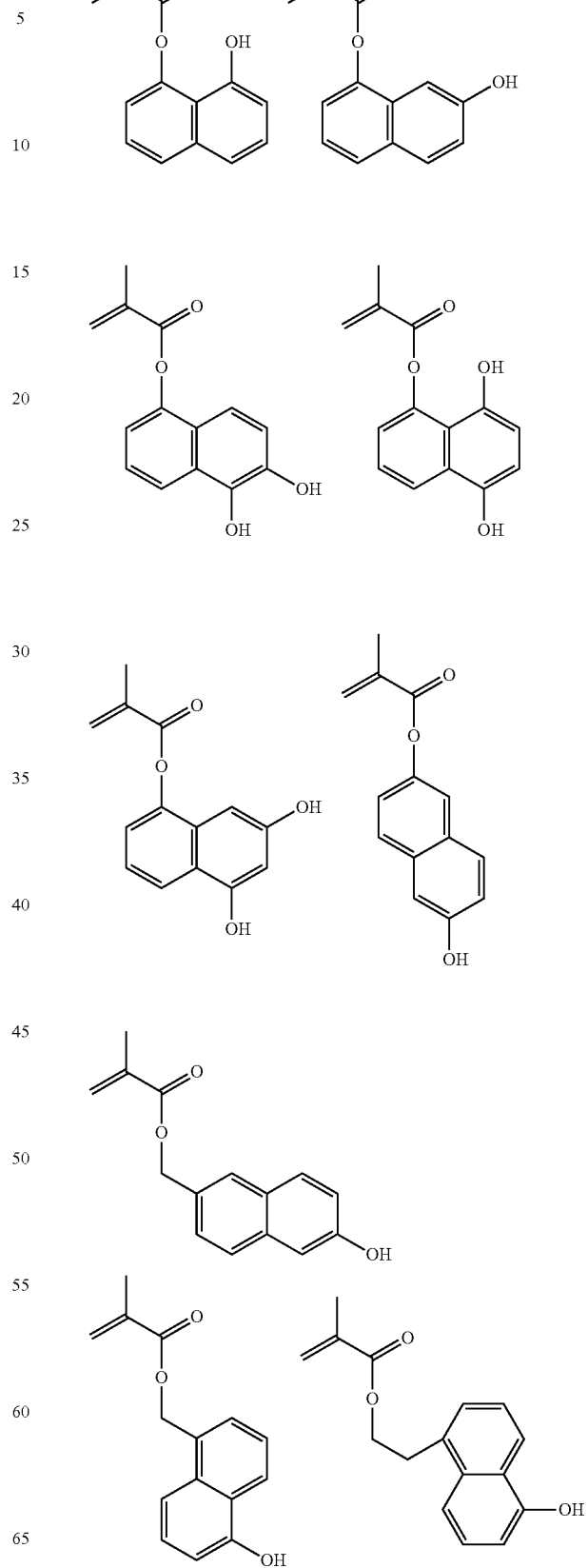

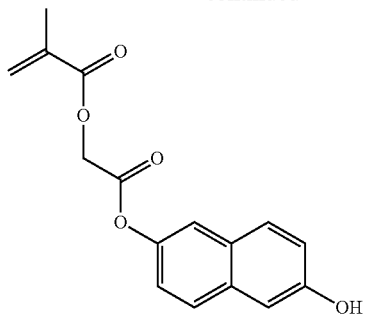
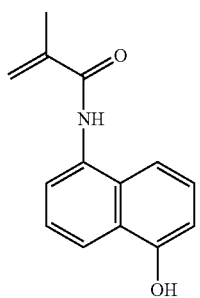
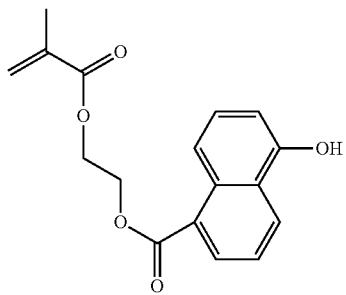
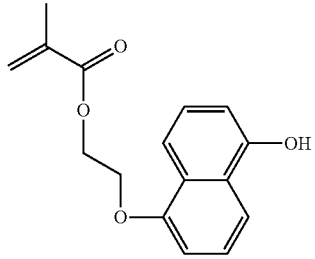
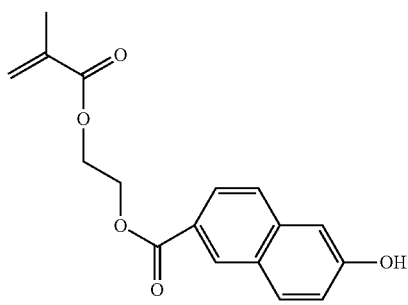
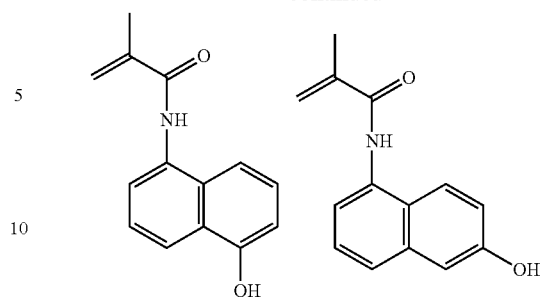
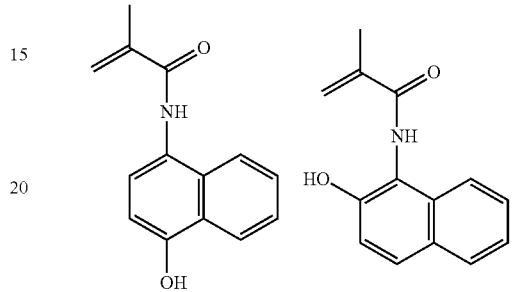
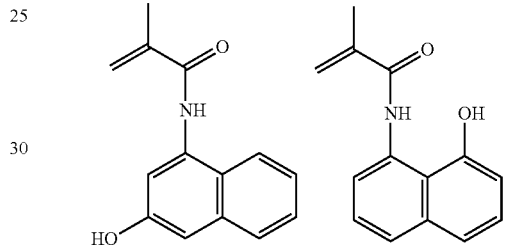
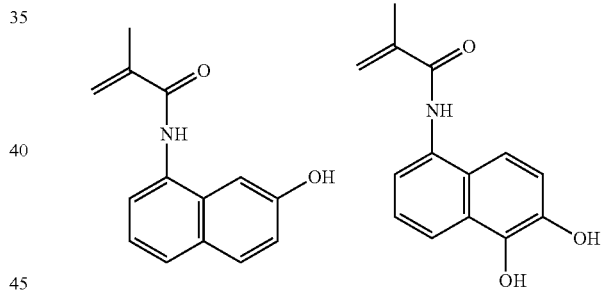
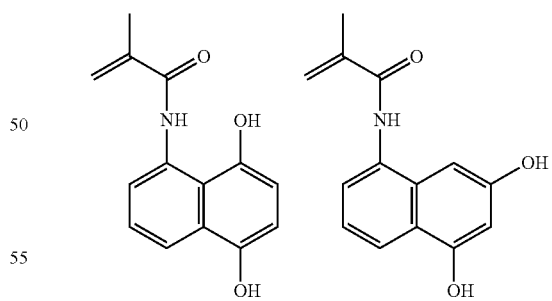
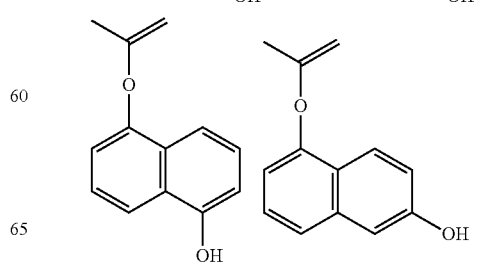

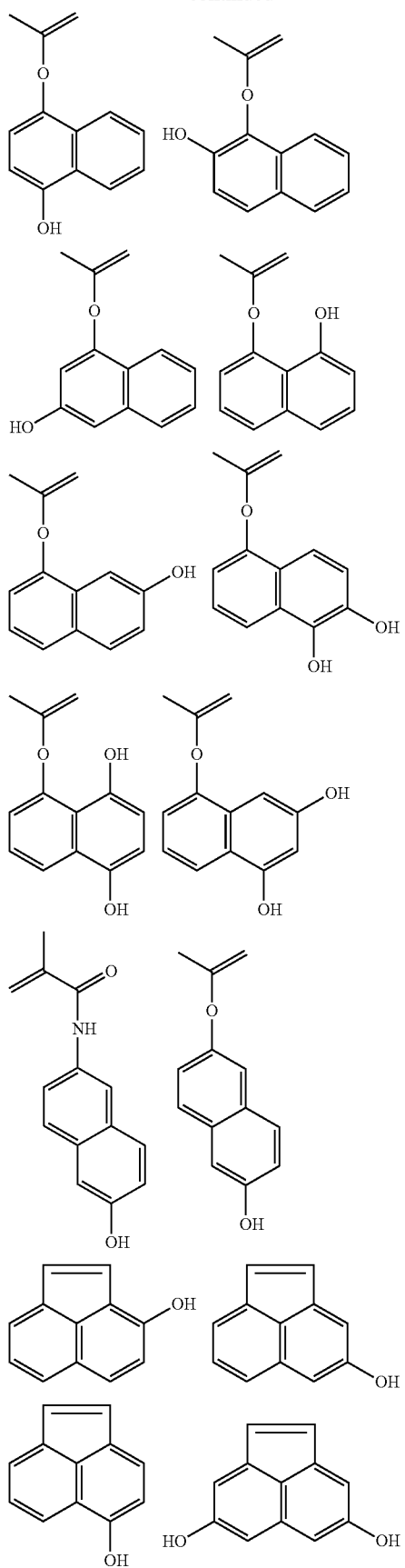
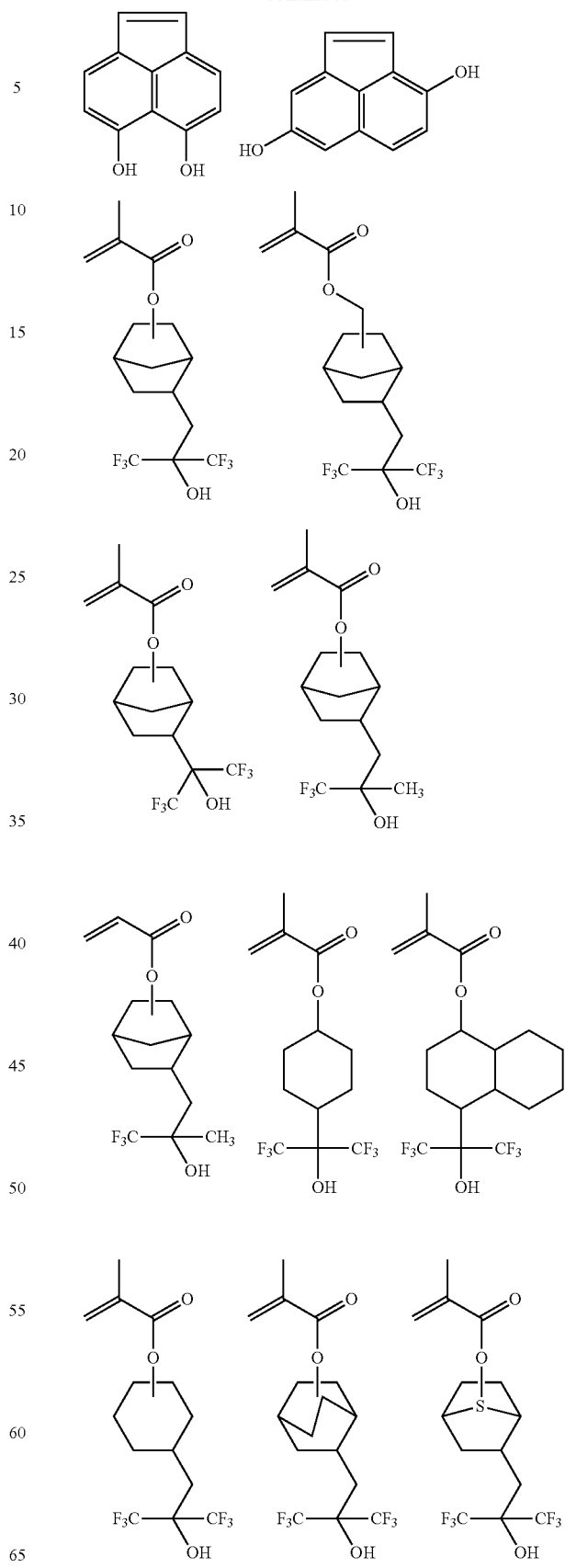

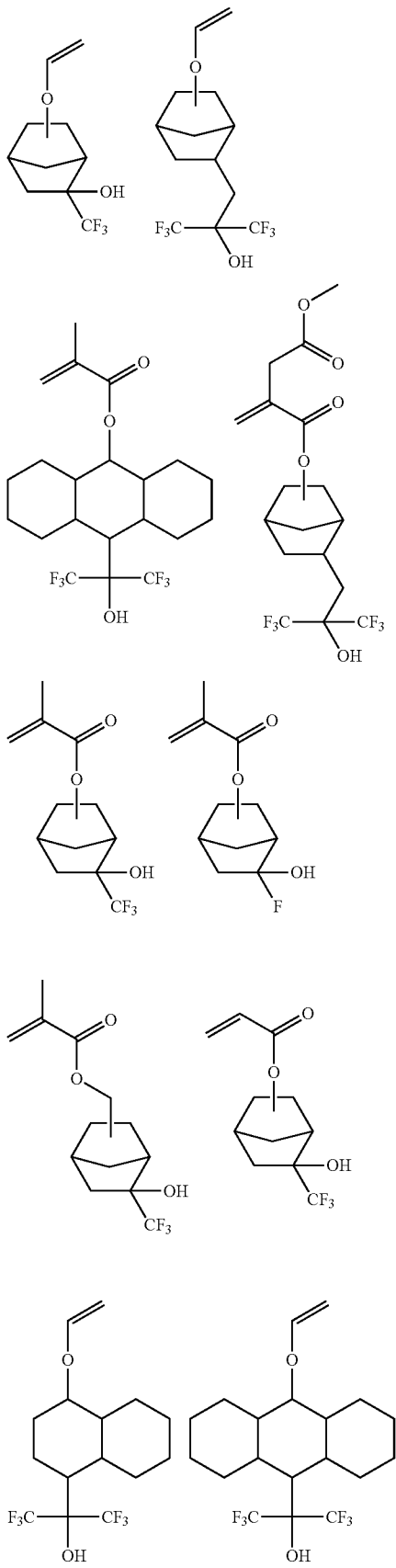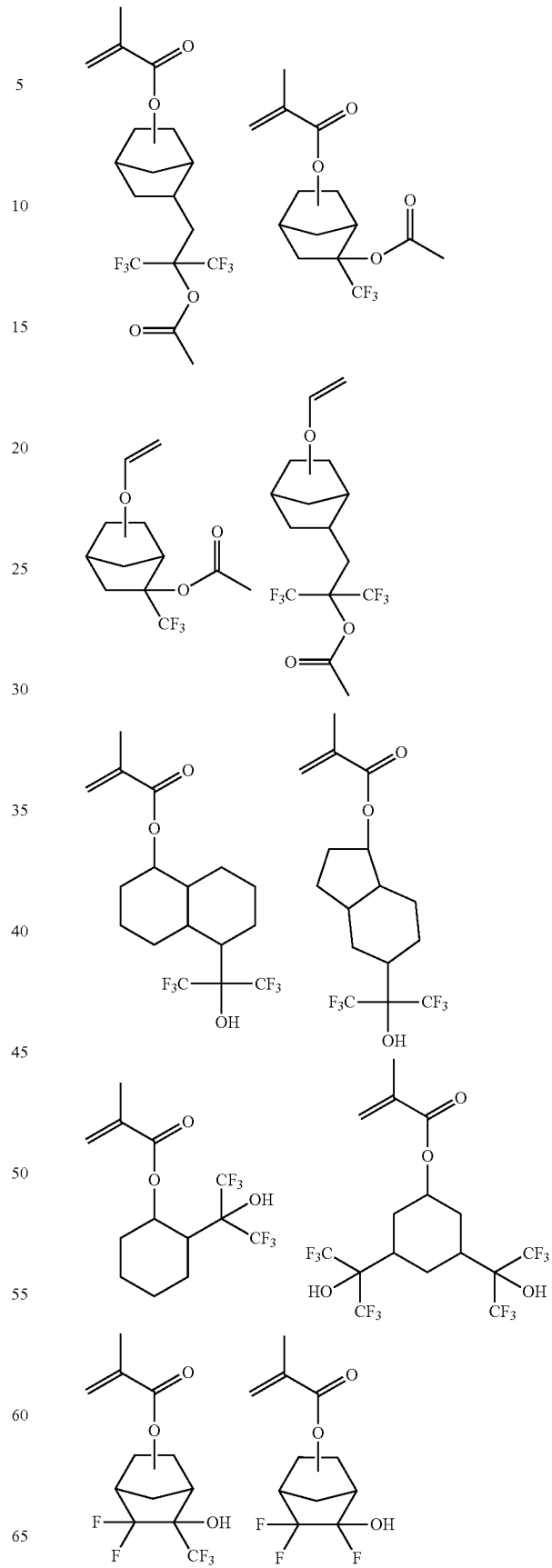

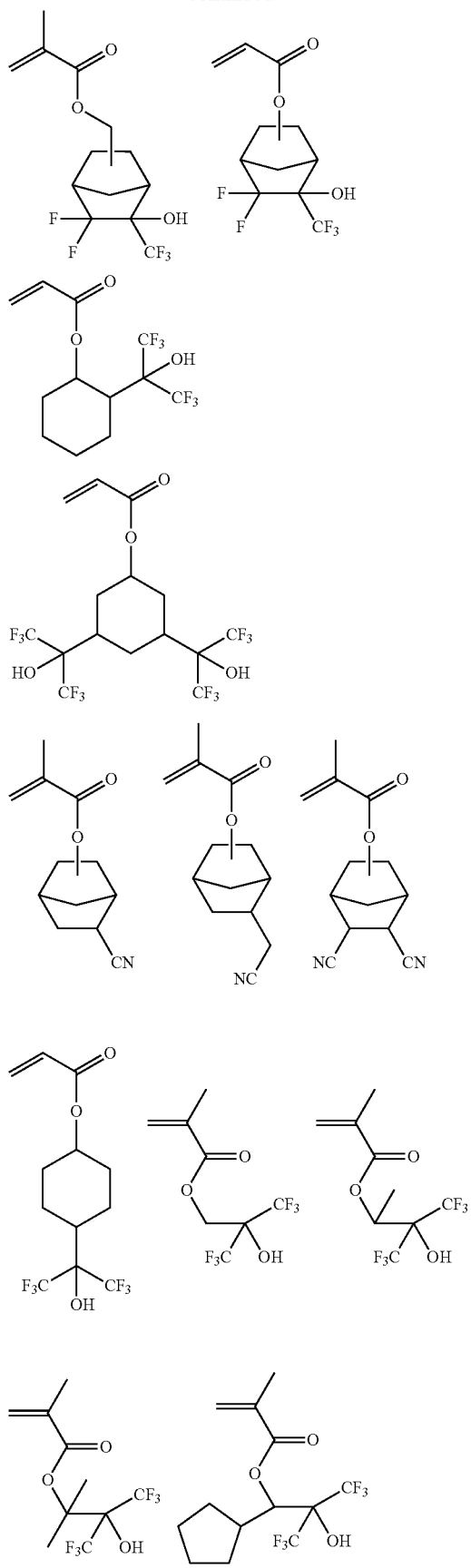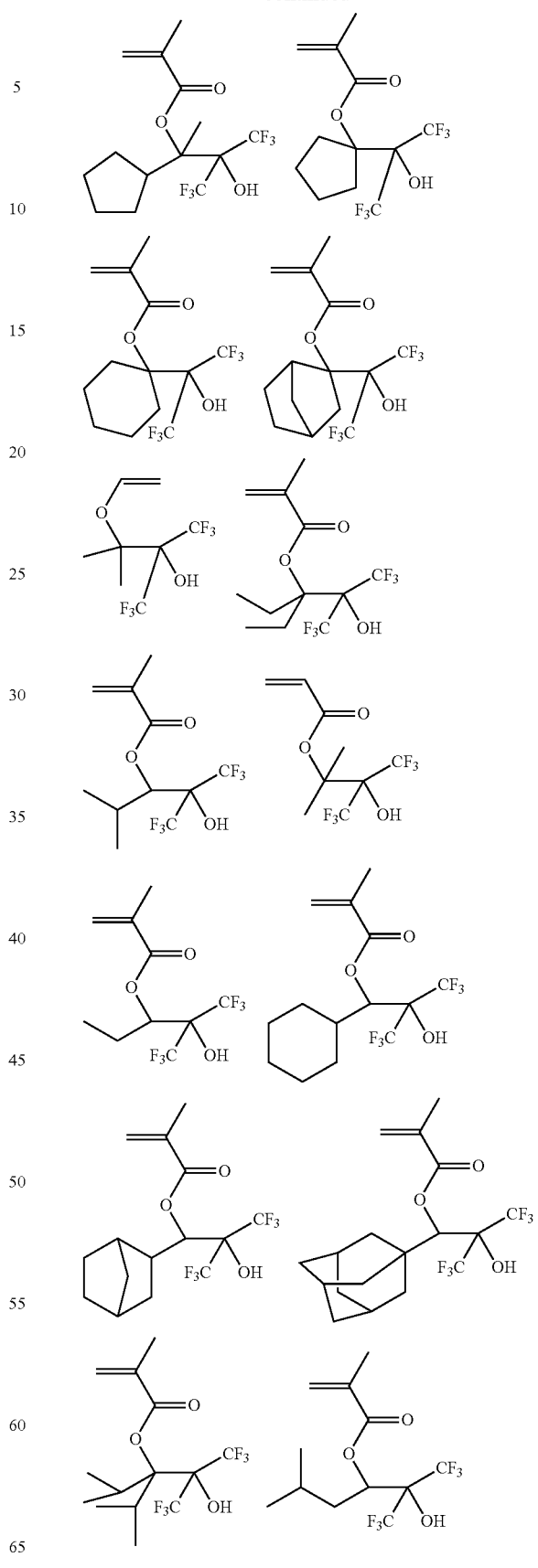

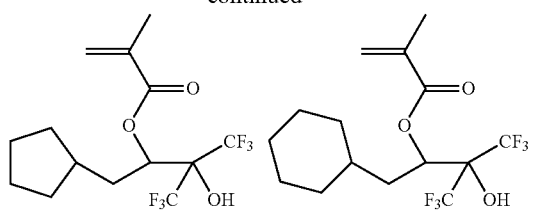
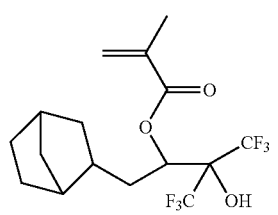
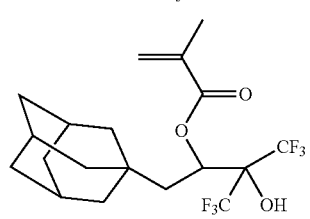
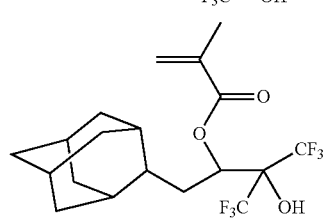
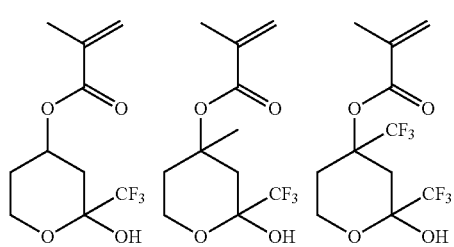
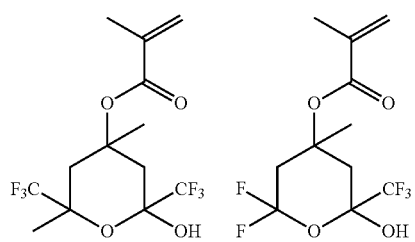
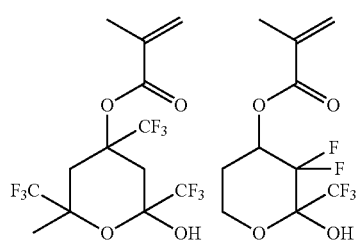
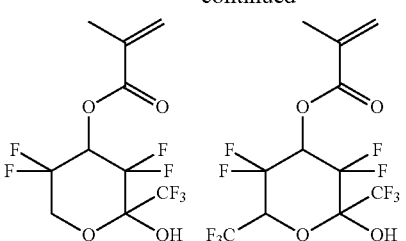
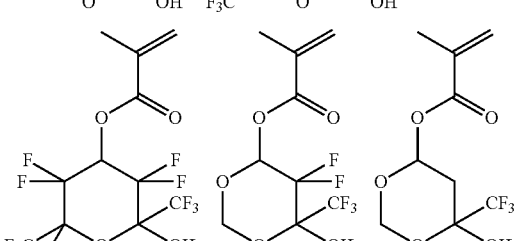
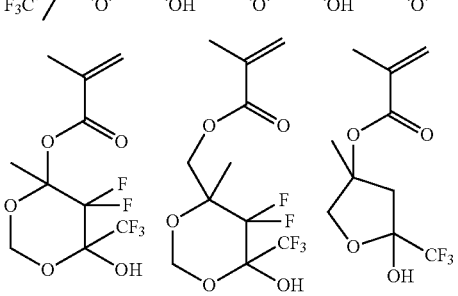
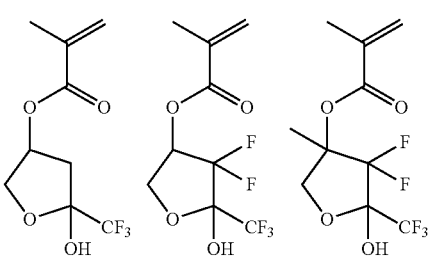
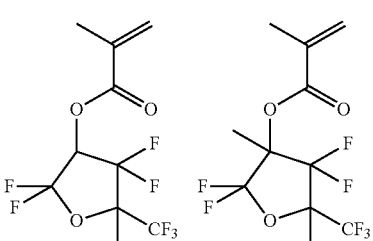
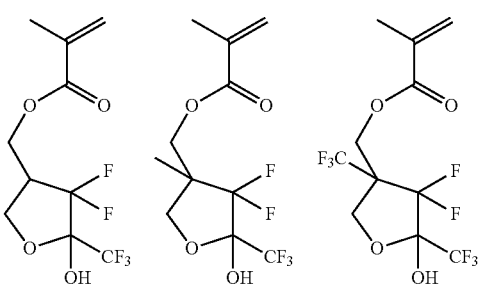

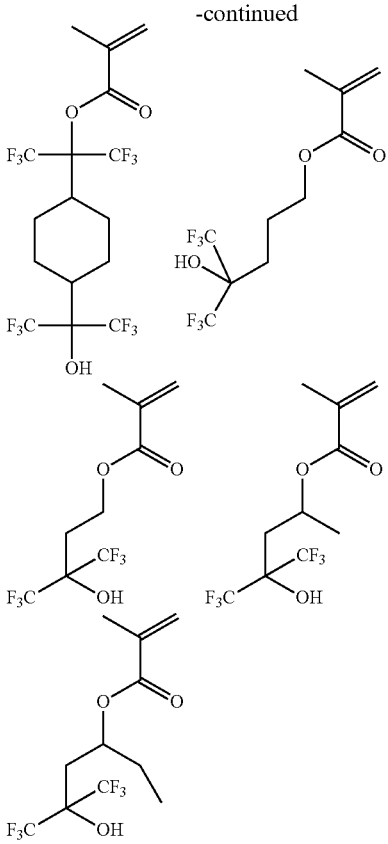

In a preferred embodiment, the polymer has further copolymerized therein units selected from sulfonium salts (d1) to (d3) represented by the general formulae below.

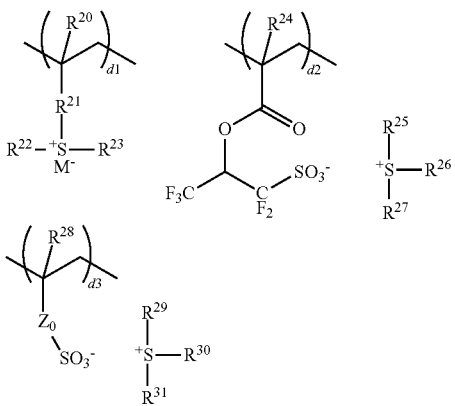

Herein $R^{20}$, $R^{24}$, and $R^{26}$ each are hydrogen or methyl. $R^{21}$ is a single bond, phenylene, —O—$R^{33}$—, or —C(=O)—Y—$R^{33}$— wherein Y is oxygen or NH, and $R^{33}$ is a straight, branched or cyclic $C_1$-$C_6$ alkylene group, alkenylene or phenylene group, which may contain a carbonyl (—CO—), ester (—COO—), ether (—O—) or hydroxyl radical. $R^{22}$, $R^{23}$, $R^{25}$, $R^{26}$, $R^{27}$, $R^{29}$, $R^{30}$, and $R^{31}$ are each independently a straight, branched or cyclic $C_1$-$C_{12}$ alkyl group which may contain a carbonyl, ester or ether radical, or a $C_6$-$C_{12}$ aryl, $C_7$-$C_{20}$ aralkyl, or thiophenyl group. $Z_0$ is a single bond, methylene, ethylene, phenylene, fluorophenylene, —O—$R^{32}$—, or —C(=O)—$Z_1$—$R^{32}$—, wherein $Z_1$ is oxygen or NH, and $R^{32}$ is a straight, branched or cyclic $C_1$-$C_6$ alkylene group, alkenylene or phenylene group, which may contain a carbonyl, ester, ether or hydroxyl radical. M is a non-nucleophilic counter ion. The subscripts d1, d2 and d3 are in the range: 0≤d1≤0.2, 0≤d2≤0.2, 0≤d3≤0.2, and 0≤d1+d2+d3≤0.3.

The subscripts a1, a2, b, c, d1, d2 and d3 indicative of proportions of corresponding recurring units are in the range: 0≤a1<1.0, 0≤a2<1.0, 0<b<1.0, 0<a1+a2<1.0, 0≤c<1.0, 0≤d1<0.2, 0≤d2<0.2, and 0≤d3<0.2; preferably 0≤a1≤0.8, 0≤a2≤0.8, 0.1≤b≤0.75, 0.1≤a1+a2≤0.8, 0≤c≤0.8, 0≤d1<0.15, 0≤d2<0.15, and 0≤d3<0.15, provided that a1+a2+b+c+d1+d2+d3=1.

It is noted that the meaning of a+b=1, for example, is that in a polymer comprising recurring units (a) and (b), the sum of recurring units (a) and (b) is 100 mol % based on the total amount of entire recurring units. The meaning of a+b<1 is that the sum of recurring units (a) and (b) is less than 100 mol % based on the total amount of entire recurring units, indicating the inclusion of other recurring units, for example, units (c).

The polymer serving as the base resin in the resist composition used in the pattern forming process of the invention should preferably have a weight average molecular weight (Mw) in the range of 1,000 to 500,000, and more preferably 2,000 to 30,000, as measured by GPC using polystyrene standards. With too low a Mw, film slimming is likely to occur upon organic solvent development. A polymer with too high a Mw may lose solubility in organic solvent and have a likelihood of footing after pattern formation.

If a polymer has a wide molecular weight distribution or dispersity (Mw/Mn), which indicates the presence of lower and higher molecular weight polymer fractions, there is a possibility that following exposure, foreign matter is left on the pattern or the pattern profile is exacerbated. The influences of molecular weight and dispersity become stronger as the pattern rule becomes finer. Therefore, the multi-component copolymer should preferably have a narrow dispersity (Mw/Mn) of 1.0 to 2.0, especially 1.0 to 1.5, in order to provide a resist composition suitable for micropatterning to a small feature size.

It is acceptable to use a blend of two or more polymers which differ in compositional ratio, molecular weight or dispersity as well as a blend of an inventive polymer and another polymer free of an acid labile group-substituted hydroxyl group.

A blend of a polymer comprising recurring units having a hydroxyl group substituted with an acid labile group with a polymer comprising recurring units having a carboxyl group substituted with an acid labile group is acceptable. Also acceptable is a blend of a polymer comprising both recurring units having a hydroxyl group substituted with an acid labile group and recurring units having a carboxyl group substituted with an acid labile group with a polymer comprising recurring units having a hydroxyl group substituted with an acid labile group, or a polymer comprising recurring units having a carboxyl group substituted with an acid labile group.

The polymer as used herein may be synthesized by any desired method, for example, by dissolving unsaturated bond-containing monomers corresponding to the respective units (a1), (a2), (b), (c), (d1), (d2), and (d3) in an organic solvent, adding a radical initiator thereto, and effecting heat polymerization. Examples of the organic solvent which can be used for polymerization include toluene, benzene, tetrahydrofuran, diethyl ether and dioxane. Examples of the polymerization initiator used herein include 2,2'-azobisisobutyronitrile (AIBN), 2,2'-azobis(2,4-dimethyl-valeronitrile), dimethyl 2,2-azobis(2-methylpropionate), benzoyl peroxide, and lauroyl peroxide. Preferably the system is heated at 50 to 80° C. for polymerization to take place. The reaction time is 2 to 100 hours, preferably 5 to 20 hours. The acid labile group that has been incorporated in the monomers may be kept as such, or the acid labile group may be once eliminated with an acid catalyst and after polymerization, introduced for protection or partial protection.

As described previously, the pattern forming process of the invention comprises the steps of coating the positive resist composition defined above onto a substrate, prebaking the resist composition to form a resist film, exposing a selected region of the resist film to high-energy radiation, post-exposure baking, and developing the exposed resist film with an organic solvent developer so that the unexposed region of film is dissolved (negative development) and with an alkaline aqueous solution developer so that the exposed region of film is dissolved (positive development), thereby forming a resist pattern in which each line is divided into two lines.

The resist composition used in the pattern forming process of the invention may further comprise an organic solvent, a compound capable of generating an acid in response to high-energy radiation (known as "acid generator"), and optionally, a dissolution regulator, basic compound, surfactant, acetylene alcohol, and other components.

The resist composition used herein may include an acid generator in order for the composition to function as a chemically amplified positive resist composition. Typical of the acid generator used herein is a photoacid generator (PAG) capable of generating an acid in response to actinic light or radiation. The PAG may preferably be compounded in an amount of 0.5 to 30 parts and more preferably 1 to 20 parts by weight per 100 parts by weight of the base resin. The PAG is any compound capable of generating an acid upon exposure to high-energy radiation. Suitable PAGs include sulfonium salts, iodonium salts, sulfonyldiazomethane, N-sulfonyloxyimide, and oxime-O-sulfonate acid generators. The PAGs may be used alone or in admixture of two or more.

Exemplary acid generators are described in U.S. Pat. No. 7,537,880 (JP-A 2008-111103, paragraphs [0122] to [0142]). The acid generator may be separately added to the composition by blending it, or introduced into the polymer by copolymerizing units (a1), (a2) and (b) with units (d1) to (d3). Where the polymer has a polymerizable acid generator unit selected from recurring units (d1), (d2) and (d3) copolymerized therein, the acid generator need not necessarily be added.

Examples of the organic solvent used herein are described in JP-A 2008-111103, paragraphs [0144] to [0145] (U.S. Pat. No. 7,537,880). Specifically, exemplary solvents include ketones such as cyclohexanone and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone, and mixtures thereof. Exemplary basic compounds include primary, secondary and tertiary amine compounds, specifically amine compounds having a hydroxyl, ether, ester, lactone, cyano or sulfonate group, as described in JP-A 2008-111103, paragraphs [0146] to [0164], and compounds having a carbamate group, as described in JP 3790649. Exemplary surfactants are described in JP-A 2008-111103, paragraphs [0165] to [0166]. Exemplary dissolution regulators are described in JP-A 2008-122932 (US 2008090172), paragraphs [0155] to [0178], and exemplary acetylene alcohols in paragraphs [0179] to [0182].

Also a polymeric additive may be added for improving the water repellency on surface of a resist film as spin coated. This additive may be used in the topcoatless immersion lithography. These additives have a specific structure with a 1,1,1,3, 3,3-hexafluoro-2-propanol residue and are described in JP-A 2007-297590, 2008-111103, 2008-122932, 2009-98638, and 2009-276363. The water repellency improver to be added to the resist should be soluble in the organic solvent as the developer. The water repellency improver of specific structure with a 1,1,1,3,3,3-hexafluoro-2-propanol residue is well soluble in the developer. A polymer having an amino group or amine salt copolymerized as recurring units may serve as the water repellent additive and is effective for preventing evaporation of acid during PEB and avoiding any hole pattern opening failure after development. A water repellent polymer having an amino group copolymerized therein, suited for use in resist compositions is described in JP-A 2009-31767, a copolymer having a sulfonic acid amine salt copolymerized in JP-A 2008-107443, and a copolymer having a carboxylic acid amine salt copolymerized in JP-A 2008-239918. An appropriate amount of the water repellent agent is 0.1 to 20 parts, preferably 0.5 to 10 parts by weight per 100 parts by weight of the base resin.

Notably, an appropriate amount of the organic solvent is 100 to 10,000 parts, preferably 300 to 8,000 parts by weight, and an appropriate amount of the basic compound is 0.0001 to 30 parts, preferably 0.001 to 20 parts by weight, per 100 parts by weight of the base resin.

Process

Now referring to the drawings, the pattern forming process of the invention is illustrated in FIG. 1. First, the positive resist composition is coated on a substrate to form a resist film thereon. Specifically, a resist film 40 of a positive resist composition is formed on a processable substrate 20 disposed on a substrate 10 directly or via an intermediate intervening layer 30 as shown in FIG. 1A. The resist film preferably has a thickness of 10 to 1,000 nm and more preferably 20 to 500 nm. Prior to exposure, the resist film is heated or prebaked, preferably at a temperature of 60 to 180° C., especially 70 to 150° C. for a time of 10 to 300 seconds, especially 15 to 200 seconds.

The substrate 10 used herein is generally a silicon substrate. The processable substrate (or target film) 20 used herein includes $SiO_2$, SiN, SiON, SiOC, p-Si, a-Si, TiN, WSi, BPSG, SOG, Cr, CrO, CrON, MoSi, low dielectric film, and etch stopper film. The intermediate intervening layer 30 includes hard masks of $SiO_2$, SiN, SiON or p-Si, an undercoat in the form of carbon film, a silicon-containing intermediate film, and an organic antireflective coating.

Next comes exposure depicted at 50 in FIG. 1B. For the exposure, preference is given to high-energy radiation having a wavelength of 140 to 250 nm and EUV having a wavelength of 13.5 nm, and especially ArF excimer laser radiation of 193 nm. The exposure may be done either in a dry atmosphere such as air or nitrogen stream or by immersion lithography in water. The ArF immersion lithography uses deionized water or liquids having a refractive index of at least 1 and highly transparent to the exposure wavelength such as alkanes as the immersion solvent. The immersion lithography involves prebaking a resist film and exposing the resist film to light through a projection lens, with water or liquid introduced between the resist film and the projection lens. Since this allows lenses to be designed to a NA of 1.0 or higher, formation of finer feature size patterns is possible. The immersion lithography is important for the ArF lithography to survive to the 45-nm node. In the case of immersion lithography, deionized water rinsing (or post-soaking) may be carried out after exposure for removing water droplets left on the resist film, or a protective film may be applied onto the resist film after pre-baking for preventing any leach-out from the resist film and improving water slip on the film surface.

The resist protective film used in the immersion lithography is preferably formed from a solution of a polymer having 1,1,1,3,3,3-hexafluoro-2-propanol residues which is insoluble in water, but soluble in an alkaline developer liquid, in a solvent selected from alcohols of at least 4 carbon atoms, ethers of 8 to 12 carbon atoms, and mixtures thereof. The protective film-forming composition used herein may be based on a polymer comprising recurring units derived from a monomer having a 1,1,1,3,3,3-hexafluoro-2-propanol residue. While the protective film must dissolve in the organic solvent developer, the polymer comprising recurring units derived from a monomer having a 1,1,1,3,3,3-hexafluoro-2-propanol residue dissolves in the aforementioned organic solvent developers. In particular, protective film-forming materials having 1,1,1,3,3,3-hexafluoro-2-propanol residues as described in JP-A 2007-025634, 2008-003569, 2008-081716, and 2008-111089 readily dissolve in organic solvent developers.

After formation of the photoresist film, deionized water rinsing (or post-soaking) may be carried out for extracting the acid generator and the like from the film surface or washing away particles. Alternatively, after exposure, rinsing (or post-soaking) may be carried out for removing water droplets left on the resist film.

Exposure is preferably performed in an exposure dose of about 1 to 200 mJ/cm$^2$, more preferably about 10 to 100 mJ/cm$^2$. This is followed by baking (PEB) on a hot plate at 60 to 150° C. for 1 to 5 minutes, preferably at 80 to 120° C. for 1 to 3 minutes.

Thereafter the exposed resist film is developed with an organic solvent as developer for 0.1 to 3 minutes, preferably 0.5 to 2 minutes by any conventional techniques such as dip, puddle and spray techniques. In this way, the unexposed region of resist film is dissolved away, leaving a negative resist pattern 40$a$ on the substrate 10 as shown in FIG. 1C. The developer used herein is an organic solvent selected from among ketones such as 2-octanone, 2-nonanone, 2-heptanone, 3-heptanone, 4-heptanone, 2-hexanone, 3-hexanone, diisobutyl ketone, methylcyclohexanone, acetophenone, and methylacetophenone, and esters such as propyl acetate, butyl acetate, isobutyl acetate, amyl acetate, butenyl acetate, isoamyl acetate, phenyl acetate, propyl formate, butyl formate, isobutyl formate, amyl formate, isoamyl formate, methyl valerate, methyl pentenoate, methyl crotonate, ethyl crotonate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate. These solvents may be used alone or in admixture of two or more. Suitable organic solvents which can be used alone include 2-heptanone, butyl acetate and isobutyl formate. If 2-octanone or amyl acetate is used as the ketone or ester having a greater carbon count than the foregoing solvents, the solubility of the unexposed region therein may be low. If the solubility of the unexposed region in a certain solvent is low, another solvent providing a high solubility of the unexposed region is blended. Specifically, solubility may be adjusted by blending an appropriate amount of 2-hexanone, 3-hexanone, propyl acetate, butyl formate and ethyl lactate which are the ketones or esters having a less carbon count than 2-heptanone, butyl acetate and isobutyl formate, because these solvents providing a high solubility of the unexposed region.

At the end of development, the resist film is rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents.

Specifically, suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. Suitable alcohols of 3 to 10 carbon atoms include n-propyl alcohol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-sec-butyl ether, di-n-pentyl ether, diisopentyl ether, di-sec-pentyl ether, di-t-amyl ether, and di-n-hexyl ether. Suitable aromatic solvents include toluene, xylene, ethylbenzene, isopropylbenzene, t-butylbenzene, and mesitylene. The solvents may be used alone or in admixture.

Further the resist film is developed with a developer in the form of an alkaline aqueous solution for 0.1 to 3 minutes, preferably 0.2 to 2 minutes by conventional techniques such as dip, puddle or spray techniques, obtaining a positive resist pattern 40$a$ as shown in FIG. 1D.

Suitable alkaline aqueous solutions as developer are 0.1 to 10 wt % aqueous solutions of tetramethylammonium hydroxide (TMAH), tetraethylammonium hydroxide (TEAH), tetrapropylammonium hydroxide (TPAH), tetrabutylammonium hydroxide (TBAH), choline hydroxide, morpholines, and piperidines.

The development may be followed by rinsing. The rinse liquid used herein is preferably water while an alcohol or surfactant may be added to the rinse liquid.

It is noted that the order of positive development with alkaline water and negative development with organic solvent is not particularly limited.

Also notably, PEB may be inserted between positive development with alkaline water and negative development with organic solvent. To enable pattern division by positive development with alkaline water and negative development with organic solvent, a sensitivity difference must be established between the positive development with alkaline water and the negative development with organic solvent. In general, the resist composition in which both hydroxyl and carboxyl groups are substituted with acid labile groups according to the invention is effective for establishing a sensitivity difference between positive development and negative development. However, if this sensitivity difference is not sufficient, it is effective to carry out PEB between two developments to increase the sensitivity difference. Notably, double PEB's have the risk of enhancing acid diffusion and hence, reducing resolution.

FIG. 2 illustrates an optical image of a 44-nm line-and-space pattern produced under conditions: NA 1.35 lens, dipole illumination, and 6% halftone phase shift mask and a cross-sectional profile of a pattern of a prior art positive resist after development. A positive pattern is formed in which low exposure dose regions are left and high exposure dose regions are dissolved away.

Figure 3:
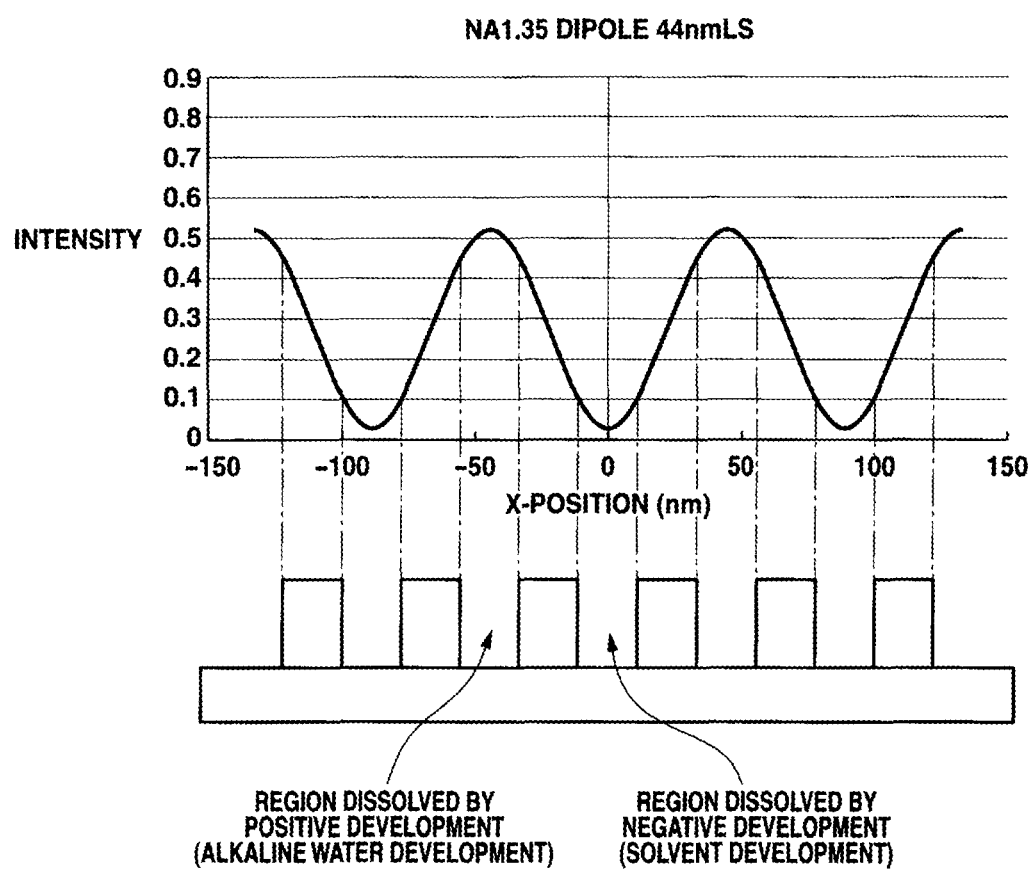
FIG. 3 illustrates an optical image of a 44-nm line-and-space pattern produced under conditions: NA 1.35 lens, dipole illumination, and 6% halftone phase shift mask and a cross-sectional profile of a pattern of an inventive photoresist composition after negative development with organic solvent and positive development with alkaline aqueous solution.

FIG. 3 illustrates an optical image of a 44-nm line-and-space pattern produced under conditions: NA 1.35 lens, dipole illumination, and 6% halftone phase shift mask and a cross-sectional profile of a pattern of an inventive photoresist composition after negative development with organic solvent and positive development with alkaline aqueous solution. Low exposure dose regions are dissolved away in the organic solvent, high exposure dose regions are dissolved away in the alkaline water, and moderate exposure dose regions are left as a pattern.

In this regard, a ratio of the sensitivity of the resist turning positive with alkaline aqueous solution to the sensitivity of the resist turning negative with organic solvent is important.

Figure 4:
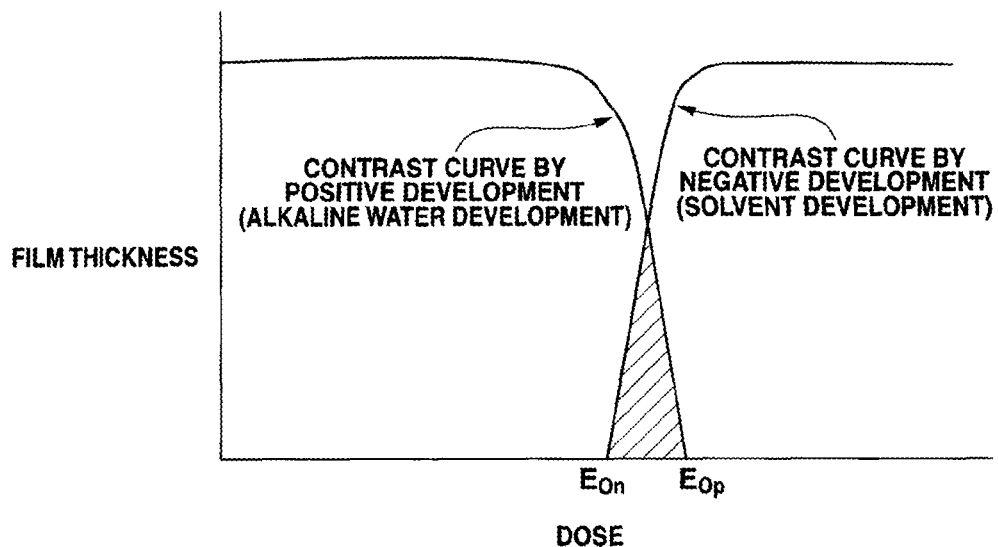
FIG. 4 illustrates a relationship of exposure dose to resist film thickness of a prior art resist composition after negative development with organic solvent and positive development with alkaline aqueous solution.

FIG. 4 illustrates a relationship of exposure dose to resist film thickness of a prior art resist composition after negative development with organic solvent and positive development with alkaline aqueous solution. A pattern of exposed region is left in the shaded area. Due to little difference between the positive toning sensitivity $E_{Op}$ and the negative toning sensitivity $E_{On}$, little pattern is left after two developments.

Figure 5:
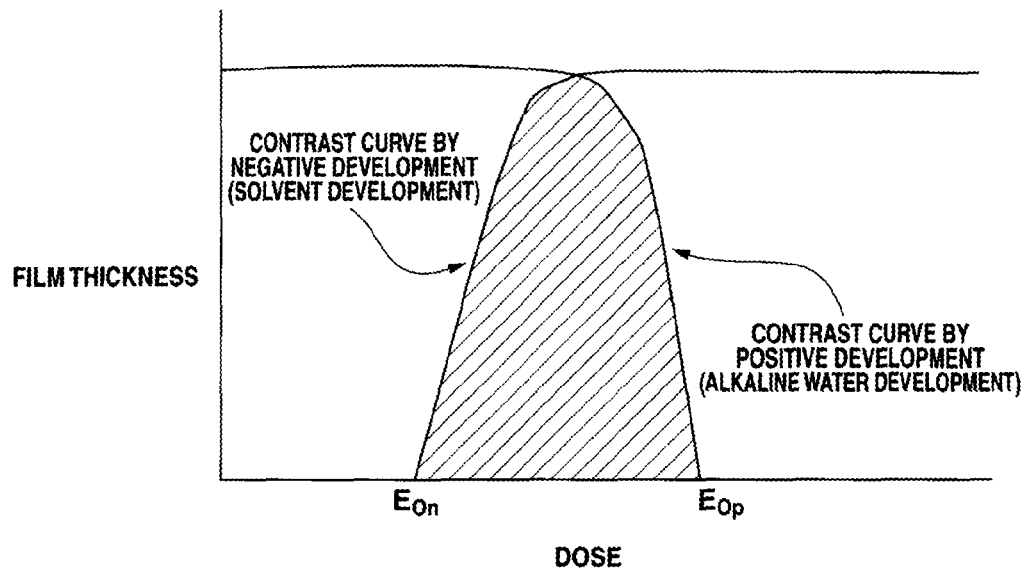
FIG. 5 illustrates a relationship of exposure dose to resist film thickness of an inventive resist composition after negative development with organic solvent and positive development with alkaline aqueous solution.

FIG. 5 illustrates a relationship of exposure dose to resist film thickness of an inventive resist composition after negative development with organic solvent and positive development with alkaline aqueous solution. Since $E_{Op}$ is spaced apart from $E_{On}$, the shaded area where a pattern is left is wide enough. If $E_{Op}$ is excessively spaced apart from $E_{On}$, both spaces of positive development and negative development are not resolved at the same time. An appropriate ratio of $E_{Op}/E_{On}$ is in a range from 3 to 8, most preferably from 5 to 6.

As the proportion of acid labile group protecting hydroxyl group becomes higher, sensitivity $E_{On}$ becomes higher, and hence, the ratio of $E_{Op}/E_{On}$ becomes higher. On the other hand, as the proportion of acid labile group protecting hydroxyl group becomes lower, the ratio of $E_{Op}/E_{On}$ becomes lower. The ratio of $E_{Op}/E_{On}$ may be optimized by changing the proportion of hydroxyl group-protecting acid labile group and the proportion of carboxyl group-protecting acid labile group.

EXAMPLE

Examples of the invention are given below by way of illustration and not by way of limitation. The abbreviation "pbw" is parts by weight. For all polymers, Mw and Mn are determined by GPC versus polystyrene standards.

SYNTHESIS EXAMPLE

Polymers for use in resist compositions were prepared by combining monomers, effecting copolymerization reaction in tetrahydrofuran medium, precipitating in methanol, repeatedly washing with hexane, isolation, and drying. The resulting polymers (Polymers 1 to 22 and Comparative Polymers 1 and 2) had the composition shown below. The composition of the polymer was analyzed by $^1$H-NMR, and the Mw and Mw/Mn determined by GPC.

Resist Polymer 1
 Mw=8,900
 Mw/Mn=1.79

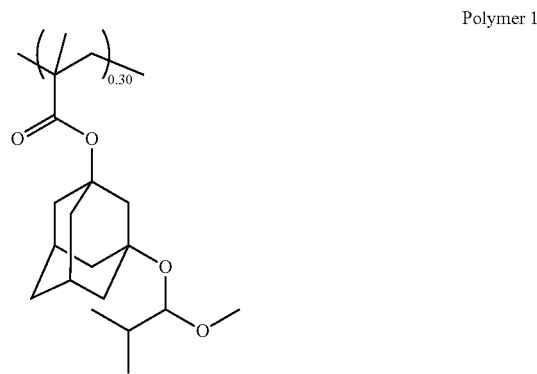

Polymer 1

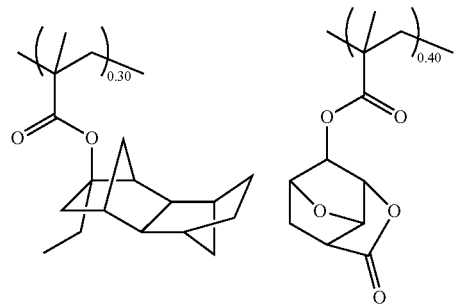

Resist Polymer 2
 Mw=8,100
 Mw/Mn=1.73

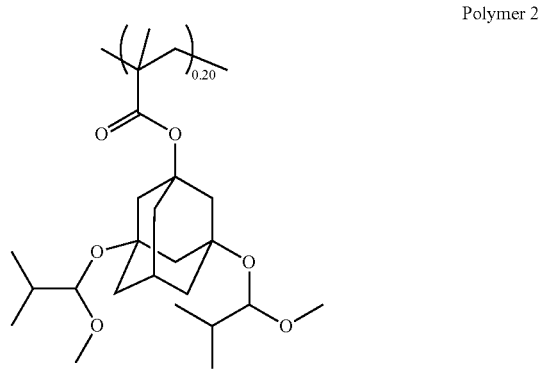

Polymer 2

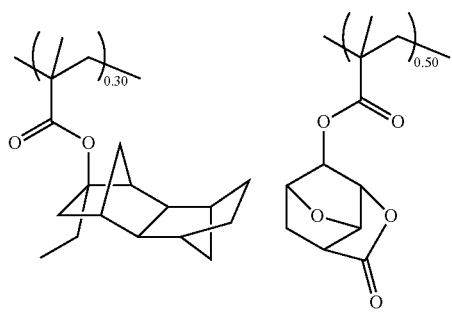
Resist Polymer 3
Mw=7,500
Mw/Mn=1.81
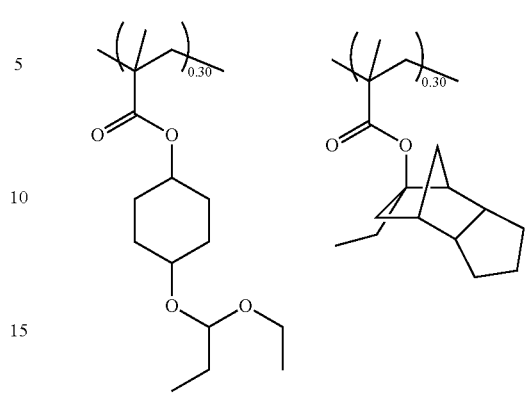
Polymer 3
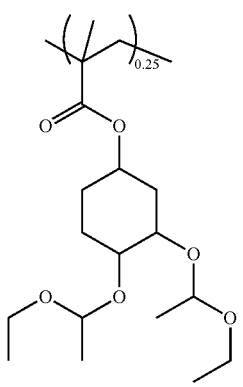
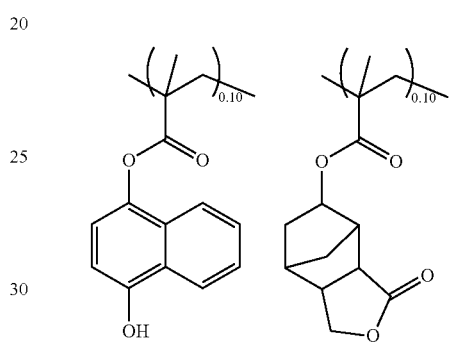
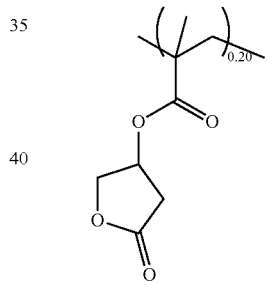
Resist Polymer 5
Mw=8,300
Mw/Mn=1.81
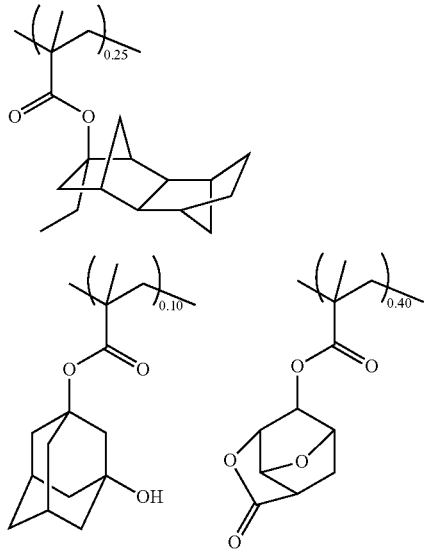
Resist Polymer 4
Mw=8,300
Mw/Mn=1.86
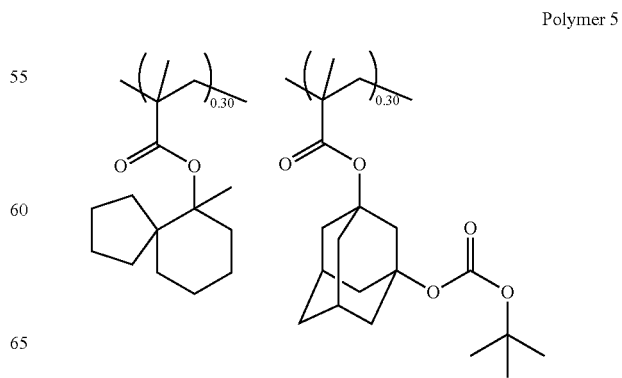
Polymer 4
Polymer 5

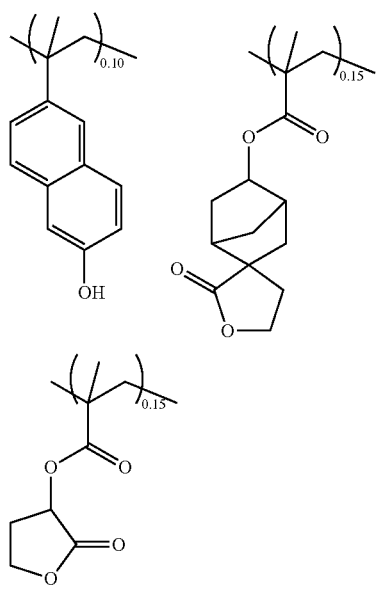
Resist Polymer 6
Mw=6,500
Mw/Mn=1.79
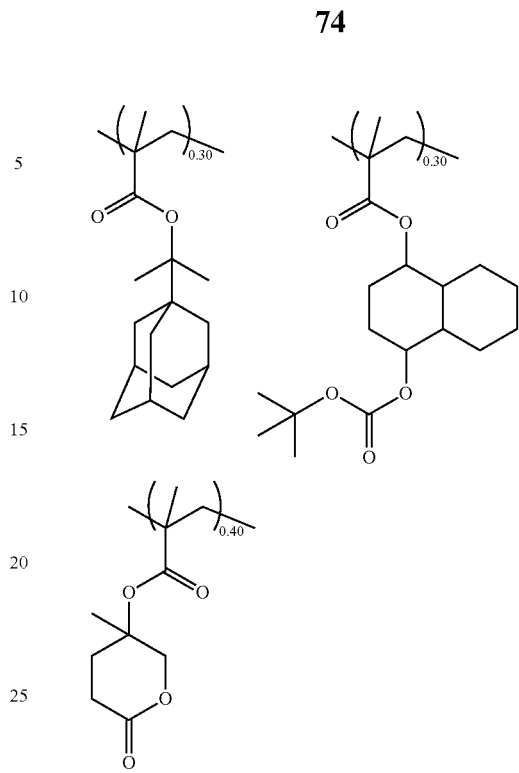
Resist Polymer 8
Mw=6,500
Mw/Mn=1.79
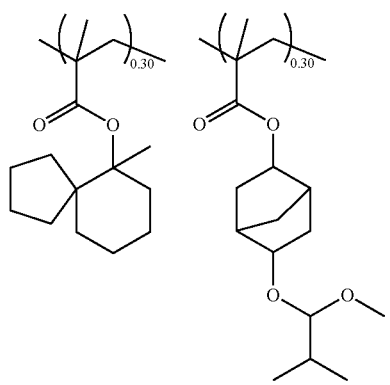
Polymer 6
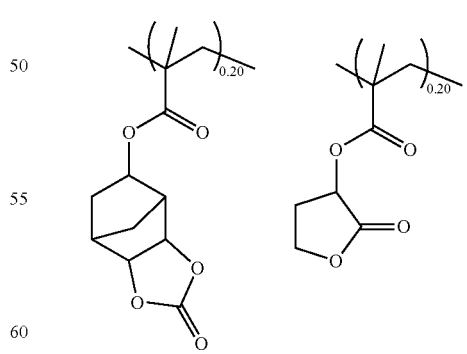
Polymer 8
Resist Polymer 7
Mw=8,730
Mw/Mn=1.77
Resist Polymer 9
Mw=9,300
Mw/Mn=1.91

Polymer 9
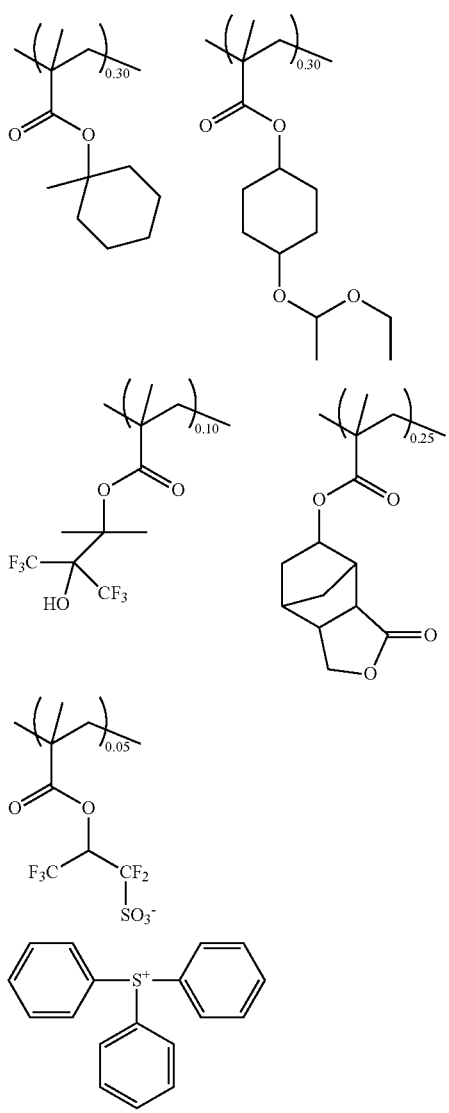
Resist Polymer 10
Mw=8,100
Mw/Mn=1.71
Polymer 10
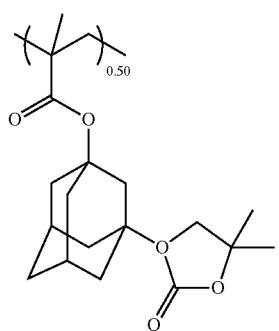
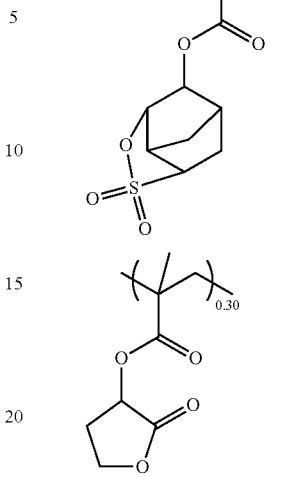
Resist Polymer 11
Mw=8,500
Mw/Mn=1.76
Polymer 11
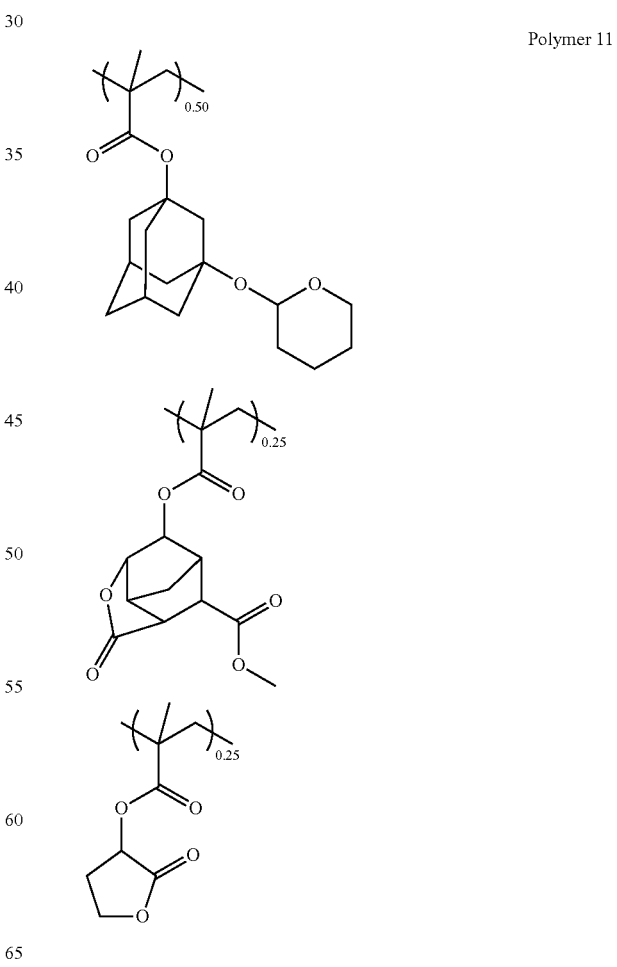

Resist Polymer 12
Mw=5,300
Mw/Mn=1.55
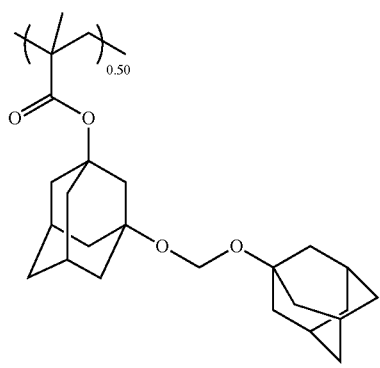
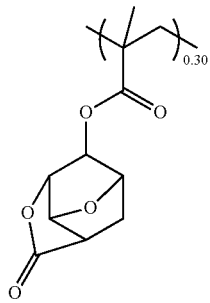
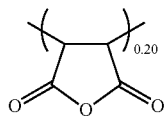
Resist Polymer 13
Mw=8,900
Mw/Mn=1.78
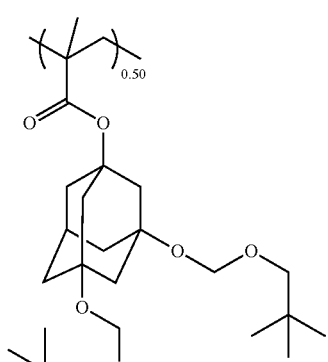
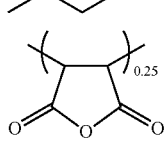
Polymer 12
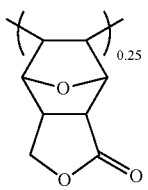
Resist Polymer 14
Mw=5,400
Mw/Mn=1.44
Polymer 14
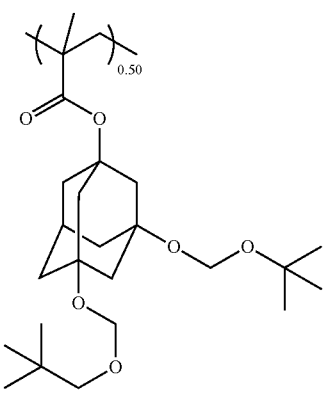
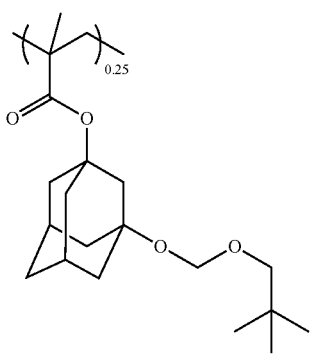
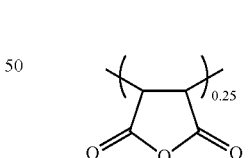
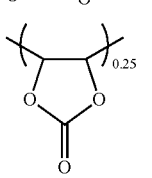
Resist Polymer 15
Mw=8,200
Mw/Mn=1.72

Polymer 15
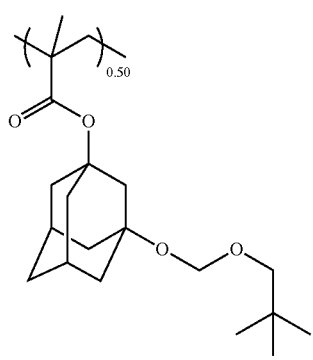
Resist Polymer 16
Mw=8,300
Mw/Mn=1.76
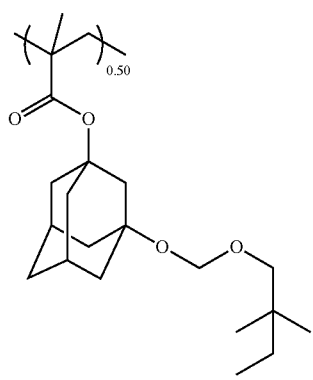
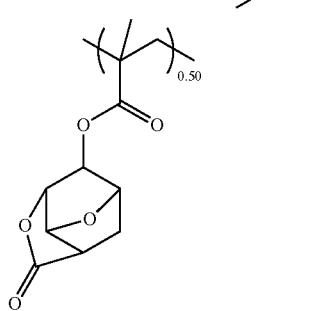
Resist Polymer 17
Mw=7,200
Mw/Mn=1.96
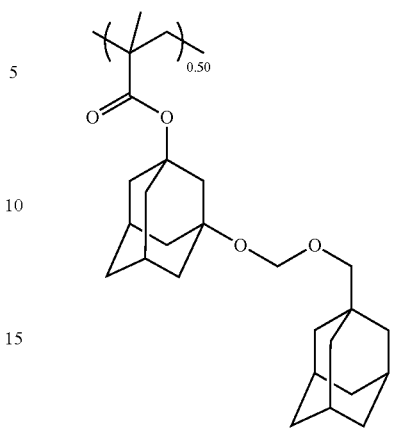
Polymer 16
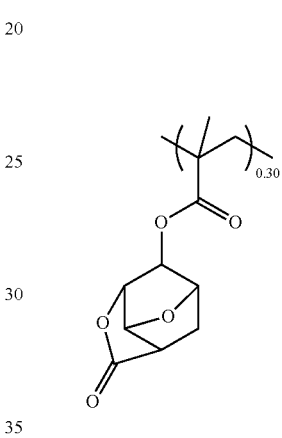
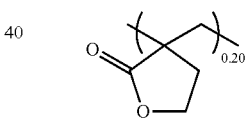
Resist Polymer 18
Mw=7,000
Mw/Mn=1.92
Polymer 17
Polymer 18
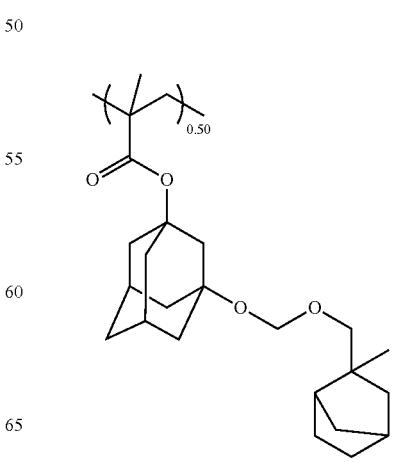

-continued
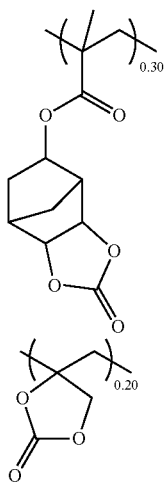
Resist Polymer 19
Mw=6,900
Mw/Mn=1.98
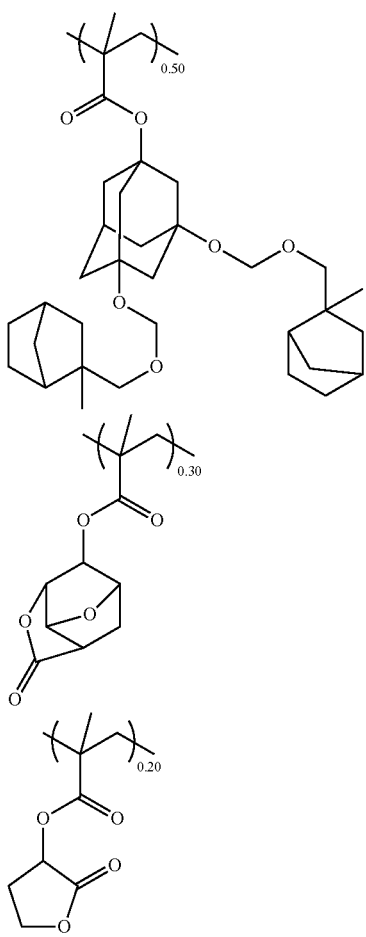
Resist Polymer 20
Mw=7,200
Mw/Mn=1.93
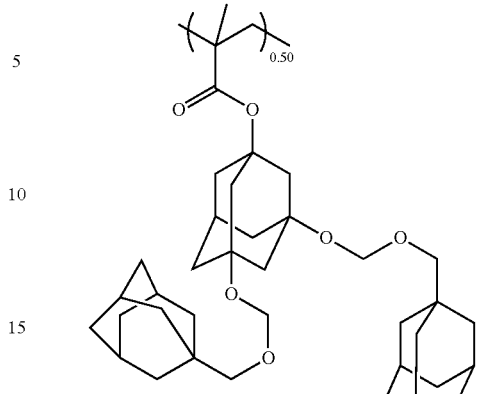
Polymer 19
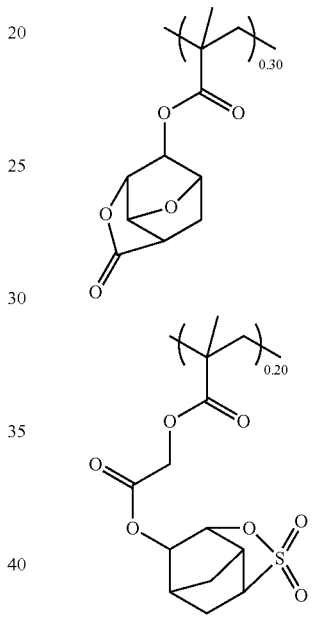
Resist Polymer 21
Mw=6,600
Mw/Mn=2.03
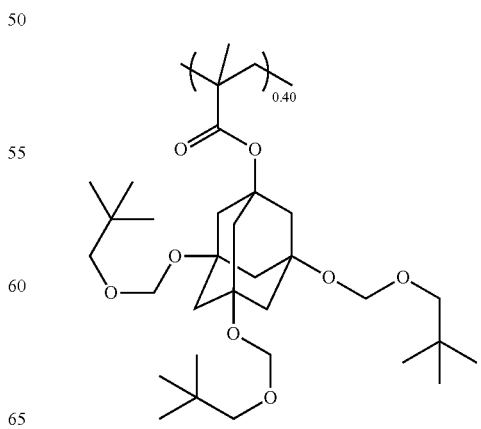
Polymer 20
Polymer 21

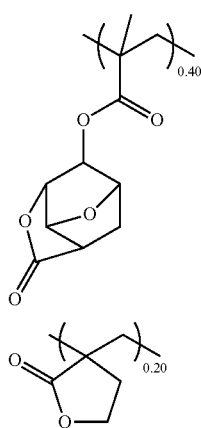
Resist Polymer 22
Mw=6,900
Mw/Mn=2.01
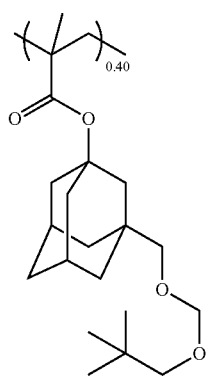
Comparative Resist Polymer 1
Mw=8,600
Mw/Mn=1.88
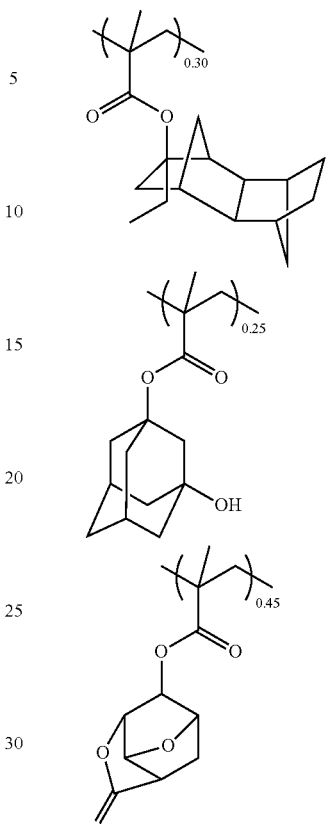
Comparative Resist Polymer 2
Mw=8,900
Mw/Mn=1.93
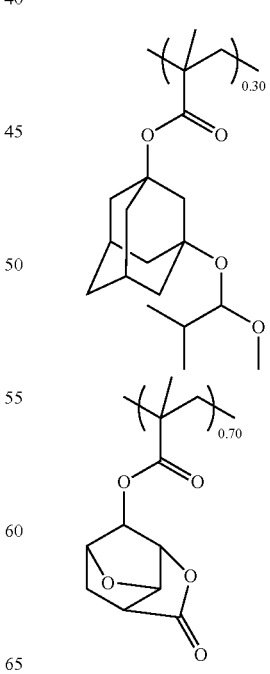

Positive Resist Composition

A resist solution was prepared by dissolving polymers (Resist Polymer) and components in solvents in accordance with the formulation of Tables 1 and 2. The solvent contained 100 ppm of fluorochemical surfactant FC-4430 by 3M-umitomo Co., Ltd. The solution was filtered through a Teflon® filter with a pore size of 0.2 μm. The components in Tables 1 and 2 are identified below.

Acid generators: PAG1 and PAG2 of the following structural formulae

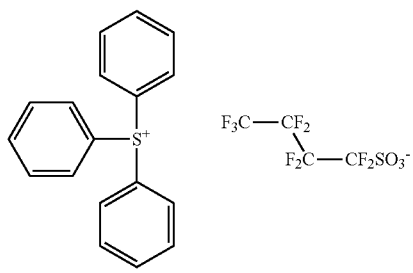

PAG 1

PAG 2

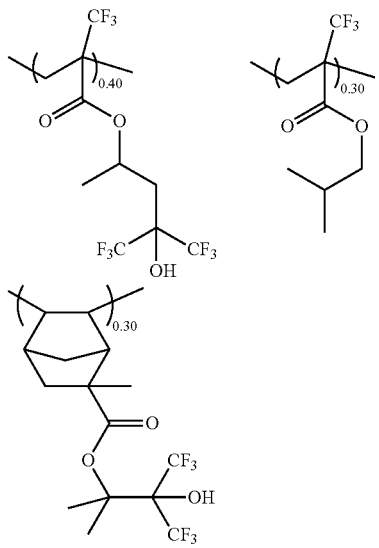

Basic compounds: Quenchers 1 and 2 of the following structural formulae

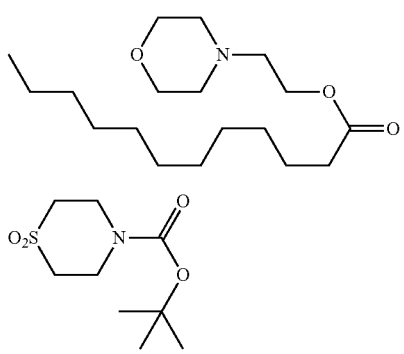

Quencher 1

Quencher 2

Organic solvent:
PGMEA (propylene glycol monomethyl ether acetate)
CyH (cyclohexanone)

ArF Lithography Patterning Test 1

A resist solution having the formulation of Table 1 was spin coated on a substrate (silicon wafer) having an antireflective coating (Nissan Chemical Industry Co., Ltd.) of 80 nm thick, then baked on a hot plate at 100° C. for 60 seconds to form a resist film of 160 nm thick.

Using an ArF excimer laser scanner NSR-305B (Nikon Corp., NA 0.68, σ0.73), the resist film was open-frame exposed in a dose which varied stepwise by 0.2 mJ/cm². The exposed resist film was baked (PEB) at 110° C. for 60 seconds and puddle developed for 60 seconds with an organic solvent as shown in Table 1. The wafer was rinsed at 500 rpm with a rinse liquid (organic solvent) as shown in Table 1, spin dried at 2,000 rpm, and baked at 100° C. for 60 seconds to evaporate off the rinse liquid, completing negative development. The same process was followed until PEB, whereupon positive development was carried out with a 2.38 wt % TMAH aqueous solution.

Figure 6:
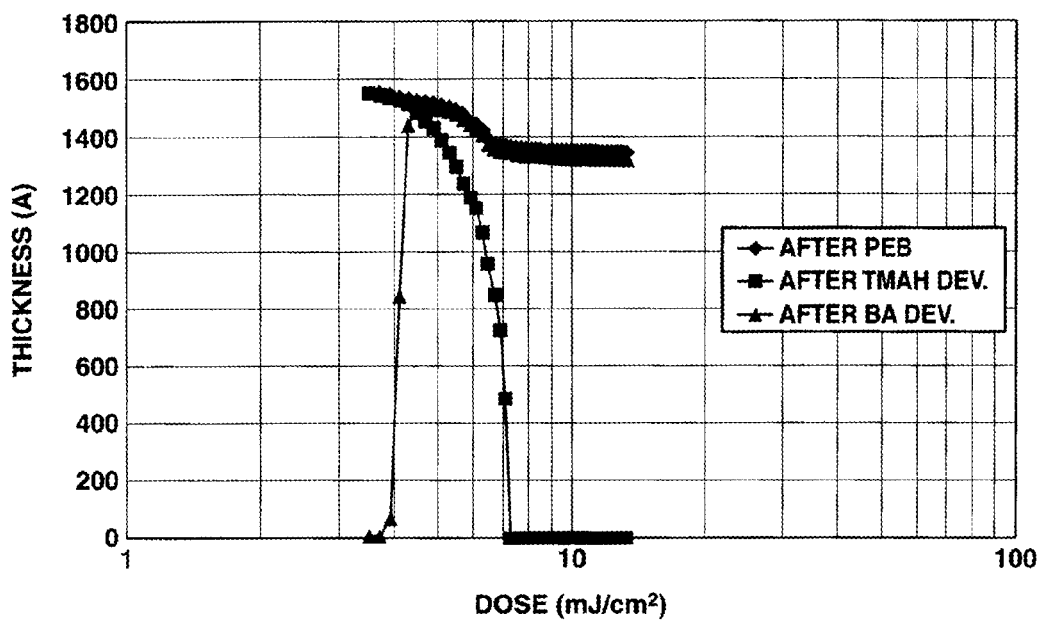
FIG. 6 is a graph showing film thickness versus exposure dose in Example 1-1.
Figure 7:
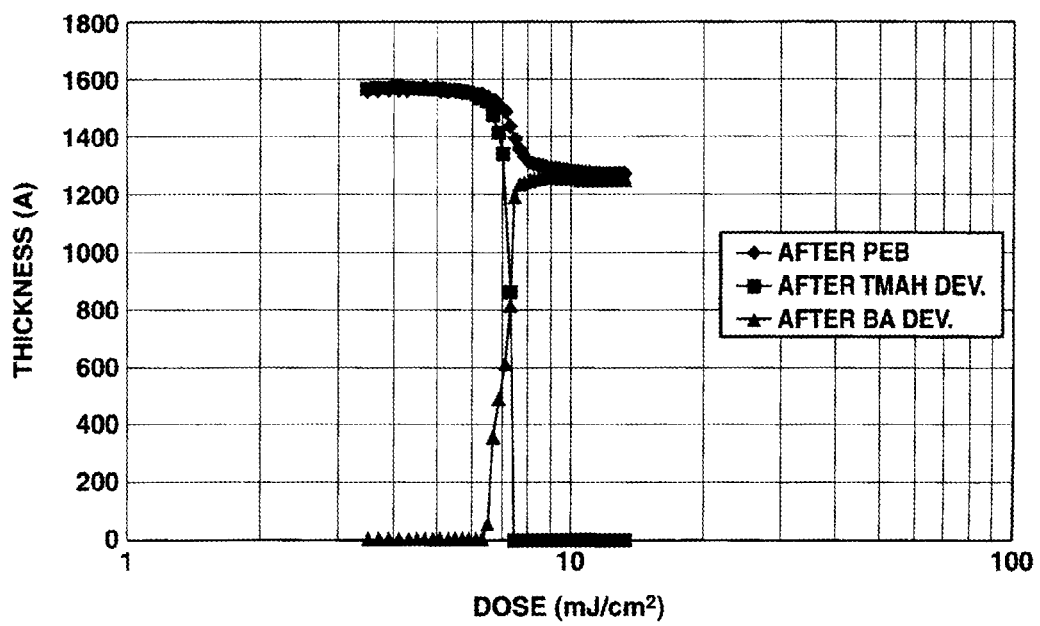
FIG. 7 is a graph showing film thickness versus exposure dose in Comparative Example 1-1.
Figure 8:
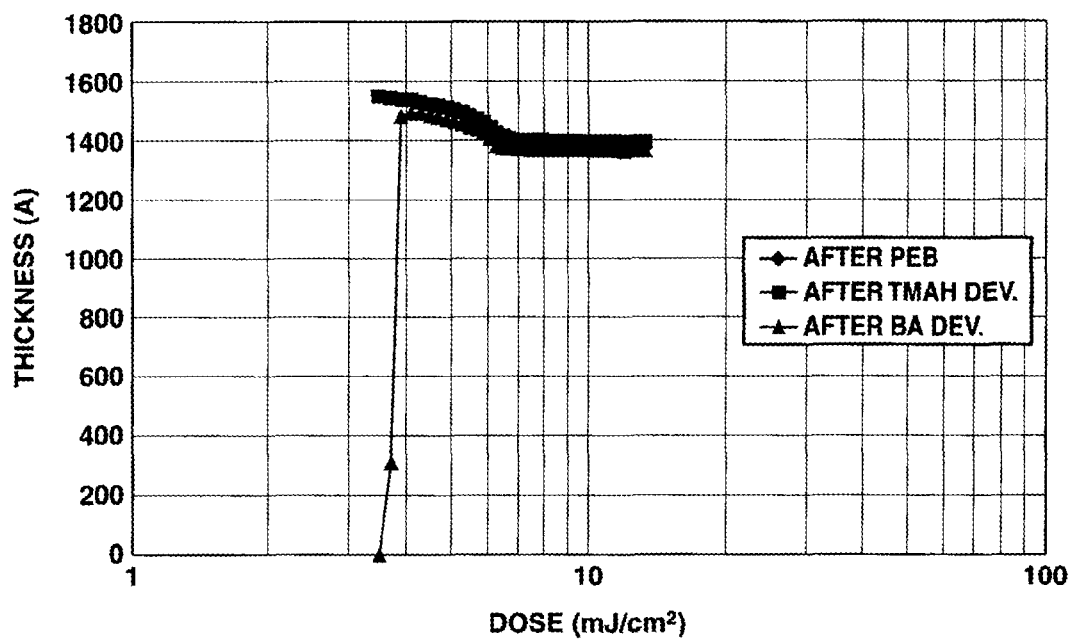
FIG. 8 is a graph showing film thickness versus exposure dose in Comparative Example 1-2.

The film thickness after PEB, the film thickness after organic solvent development, and the film thickness after TMAH aqueous solution development were measured using an optical film thickness gauge. A contrast curve was determined by plotting the film thickness versus the exposure dose, with the results shown in FIGS. 6 to 8.

Water-Repellent Polymer 1

Mw=9,100
Mw/Mn=1.83

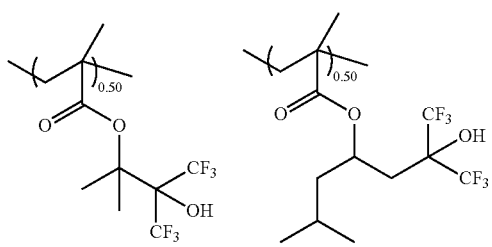

Water-Repellent Polymer 2

Mw=7,300
Mw/Mn=1.54

TABLE 1

| | | Polymer (pbw) | Acid generator (pbw) | Basic compound (pbw) | Organic solvent (pbw) | Negative development | Rinse liquid after negative development |
|---|---|---|---|---|---|---|---|
| Example 1-1 | Resist 1-1 | Polymer 1 (100) | PAG1 (6.5) | Quencher1 (1.50) | PGMEA (800) CyH (400) | butyl acetate | 4-methyl-2-pentanol |
| Comparative Example 1-1 | Comparative Resist 1-1 | Comparative Polymer 1 (100) | PAG1 (6.5) | Quencher1 (1.50) | PGMEA (800) CyH (400) | butyl acetate | 4-methyl-2-pentanol |
| Comparative Example 1-2 | Comparative Resist 1-2 | Comparative Polymer 2 (100) | PAG1 (6.5) | Quencher1 (1.50) | PGMEA (800) CyH (400) | butyl acetate | 4-methyl-2-pentanol |

ArF Lithography Patterning Test 2

On a substrate (silicon wafer), a spin-on carbon film ODL-50 (Shin-Etsu Chemical Co., Ltd.) having a carbon content of 80 wt % was deposited to a thickness of 200 nm and a silicon-containing spin-on hard mask SHB-A940 having a silicon content of 43 wt % was deposited thereon to a thickness of 35 nm. On this substrate for trilayer process, a resist solution prepared in accordance with the formulation shown in Table 2 was spin coated, and baked on a hot plate at 100° C. for 60 seconds to form a resist film of 60 nm thick.

Using an ArF excimer laser immersion lithography scanner NSR-610C (Nikon Corp., NA 1.05, σ0.98/0.78, dipole opening 20 deg., azimuthally polarized illumination), exposure was performed in a varying dose through a 6% halftone phase shift mask having a pattern with a pitch of 100 nm and a line width of 50 nm (on-wafer size). After the exposure, the wafer was baked (PEB) at the temperature shown in Table 3 for 60 seconds and developed. Specifically, butyl acetate was injected from a development nozzle while the wafer was spun at 30 rpm for 3 seconds, which was followed by stationary puddle development for 27 seconds. The wafer was rinsed with diisoamyl ether, spin dried, and baked at 100° C. for 20 seconds to evaporate off the rinse liquid. This was followed by stationary puddle development in a 2.38 wt % TMAH aqueous solution for 30 seconds and rinsing with deionized water.

The resulting positive and negative patterns were measured for line width under CD-SEM, with the results shown in Table 3.

TABLE 2

| | Polymer (pbw) | Acid generator (pbw) | Basic compound (pbw) | Additive (pbw) | Organic solvent (pbw) |
|---|---|---|---|---|---|
| Resist 2-1 | Polymer 1(100) | PAG2 (12.5) | Quencher1 (1.50) | Water-repellent Polymer 1 (6) | PGMEA(2,000) CyH(500) |
| Resist 2-2 | Polymer 2(100) | PAG2 (12.5) | Quencher1 (1.50) | Water-repellent Polymer 1 (6) | PGMEA(2,000) CyH(500) |
| Resist 2-3 | Polymer 3(100) | PAG2 (12.5) | Quencher1 (1.50) | Water-repellent Polymer 1 (6) | PGMEA(2,000) CyH(500) |
| Resist 2-4 | Polymer 4(100) | PAG2 (12.5) | Quencher1 (1.50) | Water-repellent Polymer 1 (6) | PGMEA(2,000) CyH(500) |
| Resist 2-5 | Polymer 5(100) | PAG2 (12.5) | Quencher1 (1.50) | Water-repellent Polymer 1 (6) | PGMEA(2,000) CyH(500) |
| Resist 2-6 | Polymer 6(100) | PAG2 (12.5) | Quencher1 (1.50) | Water-repellent Polymer 1 (6) | PGMEA(2,000) CyH(500) |
| Resist 2-7 | Polymer 7(100) | PAG2 (12.5) | Quencher1 (1.50) | Water-repellent Polymer 1 (6) | PGMEA(2,000) CyH(500) |
| Resist 2-8 | Polymer 8(100) | PAG2 (12.5) | Quencher1 (1.50) | Water-repellent Polymer 1 (6) | PGMEA(2,000) CyH(500) |
| Resist 2-9 | Polymer 9(100) | — | Quencher1 (1.50) | Water-repellent Polymer 1 (6) | PGMEA(2,000) CyH(500) |
| Resist 2-10 | Polymer 1(100) | PAG2 (12.5) | Quencher2 (1.20) | Water-repellent Polymer 2 (6) | PGMEA(2,000) CyH(500) |
| Resist 2-11 | Polymer 1(90) Comparative Polymer 2(10) | PAG2 (12.5) | Quencher2 (1.20) | Water-repellent Polymer 2 (6) | PGMEA(2,000) CyH(500) |
| Resist 2-12 | Comparative Polymer 1(40) Comparative Polymer 2(60) | PAG2 (12.5) | Quencher2 (1.20) | Water-repellent Polymer 2 (6) | PGMEA(2,000) CyH(500) |
| Resist 2-13 | Polymer 10(50) Comparative Polymer 1(50) | PAG2 (12.5) | Quencher1 (1.50) | Water-repellent Polymer 1 (6) | PGMEA(2,000) CyH(500) |
| Resist 2-14 | Polymer 11(50) Comparative Polymer 1(50) | PAG2 (12.5) | Quencher1 (1.50) | Water-repellent Polymer 1 (6) | PGMEA(2,000) CyH(500) |
| Resist 2-15 | Polymer 12(50) Comparative Polymer 1(50) | PAG2 (12.5) | Quencher1 (1.50) | Water-repellent Polymer 1 (6) | PGMEA(2,000) CyH(500) |
| Resist 2-16 | Polymer 13(50) Comparative Polymer 1(50) | PAG2 (12.5) | Quencher1 (1.50) | Water-repellent Polymer 1 (6) | PGMEA(2,000) CyH(500) |
| Resist 2-17 | Polymer 14(50) Comparative Polymer 1(50) | PAG2 (12.5) | Quencher1 (1.50) | Water-repellent Polymer 1 (6) | PGMEA(2,000) CyH(500) |

TABLE 2-continued

| | Polymer (pbw) | Acid generator (pbw) | Basic compound (pbw) | Additive (pbw) | Organic solvent (pbw) |
|---|---|---|---|---|---|
| Resist 2-18 | Polymer 15(50) Comparative Polymer 1(50) | PAG2 (12.5) | Quencher1 (1.50) | Water-repellent Polymer 1 (6) | PGMEA(2,000) CyH(500) |
| Resist 2-19 | Polymer 16(50) Comparative Polymer 1(50) | PAG2 (12.5) | Quencher1 (1.50) | Water-repellent Polymer 1 (6) | PGMEA(2,000) CyH(500) |
| Resist 2-20 | Polymer 17(50) Comparative Polymer 1(50) | PAG2 (12.5) | Quencher1 (1.50) | Water-repellent Polymer 1 (6) | PGMEA(2,000) CyH(500) |
| Resist 2-21 | Polymer 18(50) Comparative Polymer 1(50) | PAG2 (12.5) | Quencher1 (1.50) | Water-repellent Polymer 1 (6) | PGMEA(2,000) CyH(500) |
| Resist 2-22 | Polymer 19(50) Comparative Polymer 1(50) | PAG2 (12.5) | Quencher1 (1.50) | Water-repellent Polymer 1 (6) | PGMEA(2,000) CyH(500) |
| Resist 2-23 | Polymer 20(50) Comparative Polymer 1(50) | PAG2 (12.5) | Quencher1 (1.50) | Water-repellent Polymer 1 (6) | PGMEA(2,000) CyH(500) |
| Resist 2-24 | Polymer 21(50) Comparative Polymer 1(50) | PAG2 (12.5) | Quencher1 (1.50) | Water-repellent Polymer 1 (6) | PGMEA(2,000) CyH(500) |
| Resist 2-25 | Polymer 22(50) Comparative Polymer 1(50) | PAG2 (12.5) | Quencher1 (1.50) | Water-repellent Polymer 1 (6) | PGMEA(2,000) CyH(500) |
| Comparative Resist 2-1 | Comparative Polymer 1(100) | PAG2 (12.5) | Quencher1 (1.50) | — | PGMEA(2,000) CyH(500) |
| Comparative Resist 2-2 | Comparative Polymer 2(100) | PAG2 (12.5) | Quencher1 (1.50) | — | PGMEA(2,000) CyH(500) |

TABLE 3

| | Resist | PEB temp. (° C.) | Positive pattern line width (nm) | Negative pattern line width (nm) |
|---|---|---|---|---|
| Example 2-1 | Resist 2-1 | 100 | 40 | 41 |
| Example 2-2 | Resist 2-2 | 100 | 41 | 38 |
| Example 2-3 | Resist 2-3 | 100 | 44 | 43 |
| Example 2-4 | Resist 2-4 | 95 | 44 | 33 |
| Example 2-5 | Resist 2-5 | 100 | 38 | 40 |
| Example 2-6 | Resist 2-6 | 100 | 44 | 33 |
| Example 2-7 | Resist 2-7 | 105 | 45 | 40 |
| Example 2-8 | Resist 2-8 | 95 | 40 | 41 |
| Example 2-9 | Resist 2-9 | 95 | 38 | 33 |
| Example 2-10 | Resist 2-10 | 100 | 40 | 42 |
| Example 2-11 | Resist 2-11 | 100 | 39 | 48 |
| Example 2-12 | Resist 2-12 | 100 | 40 | 50 |
| Example 2-13 | Resist 2-13 | 100 | 44 | 48 |
| Example 2-14 | Resist 2-14 | 100 | 42 | 40 |
| Example 2-15 | Resist 2-15 | 100 | 44 | 41 |
| Example 2-16 | Resist 2-16 | 105 | 45 | 40 |
| Example 2-17 | Resist 2-17 | 105 | 40 | 41 |
| Example 2-18 | Resist 2-18 | 95 | 38 | 42 |
| Example 2-19 | Resist 2-19 | 95 | 40 | 42 |
| Example 2-20 | Resist 2-20 | 95 | 39 | 48 |
| Example 2-21 | Resist 2-21 | 95 | 40 | 50 |
| Example 2-22 | Resist 2-22 | 90 | 38 | 42 |
| Example 2-23 | Resist 2-23 | 90 | 40 | 42 |
| Example 2-24 | Resist 2-24 | 90 | 41 | 34 |
| Example 2-25 | Resist 2-25 | 90 | 40 | 50 |
| Comparative Example 2-1 | Comparative Resist 2-1 | 100 | 52 | unresolved |
| Comparative Example 2-2 | Comparative Resist 2-2 | 100 | unresolved | 56 |

While the invention has been described with reference to a preferred embodiment, it will be understood by those skilled in the art that various changes may be made and equivalents may be substituted for elements thereof without departing from the scope of the invention. Therefore, it is intended that the invention not be limited to the particular embodiment disclosed as the best mode contemplated for carrying out this invention, but that the invention will include all embodiments falling within the scope of the appended claims.

Japanese Patent Application No. 2010-153514 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A pattern forming process comprising the steps of coating a resist composition comprising a polymer comprising recurring units (a1) or (a2) and (b) represented by the general formula (1), an acid generator, and an organic solvent or a resist composition comprising a polymer comprising recurring units (a1) or (a2) represented by the general formula (1), a polymer comprising recurring units (b) represented by the general formula (1), an acid generator, and an organic solvent onto a substrate, heat treating the composition to form a resist film, exposing the resist film to high-energy radiation, heat treating, and developing the exposed film two times with an organic solvent and an alkaline aqueous solution:

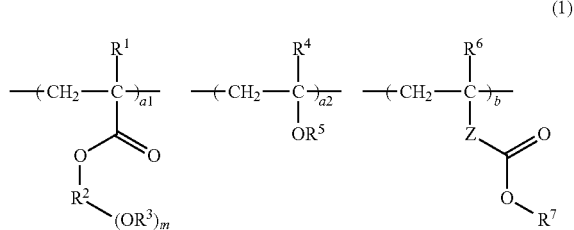

(1)

wherein $R^1$, $R^4$, and $R^6$ are each independently hydrogen or methyl, $R^2$ is a (m+1)-valent, straight, branched or cyclic, $C_1$-$C_{16}$ hydrocarbon group which may contain an ether group, ester group or lactone ring, $R^3$, $R^5$, and $R^7$ are each independently an acid labile group, m is an integer of 1 to 3, Z is a single bond or —C(=O)—O—$R^8$—, $R^8$ is a straight, branched or cyclic $C_1$-$C_{10}$ alkylene group which may contain an ether group, ester group, lactone ring or hydroxyl group, or a naphthylene group, the number of the recurring units, a1, a2, and b are in the range: $0 \leq a1 \leq 1.0$, $0 \leq a2 < 1.0$, $0 < b < 1.0$, $0 < a1+a2 < 1.0$, and $0 < a1+a2+b \leq 1.0$.

2. The process of claim 1 wherein the organic solvent as the developer comprises at least one solvent selected from the group consisting of 2-octanone, 2-nonanone,2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, butenyl acetate, isoamyl acetate, phenyl acetate, propyl formate, butyl formate, isobutyl formate, amyl formate, isoamyl formate, methyl valerate, methyl pentenoate, methyl crotonate, ethyl crotonate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate.

3. The process of claim 1 wherein the alkaline aqueous solution as the developer is an aqueous solution containing an amine selected from the group consisting of tetramethylammonium hydroxide, tetraethylammonium hydroxide, tetrapropylammonium hydroxide, tetrabutylammonium hydroxide, choline hydroxide, morpholine, and piperidine.

4. The process of claim 1 wherein the step of exposing the resist film to high-energy radiation includes ArF immersion lithography of 193 nm wavelength or EUV lithography of 13.5 nm wavelength.

5. The process of any one of claims 1 and 2-4 wherein the exposure step uses a mask pattern having a pitch, and a pattern having a half pitch of the mask pattern is resolved through the two developments.

6. The process of claim 1 wherein the recurring units (a1) or (a2) are those derived from a monomer selected from the group consisting of the following monomers:

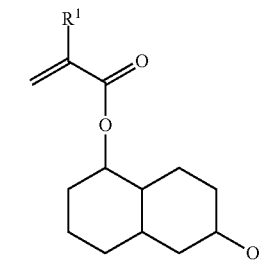
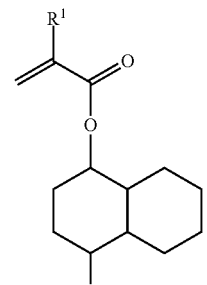
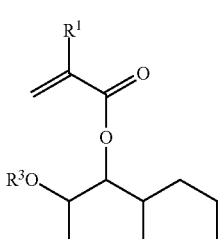
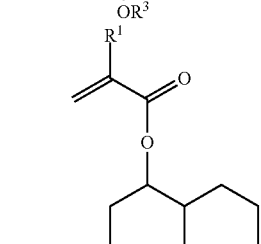
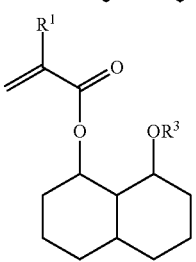
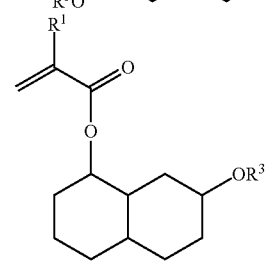

-continued

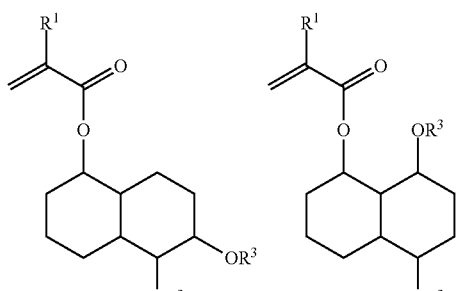
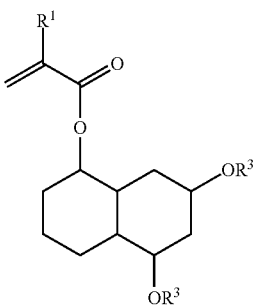
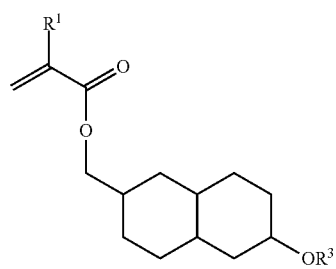
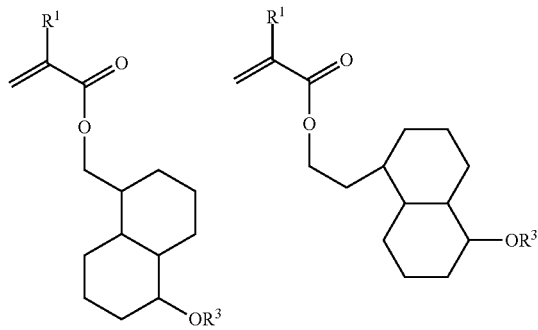
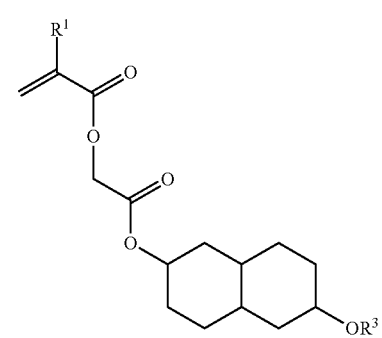

93
-continued
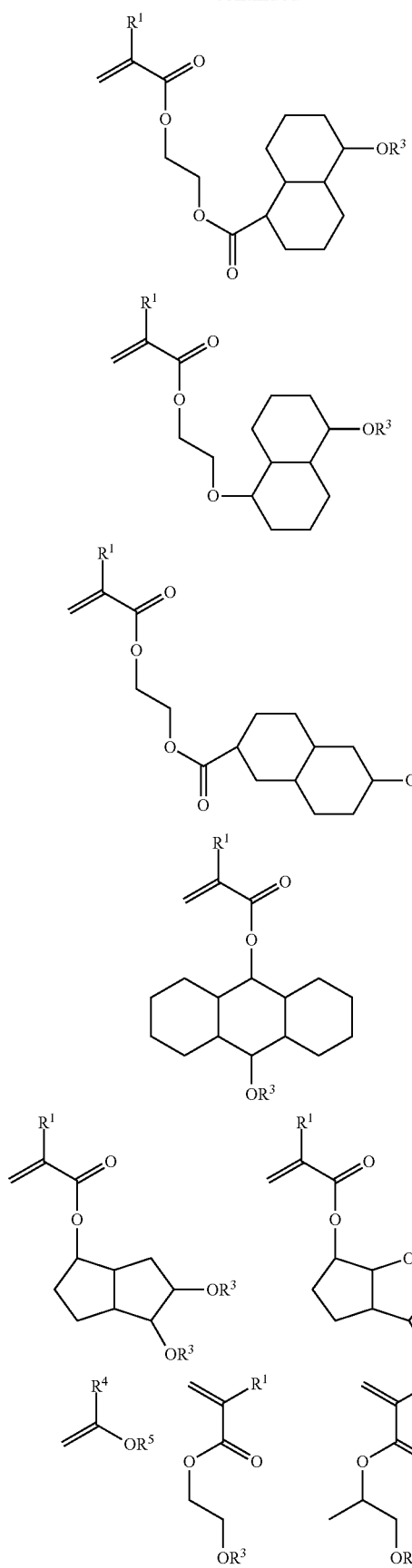
94
-continued
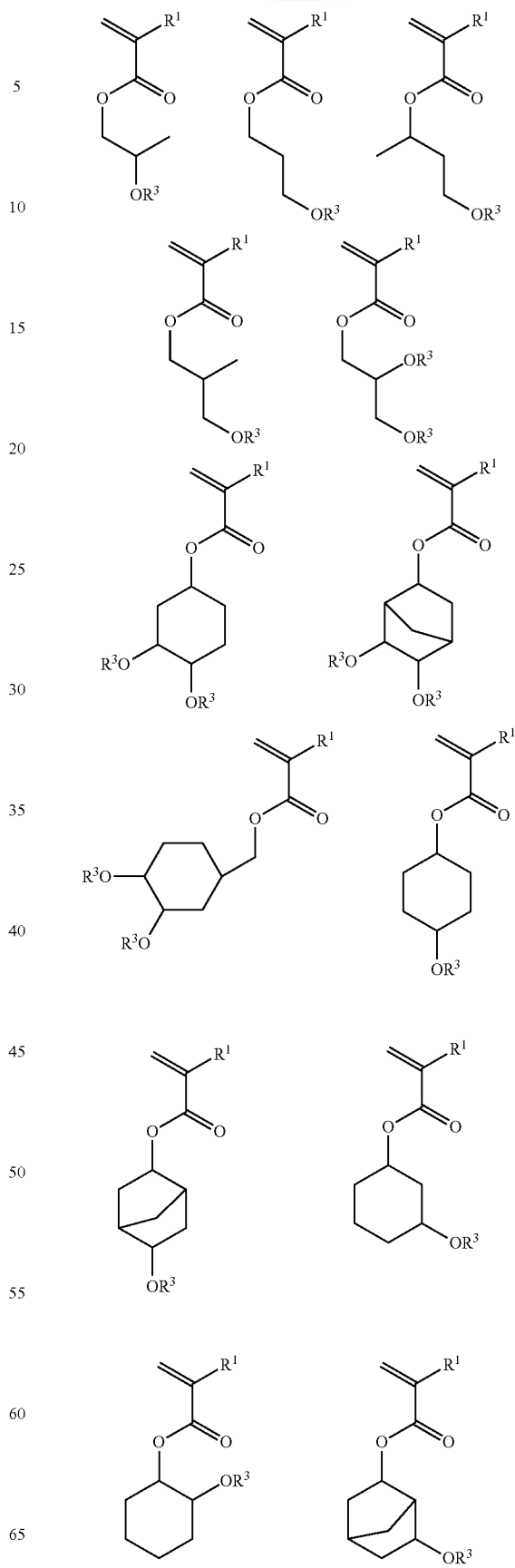

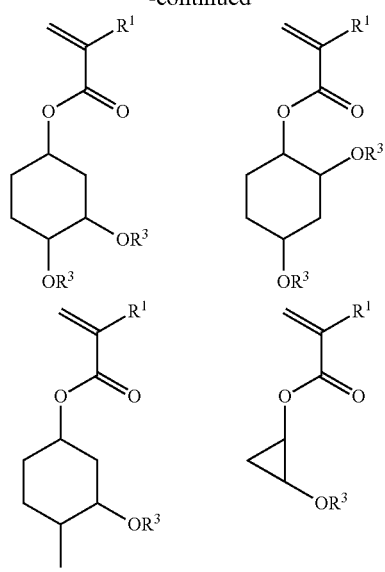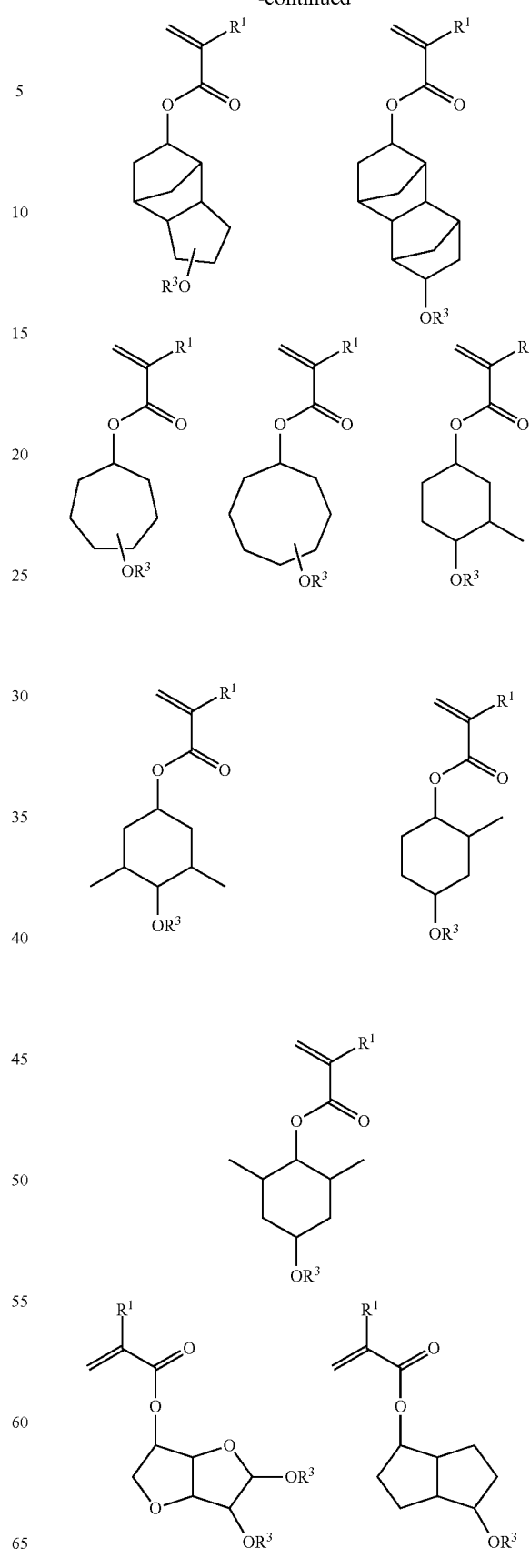

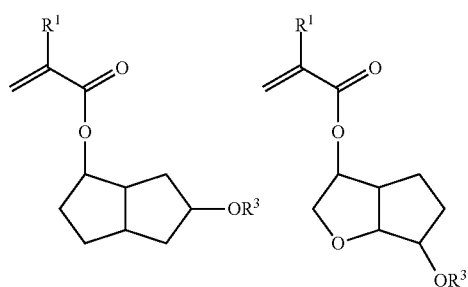
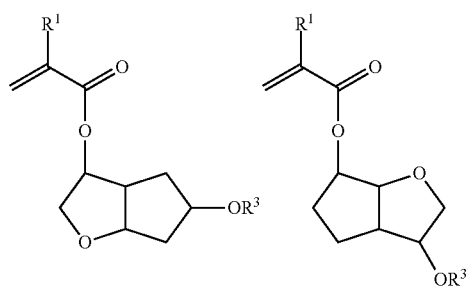
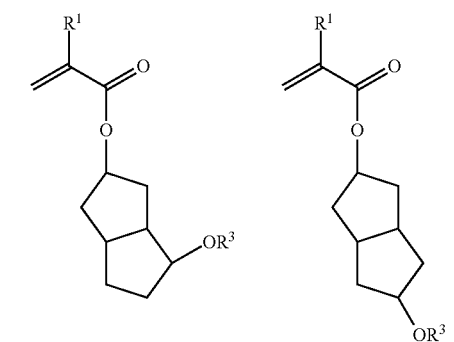
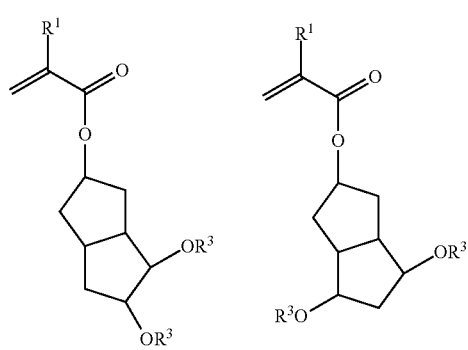
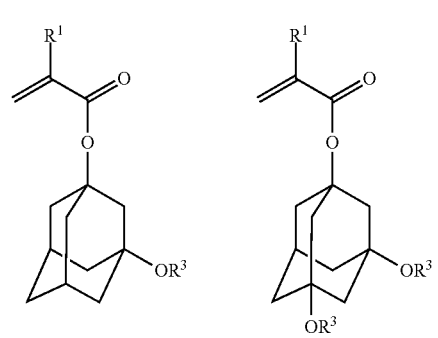
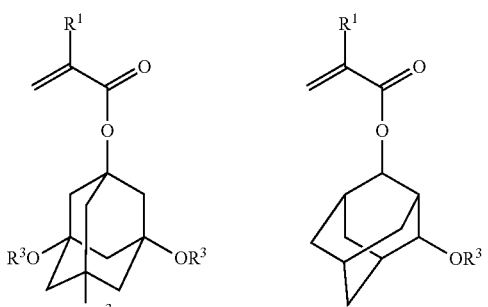
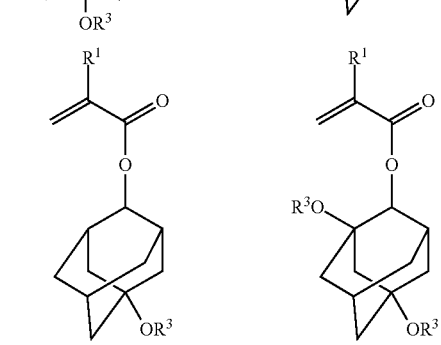
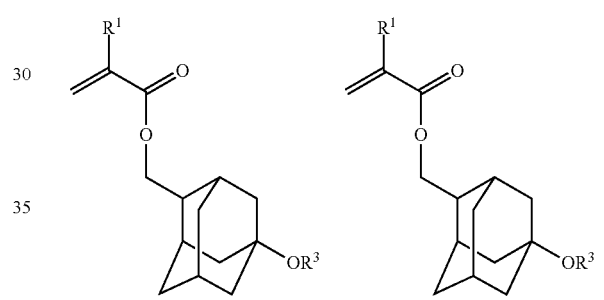
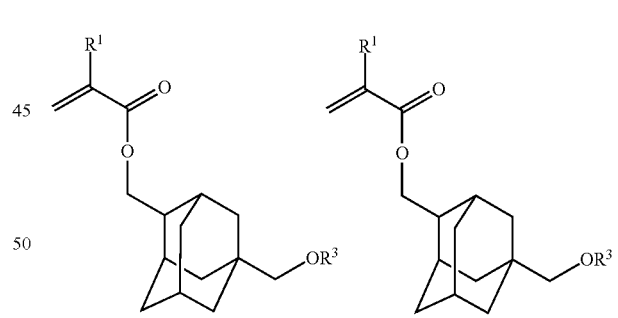
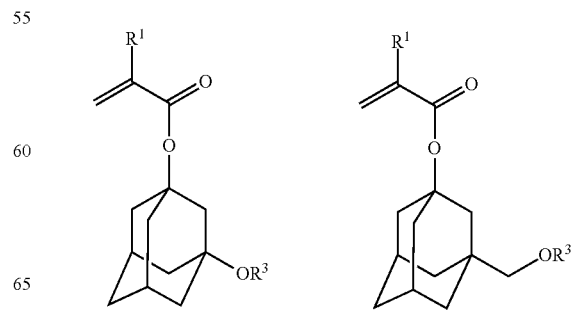

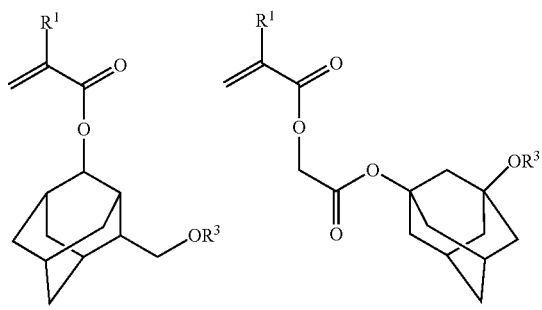

wherein $R^1$, $R^3$, $R^4$ and $R^5$ are as defined above, and the recurring units (b) are those derived from a monomer selected from the group consisting of the following monomers:

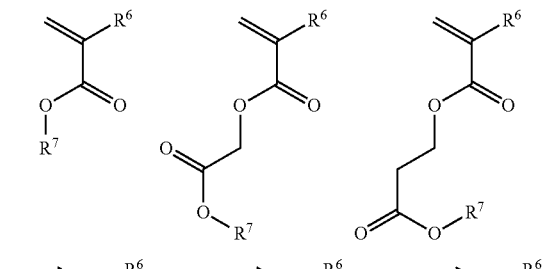

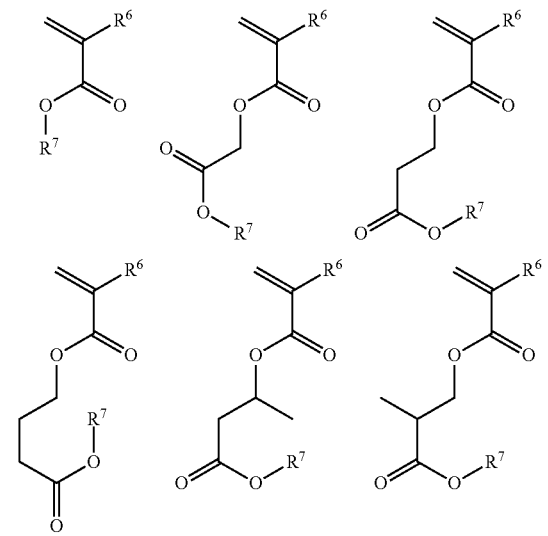

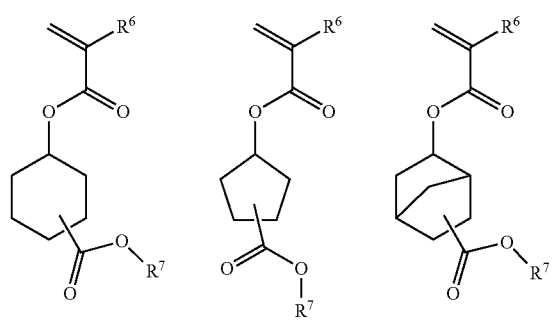

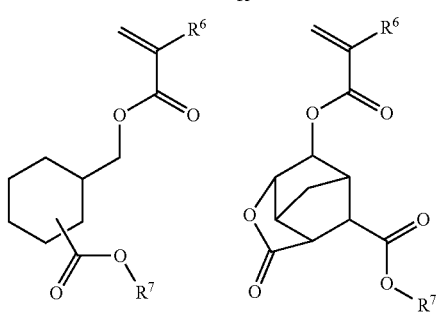

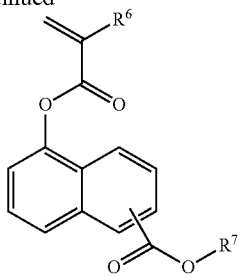

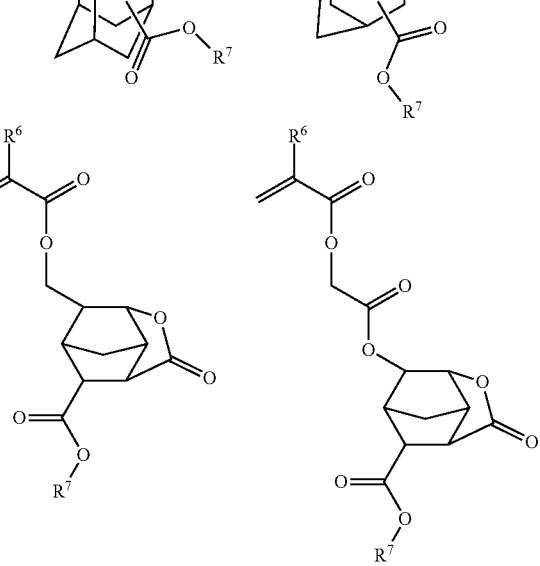

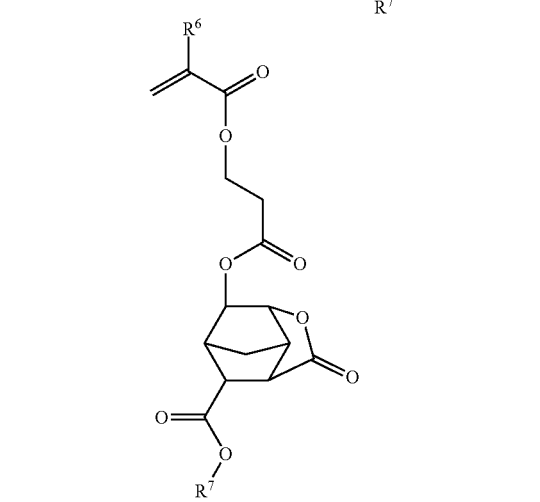

wherein $R^6$ and $R^7$ are as defined above.

7. The process of claim 1 wherein the polymer further comprises recurring units derived from monomers having adhesive groups selected from the group consisting of hydroxy, cyano, carbonyl, ester, ether groups, lactone rings, carboxyl groups and carboxylic anhydride groups.

8. The process of claim 1 wherein the acid labile groups represented by $R^3$, $R^5$ and $R^7$ in formula (1) are identical or different and selected from groups of the following formulae (AL-10) and (AL-11), tertiary alkyl groups of the following formula (AL-12), and oxoalkyl groups of 4 to 20 carbon atoms:

(AL-10)

(AL-11)

(AL-12)

wherein $R^{51}$ and $R^{54}$ each are a monovalent hydrocarbon group of 1 to 40 carbon atoms which may contain a heteroatom selected from oxygen, sulfur, nitrogen or fluorine, the subscript "a5" is an integer of 0 to 10, $R^{52}$ and $R^{53}$ each are hydrogen or a monovalent hydrocarbon group of 1 to 20 carbon atoms which may contain a heteroatom selected from oxygen, sulfur, nitrogen or fluorine, alternatively, a pair of $R^{52}$ and $R^{53}$, $R^{52}$ and $R^{54}$, or $R^{53}$ and $R^{54}$ may bond together to form an aliphatic ring, with the carbon atom or the carbon and oxygen atoms to which they are attached, the ring having 3 to 20 carbon atoms, $R^{55}$, $R^{56}$ and $R^{57}$ each are a monovalent hydrocarbon group of 1 to 20 carbon atoms which may contain a heteroatom selected from oxygen, sulfur, nitrogen or fluorine, alternatively, a pair of $R^{55}$ and $R^{56}$, $R^{55}$ and $R^{57}$, or $R^{56}$ and $R^{57}$ may bond together to form an aliphatic ring, with the carbon atom to which they are attached, the ring having 3 to 20 carbon atoms.

9. A pattern forming process comprising the steps of coating a resist composition comprising a polymer comprising both recurring units (a1) or (a2) and (b) represented by the general formula (1), and recurring units selected from the group consisting of sulfonium salts (d1) to (d3) represented by the general formula (2) and an organic solvent or a resist composition comprising a polymer comprising recurring units (a1) or (a2) represented by the general formula (1), a polymer comprising recurring units (b) represented by the general formula (1), an acid generator, and an organic solvent onto a substrate, heat treating the composition to form a resist film, exposing the resist film to high-energy radiation, heat treating, and developing the exposed film two times with an organic solvent and an alkaline aqueous solution:

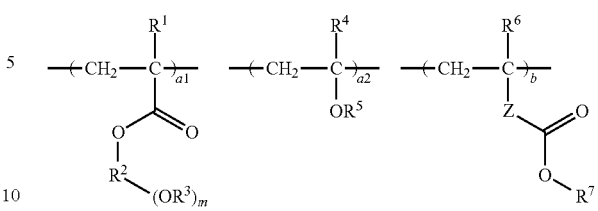

(1)

wherein $R^1$, $R^4$, and $R^6$ are each independently hydrogen or methyl, $R^2$ is a (m+1)-valent, straight, branched or cyclic, $C_1$-$C_{16}$ hydrocarbon group which may contain an ether group, ester group or lactone ring, $R^3$, $R^5$, and $R^7$ are each independently an acid labile group, m is an integer of 1 to 3, Z is a single bond or —C(=O)—O—$R^8$—, $R^8$ is a straight, branched or cyclic $C_1$-$C_{10}$ alkylene group which may contain an ether group, ester group, lactone ring or hydroxyl group, or a naphthylene group, the number of the recurring units, a1, a2, and b are in the range: $0 \le a1 < 1.0$, $0 \le a2 < 1.0$, $0 < b < 1.0$, $0 < a1+a2 < 1.0$, and $0 < a1+a2+b \le 1.0$,

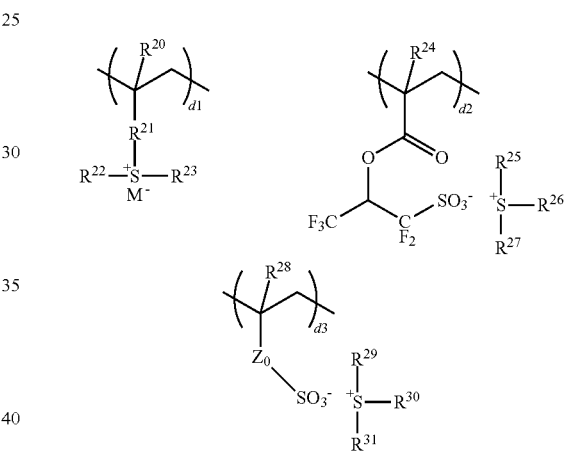

wherein $R^{20}$, $R^{24}$, and $R^{38}$ each are hydrogen or methyl, $R^{21}$ is a single bond, phenylene, —O—$R^{33}$—, or —C(=O)—Y—$R^{33}$—wherein Y is oxygen or NH, and $R^{33}$ is a straight, branched or cyclic $C_1$-$C_6$ alkylene group, alkenylene or phenylene group, which may contain a carbonyl (—CO—), ester (—COO—), ether (—O—) or hydroxyl radical, or a $R^{22}$, $R^{23}$, $R^{25}$, $R^{26}$, $R^{27}$, $R^{29}$, $R^{30}$, and $R^{31}$, are each independently a straight, branched or cyclic $C_1$-$C_{12}$ alkyl group which may contain a carbonyl, ester or ether radical, or a $C_6$-$C_{12}$ aryl, $C_7$-$C_{20}$ aralkyl, or thiophenyl group, $Z_0$ is a single bond, methylene, ethylene, phenylene, fluorophenylene, —O—$R^{32}$—, or —C(=O)—$Z_1$—$R^{32}$—, wherein $Z_1$ is oxygen or NH, and $R^{32}$ is a straight, branched or cyclic $C_1$-$C_6$ alkylene group, alkenylene or phenylene group, which may contain a carbonyl, ester, ether or hydroxyl radical, M⁻ is a non-nucleophilic counter ion, the number of the recurring units d1, d2 and d3 are in the range: $0 \le d1 \le 0.2$, $0 \le d2 \le 0.2$, $0 \le d3 \le 0.2$, and $0 \le d1+d2+d3 \le 0.3$.

10. The process of claim 9 wherein the acid labile groups represented by $R^3$, $R^5$ and $R^7$ in formula (1) are identical or different and selected from groups of the following formulae (AL-10) and (AL-11), tertiary alkyl groups of the following formula (AL-12), and oxoalkyl groups of 4 to 20 carbon atoms:

(AL-10) 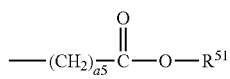

(AL-11) 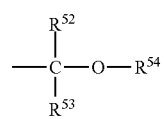

(AL-12) 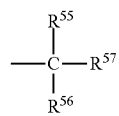

wherein $R^{51}$ and $R^{54}$ each are a monovalent hydrocarbon group of 1 to 40 carbon atoms which may contain a heteroatom selected from oxygen, sulfur, nitrogen or fluorine, the subscript "a5" is an integer of 0 to 10, $R^{52}$ and $R^{53}$ each are hydrogen or a monovalent hydrocarbon group of 1 to 20 carbon atoms which may contain a heteroatom selected from oxygen, sulfur, nitrogen or fluorine, alternatively, a pair of $R^{52}$ and $R^{53}$, $R^{52}$ and $R^{54}$, or $R^{53}$ and $R^{54}$ may bond together to form an alphatic ring, with the carbon atom or the carbon and oxygen atoms to which they are attached, the ring having 3 to 20 carbon atoms, $R^{55}$, $R^{56}$ and $R^{57}$ each are a monovalent hydrocarbon group of 1 to 20 carbon atoms which may contain a heteroatom selected from oxygen, sulfur, nitrogen or fluorine, alternatively, a pair of $R^{55}$ and $R^{56}$, $R^{55}$ and $R^{57}$, or $R^{56}$ and $R^{57}$ may bond together to form an aliphatic ring, with the carbon atom to which they are attached, the ring having 3 to 20 carbon atoms.

* * * * *